United States Patent
Mizuno et al.

(10) Patent No.: US 7,554,296 B2
(45) Date of Patent: Jun. 30, 2009

(54) METHOD AND APPARATUS FOR DETECTING CHARGED STATE OF SECONDARY BATTERY BASED ON NEURAL NETWORK CALCULATION

(75) Inventors: Satoru Mizuno, Nishio (JP); Atsushi Hashikawa, Okazaki (JP); Shoji Sakai, Toyota (JP); Atsushi Ichikawa, Toyoake (JP); Takaharu Kozawa, Kounan (JP); Naoki Mizuno, Nagoya (JP); Yoshifumi Morita, Gifu (JP)

(73) Assignees: Denso Corporation, Kariya (JP); Nippon Soken, Inc., Nishio (JP); National University Corporation Nagoya Institute of Technology, Nagoya (JP)

( * ) Notice: Subject to any disclaimer, the term of this patent is extended or adjusted under 35 U.S.C. 154(b) by 324 days.

(21) Appl. No.: 11/353,220

(22) Filed: Feb. 14, 2006

(65) Prior Publication Data
US 2006/0181245 A1   Aug. 17, 2006

(30) Foreign Application Priority Data

| Feb. 14, 2005 | (JP) | ............................. | 2005-036437 |
| Feb. 14, 2005 | (JP) | ............................. | 2005-036442 |
| Feb. 16, 2005 | (JP) | ............................. | 2005-039614 |
| Apr. 20, 2005 | (JP) | ............................. | 2005-122004 |
| Apr. 20, 2005 | (JP) | ............................. | 2005-122011 |
| May 24, 2005 | (JP) | ............................. | 2005-151059 |

(51) Int. Cl.
*H01M 10/44* (2006.01)
*H02J 7/00* (2006.01)
*G01N 27/416* (2006.01)

(52) U.S. Cl. ........................ 320/132; 320/106; 320/128; 320/136; 702/63; 324/426

(58) Field of Classification Search .................. 320/106, 320/132, 134, 135, 136, 128; 324/426, 427, 324/430, 432, 433, 434; 702/63
See application file for complete search history.

(56) References Cited

U.S. PATENT DOCUMENTS 5,539,318 A    7/1996   Sasaki (Continued)

FOREIGN PATENT DOCUMENTS

EP    1 469 321 A1    10/2004

(Continued)

OTHER PUBLICATIONS

Cai, C. H. et al. "Battery State-of-Charge (SOC) Estimation Using Adaptive Neuro-Fuzzy Inference System (ANFIS)." *Proceedings of the 12th IEEE International Conference on Fuzzy Systems.* (Cat. No. 03CH37422). IEEE Piscataway, NJ, USA, vol. 2, 2003, pp. 1068-1072. (XP 002382826).

*Primary Examiner*—Akm E Ullah
*Assistant Examiner*—M'Baye Diao
(74) *Attorney, Agent, or Firm*—Oliff & Berridge, PLC

(57) ABSTRACT

A neural network type of apparatus is provided to detect an internal state of a secondary battery implemented in a battery system. The apparatus comprises a detecting unit, producing unit and estimating unit. The detecting unit detects electric signals indicating an operating state of the battery. The producing unit produces, using the electric signals, an input parameter required for estimating the internal state of the battery. The input parameter reflects calibration of a present charged state of the battery which is attributable to at least one of a present degraded state of the battery and a difference in types of the battery. The estimating unit estimates an output parameter indicating the charged state of the battery by applying the input parameter to neural network calculation.

9 Claims, 51 Drawing Sheets

U.S. PATENT DOCUMENTS

| | | | |
|---|---|---|---|
| 5,606,242 A * | 2/1997 | Hull et al. | 320/106 |
| 5,825,156 A * | 10/1998 | Patillon et al. | 702/63 |
| 5,936,385 A * | 8/1999 | Patillon et al. | 320/136 |
| 6,064,180 A * | 5/2000 | Sullivan et al. | 320/132 |
| 6,150,823 A | 11/2000 | Takahashi et al. | |
| 6,232,747 B1 | 5/2001 | Takahashi et al. | |
| 6,621,250 B1 | 9/2003 | Ohkubo et al. | |
| 2004/0207367 A1 | 10/2004 | Taniguchi et al. | |
| 2005/0194936 A1 * | 9/2005 | Cho, II | 320/132 |

FOREIGN PATENT DOCUMENTS

| | | |
|---|---|---|
| JP | A 3-183328 | 8/1991 |
| JP | A 6-59003 | 3/1994 |
| JP | A 8-29505 | 2/1996 |
| JP | A 9-243716 | 9/1997 |
| JP | A 2000-67932 | 3/2000 |
| JP | A 2000-147075 | 5/2000 |
| JP | A 2001-157377 | 6/2001 |
| JP | A 2003-249271 | 9/2003 |

* cited by examiner

| BATTERY (DEGRATED) | FULL CHARGE CAPACITY [Ah] | OPEN-CIRCUIT VOLTAGE RESPONDING TO PREDETERMINED- AMOUNT DISCHARGE [V] | BEFORE CALIBRATION SOC DETECTION ERROR [%] | AFTER CALIBRATION SOC DETECTION ERROR [%] |
|---|---|---|---|---|
| USED BATTERY A | 10.5/27 | 12.3 | 11.6 | 4.4 |
| USED BATTERY B | 18.5/27 | 12.4 | 8.3 | 3.8 |
| USED BATTERY C | 10.0/27 | 12.2 | 15.2 | 6.7 |
| USED BATTERY D | 21.4/27 | 12.9 | 15.2 | 4.9 |
| USED BATTERY E | 18.6/27 | 12.3 | 9.7 | 4.2 |

INPUT PARAMETERS $r1 = Va/Vaf$ $r2 = Vo/Vof$ $r3 = R/Rf$ $r4 = (Vo^2/R)/(Vof^2/Rf)$

Ia

|  | TYPE | CAPACITY [Ah] |
|---|---|---|
| USED BATTERY A | 34B | 10.5 |
| USED BATTERY B | 34B | 20.5 |
| USED BATTERY C | 34B | 18.2 |
| USED BATTERY D | 34B | 21.2 |
| USED BATTERY E | 34B | 10.0 |

FIG. 72
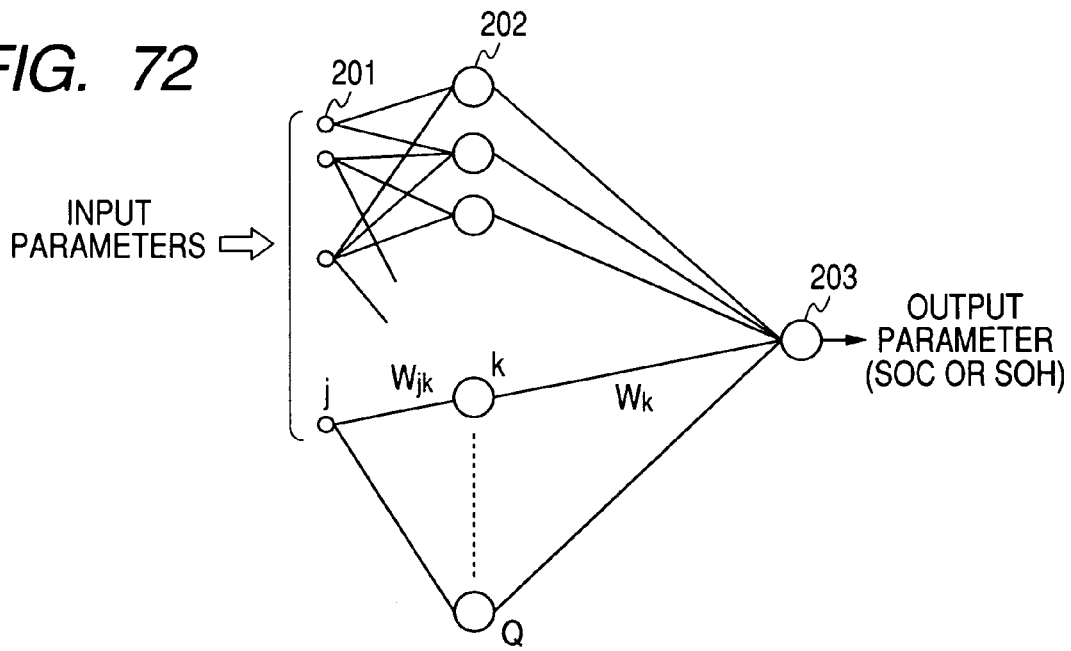
FIG. 73
| BATTERY | TYPE | FULL CHARGE CAPACITY [Ah] |
|---|---|---|
| A | 34B | 21.8 |
| B | 34B | 18.2 |
| C | 34B | 24.3 |
| D | 34B | 27.6 |
| E | 34B | 39.5 |
FIG. 74
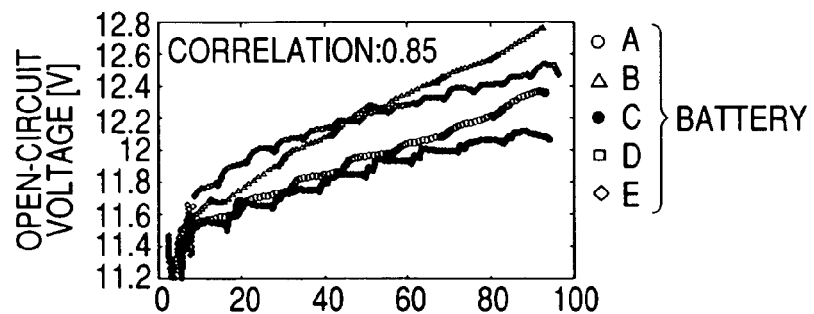

METHOD AND APPARATUS FOR DETECTING CHARGED STATE OF SECONDARY BATTERY BASED ON NEURAL NETWORK CALCULATION

CROSS REFERENCES TO RELATED APPLICATIONS

The present application relates to and incorporates by reference Japanese Patent application Nos. 2005-036442 filed on Feb. 14, 2005, 2005-036437 filed on Feb. 14, 2005, 2005-039614 filed on Feb. 16, 2005, 2005-122011 filed on Apr. 20, 2005, 2005-122004 filed on Apr. 20, 2005, and 2005-151050 filed on May 24, 2005.

BACKGROUND OF THE INVENTION

1. Field of the Invention

The present invention relates to a battery system with a neural network type of apparatus for detecting a charged state of a secondary (rechargeable) battery, and in particular, to an improvement in detection of the charged state of such a battery which is for example mounted on vehicles.

2. Description of the Related Art

An on-vehicle battery system is mostly composed of a secondary battery such as lead batteries. In the secondary battery, degrees of degradation give fluctuations to correlations between electric quantities of a battery, such as voltage and current, and charged state quantities of the battery, such as an SOC (state of charge) and an SOH (state of health). The SOC indicates a charged rate [%] of a battery and the SOH indicates a residual capacity [Ah] of a battery. Thus, as the degradation advances in the battery, the precision in detecting the SOC and/or SOH will be degraded, whereby the SOC and/or SOH will differ battery by battery. These problems make it difficult to detect, with precision, the SOC and/or SOH of each of secondary batteries which are mass-produced. Therefore, to avoid such fluctuations on the safe side, the fluctuations should be taken into account in a usable charge and discharge range of each second battery, with the result that the range is obliged to be narrower.

Some known references, which are for instance Japanese Patent Laid-open Publications Nos. 9-243716 and 2003-249271, propose a technique to improve the above situation. That is, those references propose how to detect the SOC and/or SOH of a secondary battery with the use of neural network (which is called "neural network type of detection of battery state").

For example, the publication No. 9-243716 provides a technique of detecting the residual capacity of a battery, in which input parameters including at least an open-circuit voltage, a voltage detected immediately after a discharge, and an internal resistance are used for allowing a leaned neutral network to calculate the residual capacity. The publication No. 2003-249271 also provides a technique of detecting the residual capacity of a battery, in which data of voltage, current and internal resistance of a battery and a temperature are inputted to a first learned neural network to calculate information showing degradations of the battery, and this information and the data of voltage, current and internal resistance of the battery are inputted to a second learned neural network to calculate the residual capacity of the battery.

Since the neural network has flexibility in coping with fluctuations in the characteristic of an object to be measured, the neural network has been used for the detection of battery state, explained above.

However, even when the SOC and/or SOH are detected using the conventional neural network type of detection apparatus, fluctuations and changes in the measurement precision, which are due to degradations in the battery, cannot be prevented sufficiently. It is therefore hard to say that the detection precision for the SOC and/or SOH has been a sufficiently practicable level. This is attributable to the following fact. That is, new batteries and used (old, degraded) batteries give differences to correlations between current and voltage history data which are to be inputted into a neural network and SOC and SOH data which are output parameters from the neural network. The existence of those various different correlations makes it difficult to absorb the fluctuations and changes in the measurement precision even when calculation is made using the neural network.

In addition, there is known a technique to improve the above current situation. Specifically, a present value of an open-circuit voltage and an internal resistance of a battery, which can be estimated using a least-squares method, are added to input parameters. Thus data of those present values and voltage and current history are given to a neural network as the input parameters. Those additional data, that is, the present values reflecting the operating state of a battery, enable the detection of an output parameter such as SOC and SOH to be enhanced in precision, with less influenced by degradations of the battery.

However, even when the present values of such physical quantities are taken into account as part of the input parameters, a substantial progress in the degradation of the battery makes it difficult to attain or keep a practically-required higher level in detecting the SOC and/or SOH.

On the other hand, a large number of state quantities covering almost all operations of each battery may be fed to a neutral network calculator. In this case, it would be expected to have an increase in the detecting precision. However, such a configuration is not favorable, because the calculator becomes large in its circuit size, a calculation load increases, and much power is consumed.

SUMMARY OF THE INVENTION

The present invention has been completed with the above view in mind and has an object to provide a method and apparatus for detecting charged state of a secondary battery based on neural network calculation, which is able to provide an output parameter with a higher precision, regardless of differences in charge and discharge characteristics of individual batteries, the differences resulting from, for example, degrees of temporal degradations (cycle degradations) and/or differences in battery types.

Another object of the present invention is, solely or in combination with the above object, to provide an apparatus for detecting charged state of a secondary battery based on neural network calculation, which is able to provide an output parameter with less input parameters, while still maintaining a higher precision in detecting information showing charged states of the battery.

To achieve the above first object, as a fundamental aspect of the present invention, there is provided a neural network type of apparatus for detecting an internal state of a secondary battery (rechargeable) implemented in a battery system, the apparatus comprising: detecting means for detecting electric signals indicating an operating state of the battery; producing means for producing, using the electric signals, an input parameter required for estimating the internal state of the battery, the input parameter reflecting calibration of a present charged state of the battery; and estimating means for estimating an output parameter indicating the charged state of the battery by applying the input parameter to neural network calculation.

Preferably, as first to third aspects of the present invention, the electric signals are voltage and current of the battery acquired in real time during a predetermined period of time; the input parameter consisting of a first input parameter indicating the operating state of the battery and a second input parameter indicating the degraded state of the battery; and the producing means comprises means for calculating the first input parameter on the basis of data of the voltage and current of the battery, and means for calculating the second input parameter in response to a state of predetermined charge of the battery (for example, to a state in which a predetermined amount of power from the battery which has been fully charged is discharged).

Still preferably, as the first and second aspects of the present invention, the outputting parameter estimating means is means for calculating the output parameter indicating a present charged state of the battery by processing both the first and second input parameters based on a neural network calculation technique.

If a brand new battery is once used, the battery is no longer new, but becomes a used (i.e., degraded in the performance) battery, in which the degree of degradation (cycle degradation) of the battery changes while it is used. Of course, the degree of degradation of each battery depends on the battery type. That is, the present charged states of all used batteries are different battery by battery. Therefore, such different charged states are all reflected in the "present charged state" stated above.

Thus, the foregoing fundamental configuration adopts the technique of including, into the input parameters for neural network calibration, data of calibration of a present charged state of a battery, the calibration reflecting, as described, for example, the degree of degradation in charge/discharge of a used battery. Including such calibration data into the input parameters enables an output parameter to be calculated (estimated) more accurately than, for example, a situation where data of voltage and current history are simply used as input parameters. By repeating such estimation at intervals, the charged state of a used battery can be checked with high precision, with automatically tracking temporal degradations of the charge/discharge performance of the used battery.

It is preferred to use, as such calibration data, a charge-related physical quantity showing a correlation with changes in an output parameter (such as an SOC) due to, for example, degradations of a used battery. For example, such a charge-related physical quantity is an open-circuit voltage to be detected in response to a state of predetermined charge of a battery. This kind of charge-related physical quantity is referred to as a second input parameter in one aspect of the present embodiment, in which the second input parameter is combined with a first input parameter to form the input parameter fed to a neural network calculator that is in charge of performing the neural network calculation.

Further, the charge-related physical quantities, which can be adopted in the present invention, include a difference between open-circuit voltages obtained responsively to a full charge of a battery and to discharging a predetermined amount of power from a full charge power of the battery. As such a quantity, also useful is a combination of the above voltage difference and an open-circuit voltage obtained responding to a discharge of a predetermined amount of power from a battery in a full charge. Additionally an internal resistance of a battery obtained in response to discharging a predetermined amount of power from a battery in a full charge may be used as such a charge-related physical quantity. Such various quantities have correlations with changes in the SOC and SOH of a battery, so that they can be used as calibration data for correction of changes in the charge/discharge characteristics of each battery that is attributable to degradations and/or differences of battery types.

As the third aspect of the present invention, the first input parameter calculating means is configured to calculate, as the first input parameter, voltage history data and current history data based on data of the received voltage and current of the battery; the second input parameter calculating means is configured to calculate, as the second input parameter, an open-circuit voltage of the battery and an internal resistance of the battery using both the voltage history data and the current history data in response to a state of predetermined charge of the battery; and the outputting parameter estimating means is means for calculating the output parameter indicating a full charge capacity of the battery, the full charge capacity being expected at present.

In this way, by adding, to the input parameter, only an open-circuit voltage of the battery and an internal resistance of the battery, which are detected responsively to a discharge of a predetermined amount of power from a battery which has been fully charged, the precision for the neural network calculation can be done with high precision, while still preventing the number of input parameters from being increased. Accordingly, the size of a neural network calculator can be kept smaller, but the full charge capacity of a used battery can be calculated with precision, even compared to conventional calculators with or without a neural network. And the time for calculation can be kept in a period of time required for practical use. As a result, with no paying attention to over-charge and over-discharge, the capacity range for use can be widened. Compared to the conventional, a battery can be made more compact, while still being enough for covering a necessary discharge capacity range for the battery. This will lead to not merely less space occupation for mounting a battery on vehicles but also a decrease in the vehicle body weight. In consequence, the second object of the present invention can also be attained.

In a fourth aspect of the present invention, the electric signals are voltage and current of the battery acquired in real time during a predetermined period of time; the estimating means comprises a neural network having the input layer which receives the input parameter and an intermediate layer which performs neural network calculation using both of the input parameters and rewritable coupling coefficients mutually connecting the input layer, the intermediate layer, and an output layer so as to estimate the output parameter and allow the output parameter to be outputted from the output layer, the output parameter indicating the charged state of the battery; and the producing means comprises a memory with a plurality of memory tables each storing the coupling coefficients, the coupling coefficient stored in the memory tables being different from one another table by table and depending on divided ranges of a characteristic of a specified input parameter specified in the input parameter, the specified input parameter having a correlation with a degraded state of the battery; and selecting means for selecting, in response to a present value of the specified input parameter, a memory table from the plurality of memory tables to read in the coupling coefficients stored therein, the specified coupling coefficients being given to the neural network calculation. By way of example, the input parameters include voltage history data, current history data, and an open-circuit voltage of the battery which are estimated on the voltage and current of the battery and the specified input parameter is an open-circuit voltage of the battery to be obtained when the battery is in a fully charged state thereof.

Selectively using the plurality of memory tables described above makes it possible that coupling coefficients for neural network calculation are selected to have a higher correlation with presently acquired input parameters, increasing accuracy in calculating a charged state of a battery. This accurate calculation can be realized, provided that a memory capacity for this calculation is allowed to increase slightly, thus the size of circuitry for the calculation being prevented from increasing. A rise in the processing time for the calculation is almost never required, because selectively reading the memory tables requires only changing the addresses of the coupling coefficients in a memory. Delay in the calculation will not occur. Hence, though the memory capacity increases a little, the charged state of a battery can be detected with higher precision.

In a fifth aspect of the present invention, the producing means is configured to produce the input parameter which is calibrated depending on a charge and discharge characteristic of the battery which is attributable to at least one of the degraded state of the battery and the difference in types of the battery. It is preferred that the input parameter includes either a voltage Vof the battery or a ratio V/Vf wherein Vf is a voltage of the battery detected when the battery is in a fully charged state, either an open-circuit voltage Vo of the battery or a ratio of Vo/Vof wherein Vof is an open-circuit voltage detected when the battery is in a fully charged state, either an internal resistance R of the battery or a ratio of R/Rf wherein Rf is an internal resistance detected when the battery is in a fully charged state, a predetermined function f(Vo, R) using, as input variables, the open-circuit voltage Vo and the internal resistance R and expressing a correlation to an amount of current of the battery which is dischargeable at present, and a current I of the battery.

In this aspect, a large number of pairs of sampled voltage and current data are not necessary for the calculation, resulting in that the circuitry can be avoided from increasing in its size and a calculation load can be reduced, and the precision of neural network calculation is also secured. To be more specific, the input parameters include the function value f(Vo, R) whose variables Vo and R are individually correlated with a degradation and a residual capacity of each battery, respectively. In other words, compared with sole use of the open-circuit voltage Vo or internal resistance R, the function value f(Vo, R), which shows a dischargeable amount of power, has higher correlations with degraded states and charged states of each battery. Thus, the influence of a battery degradation on its residual capacity is well reflected in the input parameters, which leads to the above advantage.

In a sixth aspect of the present invention, the input parameter is composed of a plurality of physical state quantities reflecting the present charged state of the battery and the plurality of physical state quantities include a ratio between a present value of a physical state quantity specified among the physical state quantifies and a value of the specified physical state quantity acquired in response to a state of predetermined charge of the battery (for example, in response to discharging a predetermined amount of power from the battery which has fully been charged).

The various advantages provided by the foregoing fifth aspect is also true of the structure of this sixth aspect, which is therefore effective for detection of a variety of batteries whose degraded states, used history and/or initial capacities are different from each other.

BRIEF DESCRIPTION OF THE DRAWINGS

In the accompanying drawings:

FIG. 72 is a functional block diagram explaining the functional configuration of a neural network calculator in the eighth embodiment;

FIG. 73 is a graph explaining full charge capacities of batteries used for comparative tests;

FIG. 74 is a graph showing a correlation between an open-circuit voltage and an SOC of each battery;

DETAILED DESCRIPTION OF PREFERRED EMBODIMENTS

Various embodiments of an on-vehicle battery system according to the present invention will now be described with reference to the accompanying drawings.

The following embodiments are made up of eight embodiments, which are: a first embodiment (including modifications) described in connection with FIGS. 1-9 and 94; a second embodiment (including modifications) described in connection with FIGS. 10-14; a third embodiment (including modifications) described in connection with FIGS. 15-24; a fourth embodiment (including modifications) described in connection with FIGS. 25-35; a fifth embodiment (including modifications) described in connection with FIGS. 36-39; a sixth embodiment (including modifications) described in connection with FIGS. 40-49; a seventh embodiment (including modifications) described in connection with FIGS. 50-68; and an eighth embodiment (including modifications) described in connection with FIGS. 69-93.

Figure 95:
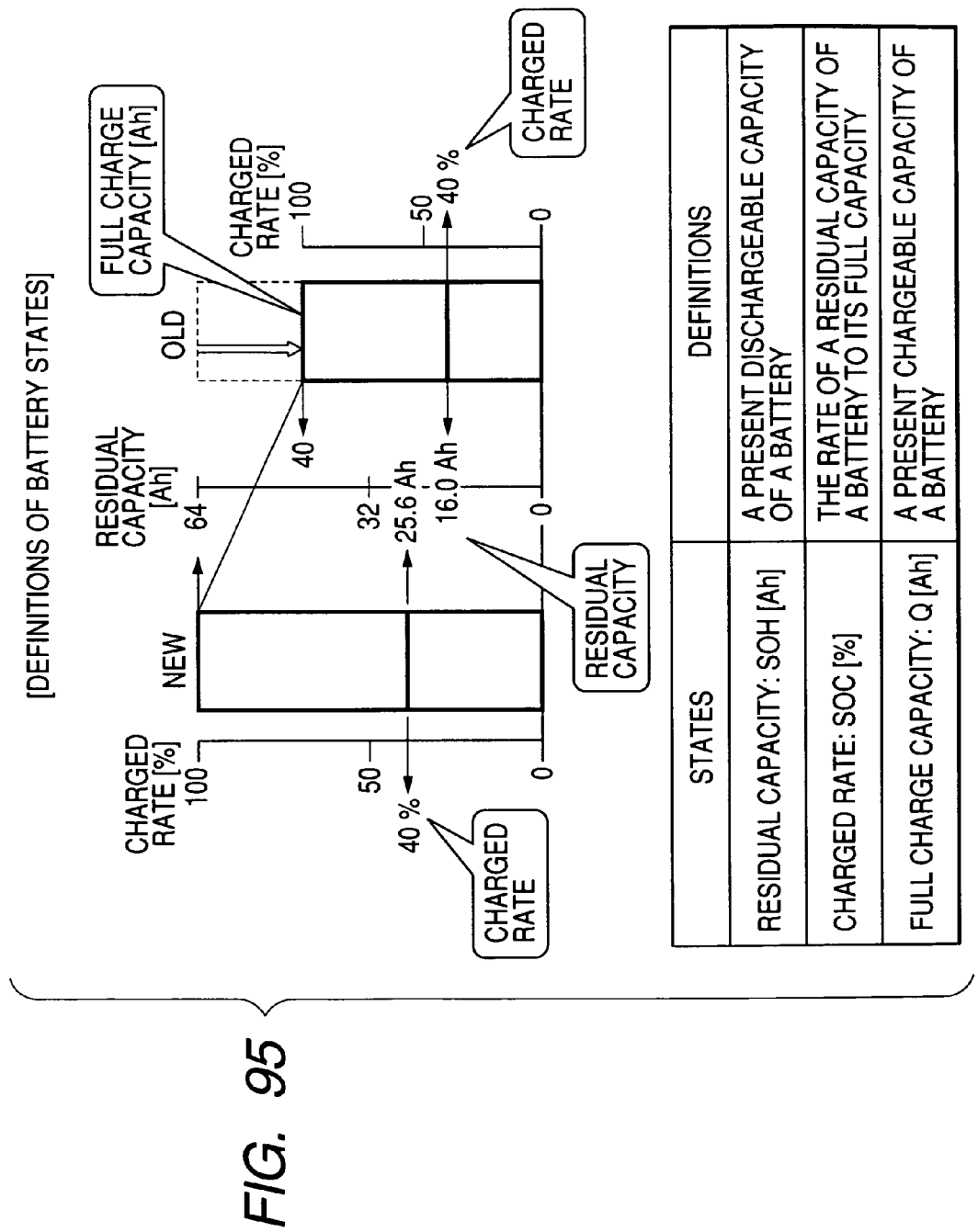
FIG. 95 illustrates charged states of both a brand new battery and a used (degraded) battery and the definitions of an SOH, SOC and full charge capacity.

Prior to detailed description of the following embodiments, the charged state of a battery (secondary battery, rechargeable battery) will be defined with reference to FIG. 95. As illustrated, an SOH (state of health) (Ah), called "residual capacity," means a present dischargeable capacity of a battery, an SOC (state of charge) (%), called "charged ratio," means the ratio of a residual capacity of a battery to a full charge capacity thereof, and a full charge capacity Q (Ah) means a present chargeable capacity in a battery. Hence, by way of example, suppose that a new battery which has not been used yet has an SOH of 64 Ah corresponding to an SOC of 100% (i.e., a full charge capacity of 64 Ah). In this battery, an SOH of 25.6 Ah corresponds to an SOC of 40%. And suppose that this new battery has been used and its charging ability is degraded considerably so that a full charge capacity is 40 Ah. However this capacity amount still corresponds to an SOC of 100% and, in this case, an SOC of 40% means an SOH of 16.0 Ah.

First Embodiment

Referring to FIGS. 1-9, a first embodiment of the on-vehicle battery system will now be described. This on-vehicle battery system is based on neural network type of calculation and corresponds to a battery system according to the present invention.

Figure 1:
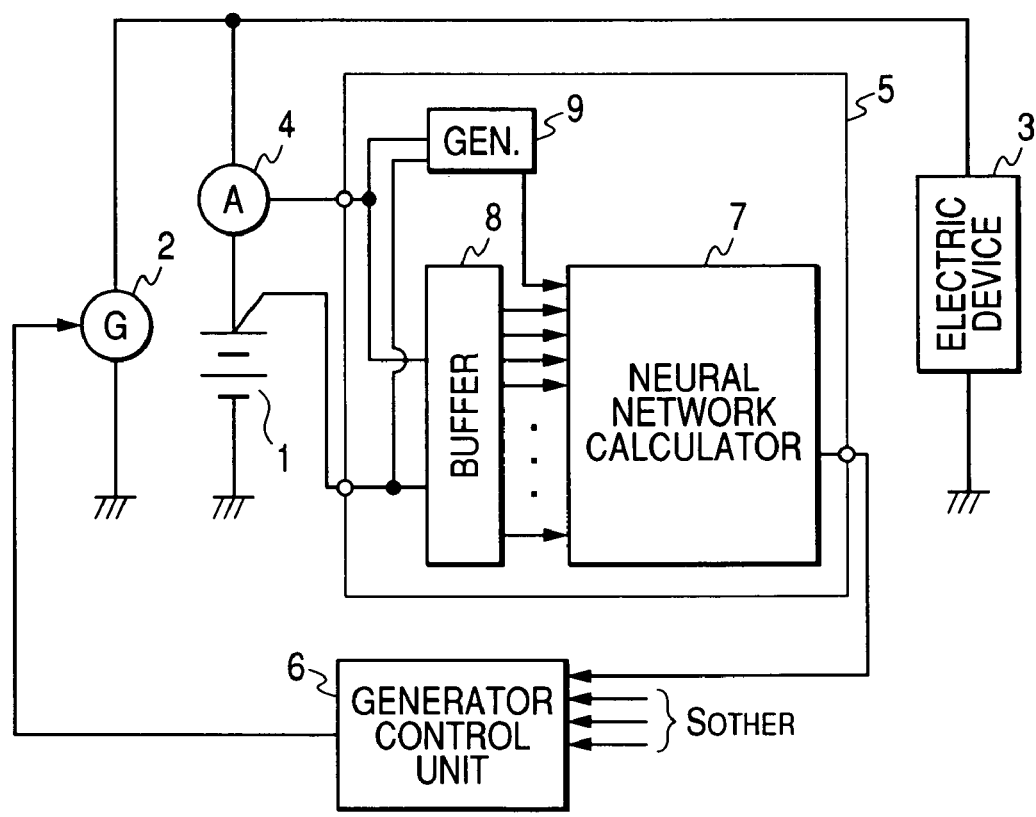
FIG. 1 is a block diagram showing the circuitry of an on-vehicle battery system adopted by a first embodiment according to the present invention.

As shown in FIG. 1, the on-vehicle battery system is provided with an on-vehicle battery (hereinafter, simply referred to as a "battery") 1 and other electric components including an on-vehicle generator 2, an electric device(s) 3, a current sensor 4, a battery state detector 5, and a generator control unit 6. Of these, as shown, the battery state detector 5 is equipped with a neural network calculator 7, a buffer 8, and a correcting signal generator 9 and may be, in part or as a whole, formed by either a computer configuration or a structure on digital/analog circuitry.

The on-vehicle generator 2 is mounted on the vehicle to charge the battery 1 and power the electric device 3. The electric device 3 functions as an on-vehicle electric load(s) which is powered by the battery 1 or the generator 2. The current sensor 4 is placed between the battery 1 and the electric device 2 to detect charge and discharge currents to and from the battery 1. In addition, the battery state detector 5 is an electric circuit unit to detect signals indicating the internal operation (charge/discharge) states of the battery 1. A terminal of the battery 1 is connected to the battery state detector 5 such that its terminal voltage (simply, voltage) is provided to the battery state detector 5.

The buffer 8 mainly has two functions; one is to receive data of both voltage (terminal voltage) V and current I of the buttery for memorization and output those data as data showing voltage history Vi and current history Ii and the other is to calculate and output a present value of an open-circuit voltage Vo and/or a present value of an internal resistance R of the battery 1. The open-circuit voltage Vo is a voltage which appears on the battery terminals provided that a load current therefrom is regarded as being zero.

The neural network calculator 7 is configured to receive various types of signals to be inputted from both the buffer 8 and the correcting signal generator 9 and applies neural network calculation to the inputted signals so as to output signals indicative of a predetermined storage state quantity (an SOC (state of charge) in the present embodiment). Further, the correcting signal generator 9 is configured to calculate calibration data, as will be described later, to output the calculate calibration data as part of the input data to the neural network calculator 7.

The generator control unit 6 is placed to control an amount of power to be generated by the on-vehicle generator 2 in response to both of a signal outputted from the neural network calculator 7 and signals Sother coming from various other not-shown components.

In the present embodiment, the circuitry is characterized in that the battery state detector 5 is equipped with the correcting signal generator 9 as well as both the buffer 8 and the neural network generator 7.

The buffer 8, neural network calculator 7 and correcting signal generator 9, that is, the battery state detector 5, are, for example in the present embodiment, made up of a microcomputer system that operates on software previously installed therein. But this is not always a definitive list. A dedicated software circuit can replace the battery state detector 5.

The buffer 8 will now be detailed. The buffer 8, which functions as a pre-signal processing circuit for the neural network calculator 7, samples, simultaneously and at intervals (for example, T/5 seconds and T is 25 seconds; refer to FIG. 94), both a signal of the voltage V of the battery 1 and a signal of current I from the current sensor 4 for memorizing data indicative of the battery voltage history Vi and buttery current history Ii, and supplies, in parallel, data indicative of voltage V and current I at each time instant to the neural network calculator 7. In consideration of various factors, such as an alleviation of calculation load and a limitation of the number of input cells in the neural network calculator 7, the sampling data of the voltage V and current I, which compose the battery voltage history Vi and battery current history Ii, is made up of data acquired at respective time instants within a predetermined period of time (e.g., T=25 seconds, refer to FIG. 94) preceding the present time instant. In the present embodiment, by way of example, the voltage history data Vi and current history data Ii are sampled at intervals to produce five pieces of data, respectively (refer to FIG. 94), but this is not a definitive list.

In addition to storing the data indicative of the battery voltage history Vi and battery current history Ii, the buffer 6 creates data that shows a relationship between the buttery voltage history Vi and the buttery current history Ii and provides the neural network calculator 7 with such relationship data. Such relationship data are created such that the data of both the voltage history Vi and current history Ii are subjected to the least-squares method to compute a linear approximate expression LN showing the relationship between the voltage and current V and I, and the approximate expression LN is subjected to calculation of a y-intercept (corresponding to an open-circuit voltage Vo) and/or slope (corresponding to an internal resistance R) every time when pairs of voltage V and current I are inputted, whereby a present value of the open-circuit voltage Vo and/or a present value of the internal resistance R are created (refer to FIG. 94). Those present values are able to function as the relationship data between the voltage history Vi and the current history Ii, as described above. How to create the linear approximate expression LN and how to calculate the present value(s) Vo and R based on the approximate expression LN are known, whereby detailed explanations for those are omitted in the present embodiment.

The foregoing least-squares method is helpful in reducing an amount of data to be memorized.

In the present embodiment, when the SOC is calculated, the present value of the open-circuit voltage Vo is more significant than that of the internal resistance R. Hence the present value of the internal resistance R may be omitted from the calculation. It may also be possible to omit, from the calculation, if necessary, the present values of the open-circuit voltage Vo and/or the internal resistance R.

Figure 2:
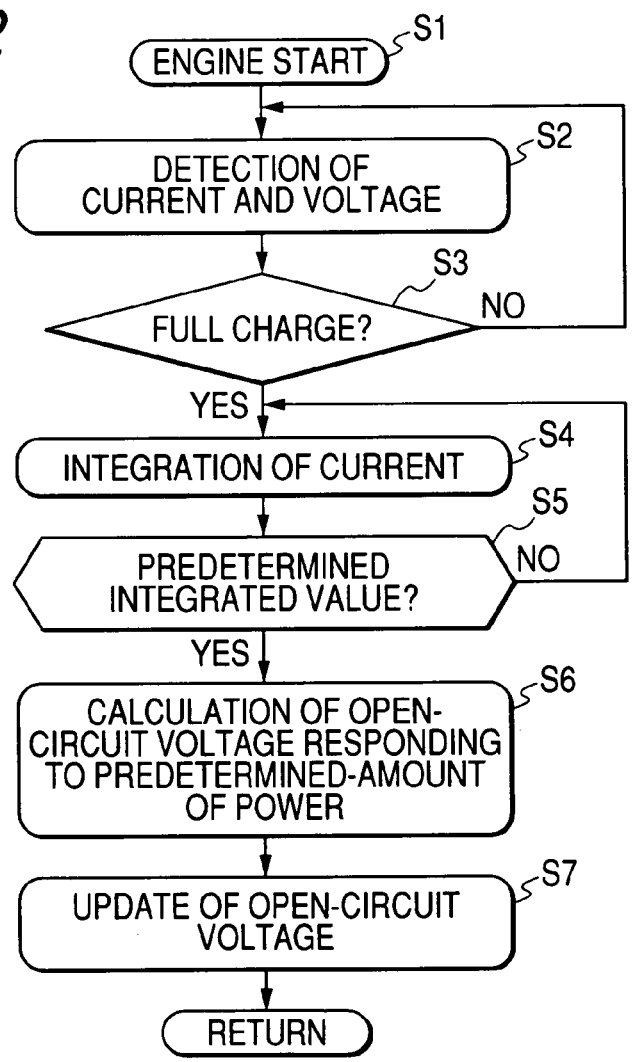
FIG. 2 is a flowchart showing how to calculate an open-circuit voltage of an on-vehicle battery detected in response of discharging a predetermined amount of power from the battery which has been fully charged.

The correcting signal generator 9 will now be detailed. This generator 9 is formed as a computer system that has a CPU (central processing unit) and memories, though not shown. The CPU operates on software described by a flowchart composed of various processing steps, which is shown in FIG. 2 and previously memorized in a memory. Through performance of those processing steps, the CPU, i.e., the correcting signal generator 9 calculates an open-circuit voltage Vo detected when the battery 1 discharges power from its full charge state by a predetermined amount of power (i.e., discharge of a predetermined amount of power). Then the generator 9 provides the neural network calculator 7 with the resultant open-circuit voltage Vo serving as calibration data to be used for its neural network calculation.

The processing steps shown in FIG. 2 will now be explained.

In response to a start of drive of the engine, the correcting signal generator 9 starts its calculation (step S1). After the start, the generator 9 detects the voltage V and the current I of the battery 1 at intervals (step S2), and then uses the detected voltage V and current I so that the detected values are subjected to a determination whether the battery 1 is in its full charge state (i.e., a full charge determination) which will be described later (step S3). The generator 9 then determines whether or not an integrated current value (Ah) reaches a predetermined threshold which is equivalent to a predetermined discharge amount (steps S4 and S5). In the present embodiment, the predetermined threshold is set to a value of 100 to 95% of the initial SOC. The voltage V and current I can be subjected to noise reduction such as low-pass filtering to pickup a DC component.

If this determination reveals that the integrated current value has reached the predetermined threshold, a value of the open-circuit voltage Vo, which is obtained when such a determination is made, is set to an open-circuit voltage value Vo to be used when a determined amount of power is discharged (step S6). The open-circuit value Vo shows a degraded state quantity obtained when the determined amount of power is discharged, which corresponds to the present invention. The open-circuit voltage Vo is updated to the calculated value (step S7). This open-circuit voltage Vo is calculated in the same way as the present value of the foregoing open-circuit voltage.

Figure 3:
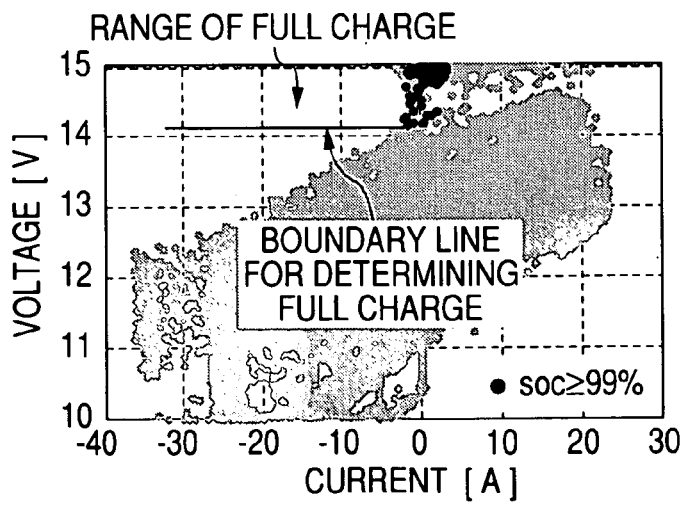
FIG. 3 is a two-dimensional map showing a range used for determining the full charge state of the battery.

Referring to FIG. 3, the foregoing determination for the fully charged state, which is conducted at step S3, will now be described. FIG. 3 shows a two-dimensional map on which pairs of data of voltage V and current I of the battery 1, which are sampled at intervals and memorized in the buffer 8, are mapped two-dimensionally. In this map, a predetermined area is predetermined for use in determining the fully charged state. When a coordinate point specified a pair of voltage V and current I detected at present is made reference to the map as to whether the point resides in the predetermined area in the map shown in FIG. 3. If the point is within the predetermined area, it is determined that the battery 1 is in its fully charged state. Thus, the voltage V meeting such a condition is defined as an open-circuit voltage $Vo_{full}$ in response to the fully charged state.

The voltage V and the current I may be replaced by an average voltage Va and an average current Ia which are mean values over a predetermined short period of time immediacy before the present sampling.

Figure 4:
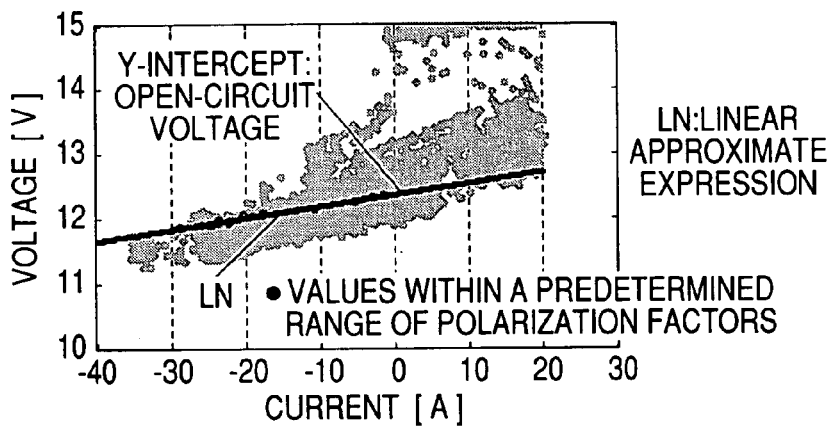
FIG. 4 is a two-dimensional map showing how to estimate an approximate expression used to calculate the open-circuit voltage detected in response of discharging a predetermined amount of power from the battery which has been fully charged.

Referring to FIG. 4, the foregoing calculation for the value of the open-circuit voltage Vo, which is conducted at step S6, will now be described. The least-squares method is first applied to data of plural pairs of voltage and current V and I which are inputted during a specified period of time counted immediately before the power is discharged from its full state by a predetermined amount, so that the linear approximate expression LN defining a relationship between the voltage V and current I is obtained. The number of voltage/current pairs is set to a predetermined value. Then the open-circuit voltage Vo is calculated as a y-intercept value of the approximate expression LN. This calculated value is treated as the foregoing open-circuit voltage obtained when a predetermined amount of power is discharged.

If it is desired to improve the precision of the linear approximation LN, a physical amount called polarization factor may be used to select the voltage and current data V and I. That is, data indicative of past currents can be used to obtain polarization factors showing polarized states of a battery. Thus, only the voltage and current values whose polarization factors are within a predetermined range are selectively used for creating the linear approximate expression LN.

How to create the linear approximate expression LN on the least-squares method and how to calculate the open-circuit voltage Vo on the linear approximate expression are known, so that further explanations about those will omitted here.

Figure 5:
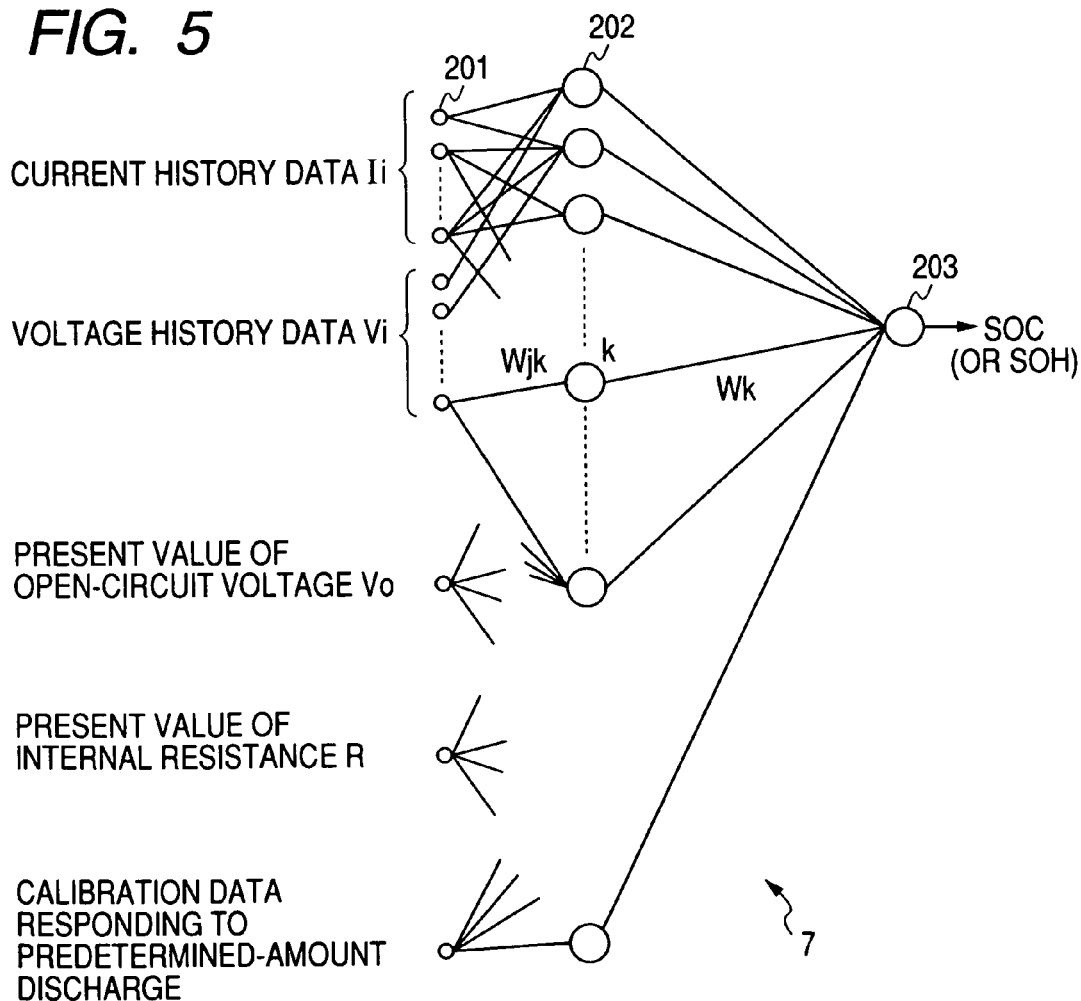
FIG. 5 is a functional block diagram explaining the functional configuration of a neural network calculator.

Referring to FIG. 5, the neural network calculator 7 will now be detailed in terms of its functional configuration and its operations. By way of example, the neural network calculator 7 is formed into a three hierarchical feed-forward type of calculator which learns on a back-propagation technique. This type is not decisive, but any neural network type, if selected properly, can be applied to this calculator 7.

The neural network calculator 7 is composed of, as its functional blocks, an input layer 201, an intermediate layer 202, and an output layer 203. Practically, however, this calculator 7 is configured to have a microcomputer system including a CPU and memories and the CPU executes programs read out from a memory, software processing, at intervals given for its calculation.

The input layer 201 is composed of a predetermined number of input cells. The respective input cells not only receive, as input data (signals), voltage history data Vi, current history data Ii, and present values of the open-circuit voltage Vo and internal resistance R from the buffer 8 but also receive a value of the open-circuit voltage Vo obtained when the predetermined amount of power is discharged, from the correcting signal generator 9. And the respective input cells hand the received data to all calculation cells belonging to the intermediate layer 202. The calculation cells in the intermediate layer 202 are in charge of applying later-descried neural network calculation to the data to be inputted from the input cells in the input layer 201 and providing resultant calculation results to an output cell in the output layer 203. Since the calculation is directed to an SOC, so that the output cell in the output layer 203 produces as an output data showing the state of charge (SOC).

Provided that data inputted to the j-th cell of the input layer 201 is noted as INj and a coupling coefficient between the j-th cell of the input layer 201 and the k-th cell of the intermediate layer 202 is noted as Wjk, a signal inputted to the k-th cell of the intermediate layer 202 is expressed as $$\text{INPUT}k(t) = \Sigma(Wjk * INj) \quad (j=1 \text{ to } 2m+3) \tag{1}.$$

Further, a signal outputted from the k-th cell of the intermediate layer 202 is expressed as $$\text{OUT}k(t) = f(x) = f(\text{INPUT}k(t) + b) \tag{2},$$

wherein the reference b is a constant.

The expression (2) is defined by using f (INPUTk(t)+b) which is a non-linear function called sigmoid function which uses INPUTk(t)+b as an input variable. This function is defined such that $$f(\text{INPUT}k(t)+b) = 1/(1+\exp(-(\text{INPUT}k(t)+b))) \tag{3}.$$

When a coupling coefficient between the k-th cell of the intermediate layer 202 and a cell of the output layer 203 is noted as Wk, an input signal to the output layer 203 is expressed as $$\text{INPUT}o(t) = \Sigma Wk * \text{OUT}k(t) \quad (k=1 \text{ to } Q) \tag{4},$$

similarly to the above. The reference Q denotes the number of cells in the intermediate layer 202. Accordingly an output signal from the output layer 203 at a time instant t is $$\text{OUT}(t) = L * \text{INPUT}o(t) \tag{5},$$

wherein the reference L is a linear constant.

The neural network calculation according to the present embodiment introduces a learning process in which the coupling coefficients of between the cells are optimized so as to minimize errors between a final output OUT(t) at a time t and a previously measured target output (that is, a true value tar(t)) which will described later. The output OUT(t) is an output parameter to be outputted from the output layer 203 and, in the present embodiment, an SOC (state of charge) at a time t.

How to update the coupling coefficients will now be described.

The coupling coefficient Wk between the k-th cell of the intermediate layer 202 and each cell of the output layer 203 is updated based on an expression of $$Wk = Wk + \Delta Wk \tag{6},$$

in which ΔWk is defined as follows.

$$\begin{aligned}\Delta Wk &= -\eta * \partial Ek / \partial Wk \\ &= \eta * [OUT(t) - tar(t)] * [\partial OUT(t)/\partial Wk] \\ &= \eta * [OUT(t) - tar(t)] * L * [\partial INPUTo(t)/\partial Wk] \\ &= \eta * L * [OUT(t) - tar(t)] * OUTk(t),\end{aligned} \tag{6}$$

wherein η denotes a constant.

The value Ek indicates an error between the teaching data and a network output and can be defined as follows:

$$Ek = [OUT(t) - tar(t)] * [OUT(t) - tar(t)]/2 \tag{7}.$$

Further, how to update the coupling coefficient Wjk between the k-th cell of the intermediate layer 202 and the j-th cell of the input layer 201 will now be described. The coupling coefficient Wjk is updated on an expression of $$Wjk = Wjk + \Delta Wjk \tag{8},$$

in which ΔWjk is defined as follows:

$$\begin{aligned}\Delta Wjk &= -\eta * \partial Ek / \partial Wjk \\ &= -\eta * [\partial Ek / \partial INPUTk(t)] * [\partial INPUTk(t)/\partial Wjk] \\ &= -\eta * [\partial Ek / \partial OUTk(t)] * [\partial OUTk(t)/\partial INPUTk(t)] * INj \\ &= -\eta * [\partial Ek / \partial OUT(t)] * [\partial OUT(t)/\partial INPUTo] * \\ &\quad [\partial INPUTo / OUTk(t)] * f'(INPUTk(t)+b) * INj \\ &= -\eta * (OUT(t) - tar(t)) * L * Wk * f'(INPUTk(t)+b) * INj \\ &= -\eta * L * Wk * INj * (OUTsoc(t) - tar(t)) * f'(INPUTk(t)+b),\end{aligned} \tag{9}$$

in which f'(INPUTk(t)+b) is a derivative value of a transfer function.

The thus-updated new coupling coefficients Wk and Wjk are used to re-calculate an output OUT(t), that is, an SOC at a time t. This update and calculation process will be repeated until the error function Ek becomes below a given minute value. Hence, a process in which the coupling coefficients are updated to bring the error function Ek into a value below the given minute value is the foregoing learning process.

Figure 6:
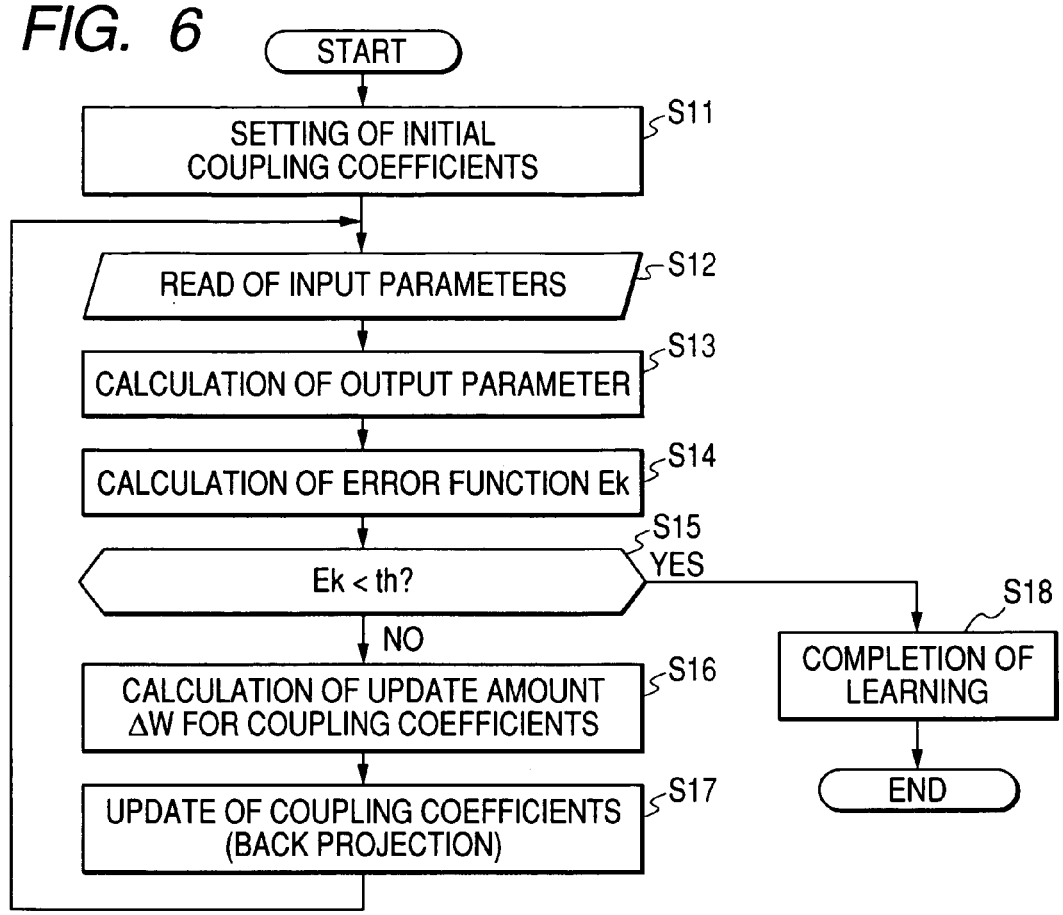
FIG. 6 is a flowchart showing the processing executed by the neural network calculator.

Referring to FIG. 6, a flowchart showing the foregoing learning process will now be described. In this process, a target to be outputted from the neural network calculator 7 is a quantity indicating the state of the battery 1 (i.e., charged state quantity). Practically, for example, the charged state quantity is an SOC (state of charge).

First, when the start is commanded, the neural network calculator 7 gives properly selected initial values to the coupling coefficients (step S11). The initial values are decided by using a random table, for example. Then the calculator 7 reads in, as input signals, the foregoing input signals for learning and receives at each cell of the input layer 201 (step S12). Using the foregoing initial values given to the coupling coefficient, the input signals are subjected to the neural network calculation so that a value of the SOC, i.e., the output parameter, is figured out (step S13).

The calculator 7 then calculates the error function Ek according to the foregoing expression (step S14) and determines whether or not the error function Ek represents a value smaller than a threshold "th" serving as a given minute value (step S15). In cases where the value of the error function Ek is equal to or more than the threshold th, the calculator 7 allows the coupling coefficients Wk and Wjk to be subjected to the update so as to figure out update amounts $\Delta W$, which are defined as above in the learning process (step S16), and then proceeds to the update of the coupling coefficients Wk and Wjk (step S17).

The processing in the neural network calculator 7 is then returned to step S12 to read again the input signals for learning at the cells of the input layer 201. Hence the SOC is calculated again as the above and repeat the foregoing processing until the error function Ek has a value smaller than the threshold th.

In contrast, when the calculator 7 determines that the error function Ek presents a value smaller than the threshold th, the calculator 7 decides that the learning has been completed (step S18). In response to this decision, the learning process is ended.

Accordingly, the neural network calculator 7 can be manufactured such that the calculator 7 previously learns several charge/discharge patterns corresponding to representative battery types based on the foregoing learning process or learning results are previously written into this calculator 7 before shipment of the products. This makes it possible to sequentially estimate the SOC of an on-vehicle battery which is mounted on a commercially available vehicle.

In the case that the full charge cannot be determined or the open-circuit voltage Vo responding to a discharge of a predetermined amount of power cannot be detected, the last value detected as the open-circuit voltage Vo may be held. This way also provides another approach to updating the open-circuit voltage Vo concerning the full charge, whereby the SOC can precisely be detected depending on how much the battery 1 is degraded during use thereof.

(Test Results)

Figure 7:
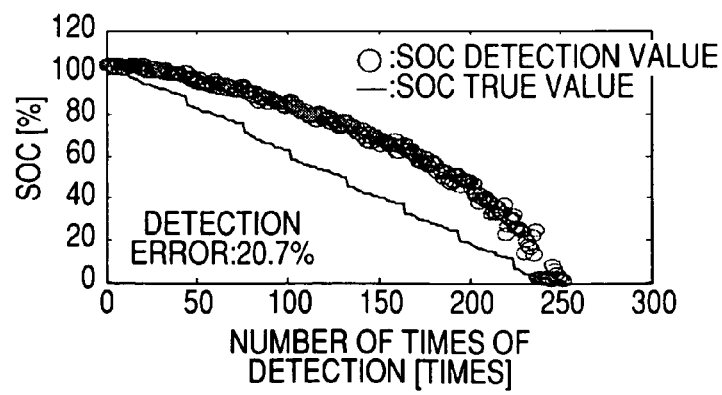
FIG. 7 is a graph showing test results for an SOC (state of charge) calculated with no use of the open-circuit voltage, which is according to a configuration corresponding to the conventional.

A neural network calculator which has learned some charge/discharge patterns (10.15 mode) of some batteries including performance-degraded batteries was prepared. Another charge/discharge pattern (10.15 mode) for a further performance-degraded (i.e., used) battery was inputted to the calculator, with the neural network calculation performed on the pattern so that a SOC (i.e., charged rate) was obtained. The results are shown in FIG. 7.

Conditions of this test are as follows. The input signals to the neural network calculator 7 were signals showing voltage history data Vi and current history data Ii, a present value of the open-circuit voltage Vo, and a present value of the internal resistance R. Data of the open-circuit voltage Vo acquired when a predetermined amount of power is discharged was not used in this test. This used battery has an open-circuit voltage Vo of 12.9 V in the full charge state, which is higher than an open-circuit voltage Vo of 12.4 V in the full charge state of a band-new battery. As a result, an error of the SOC detection was as large as 20.7% (as a mean square error).

Figures 8, 9:
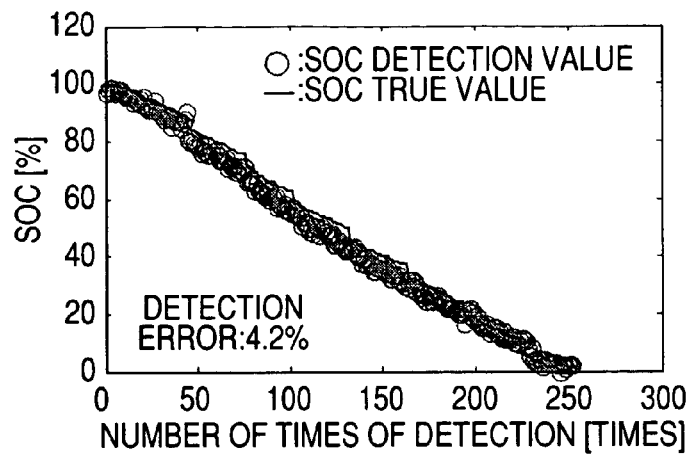
FIG. 8 is a graph showing test results for the SOC calculated with the use of the open-circuit voltage, which are according to the first embodiment.
FIG. 9 is a table explaining the accuracy in detecting SOCs of various degraded batteries in a comparative form between two cases in which the open-circuit voltage is used and not used.

Another test was made, in which the open-circuit voltage Vo acquired when a given amount of power (in this case, 0.5 Ah) was discharged from the full charge state was added to the input signals to the neural network calculator. And the SOC detection was made according to the neural network calculation in which the foregoing same learning was reflected. The results were gained as shown in FIG. 8, which shows that the error of the SOC detection drastically increases from 20.7% to 4.2%.

Another test was conducted such that, in both cases where the open-circuit voltage Vo in response to a discharge of a predetermined power from the full charge power was not used (before input) and was used (after input), five performance-degraded batteries were used, as test specimens, to obtain an SOC detection error similarly with the use of the charge/discharge pattern (10.15 mode). The tested results are shown in FIG. 9, which reveals that, regardless of being subjected to the essentially same neutral network calculation, employing only the open-circuit voltage Vo acquired when a given amount of power is discharged after the full charge state makes it possible to reduce the error of the SOC detection to a larger extent.

In the present embodiment, "a state of a predetermined charge of a battery" according to the present invention corresponds, by way of example, to a state in which a predetermined amount of power is discharged from the battery 1 which has fully been charged.

(Modifications)

Figure 21:
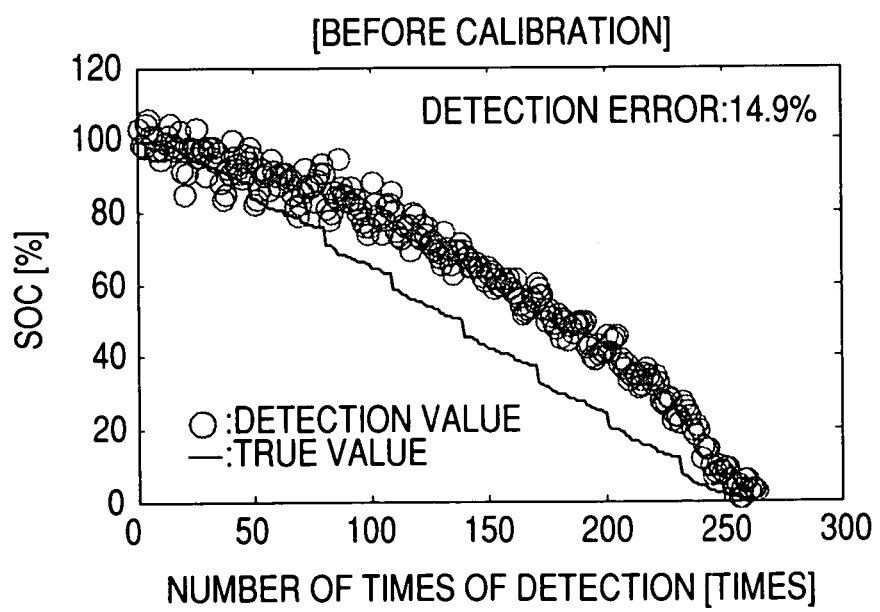
FIG. 21 is a graph showing comparative test results for detecting an SOC with no use of calibration data, which is according to a configuration corresponding to the conventional.
Figure 22:
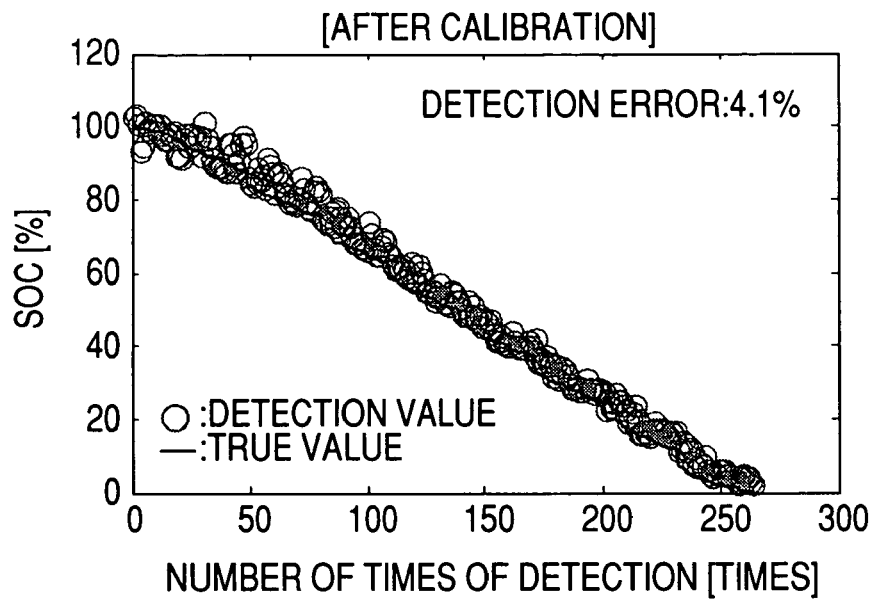
FIG. 22 is a graph showing test results for detecting the SOC with no use of calibration data, which is obtained in a modification.

In the configuration of the neural network calculation shown in FIG. 5, the input signals may be limited to only data of the voltage history Vi and the current history Ii and data of the open-circuit voltage Vo gained when a predetermined amount of power is discharged may be used as calibration data. To verify effects of this modified configuration, comparative tests were conducted on SOC detection errors of further used batteries using two configurations; one was conducted with the use of the above input signals but with no use of the calibration data, while the other was conducted with the use of the above input signals and the calibration data. The test results are shown in FIGS. 21 and 22. FIG. 21 shows the case with no calibration data used, in which the SOC detection error was as much as 14.9%, while FIG. 22 shows the case with the calibration data used, in which it was found that the SOC detection error dropped down to 4.1%, which is a large decrease.

Figure 23:
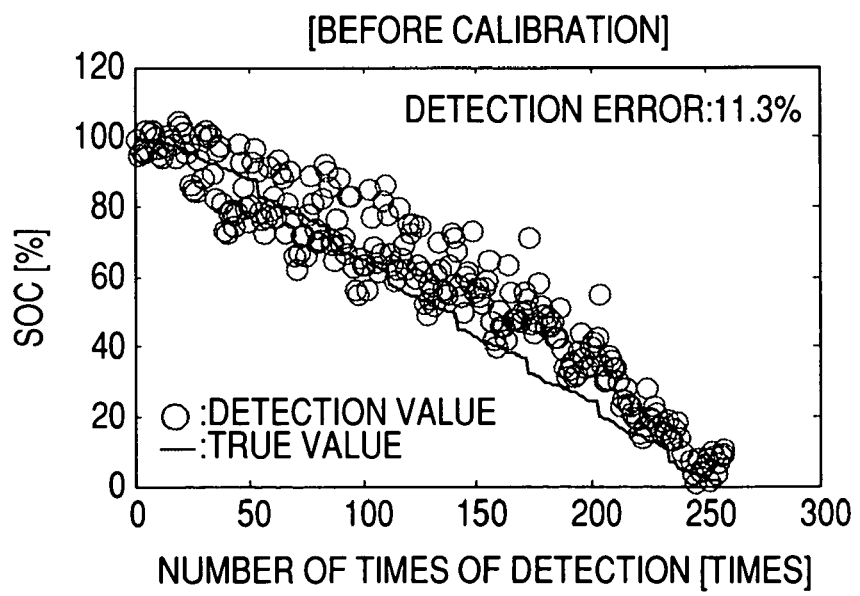
FIG. 23 is a graph showing comparative test results for detecting an SOC with no use of calibration data, which is according to a configuration corresponding to the conventional.
Figure 24:
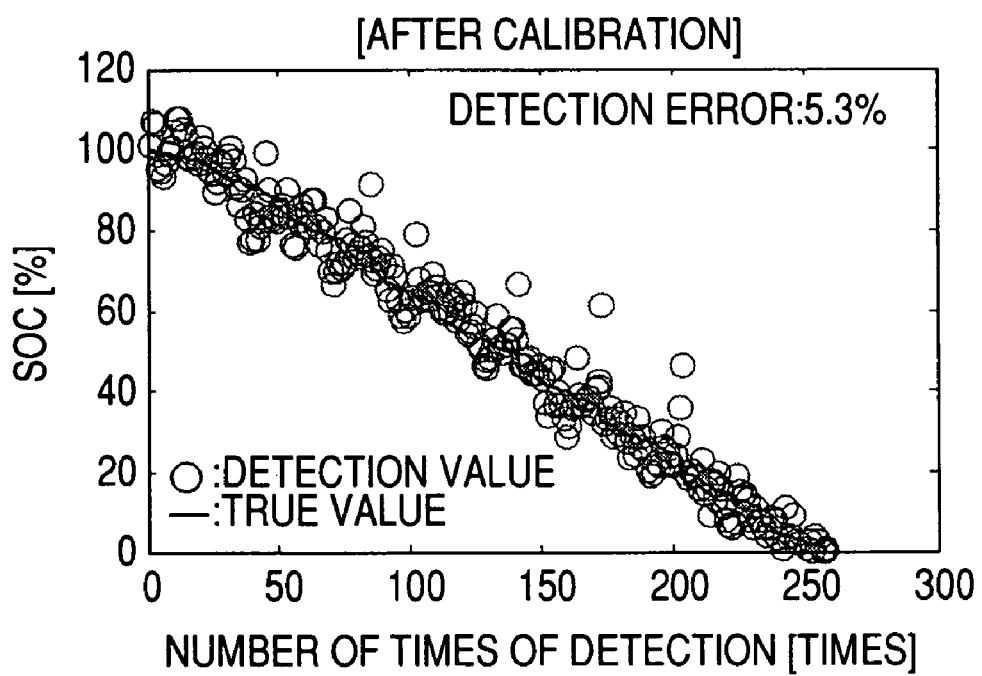
FIG. 24 is a graph showing test results for detecting the SOC with no use of calibration data, which is obtained in a further modification.

Another modification is available as well. That is, in the configuration of the neural network calculation shown in FIG. 5, the input signals may be limited to only data of the voltage history Vi and data of the open-circuit voltage Vo gained when a predetermined amount of power is discharged may be used as calibration data. To verify effects of this modified configuration, comparative tests were conducted on SOC detection errors of further degraded batteries using two configurations;

one was conducted with the use of the above input signal but with no use of the calibration data, while the other was conducted with the use of both the above input signal and the calibration data. The test results are shown in FIGS. 23 and 24. FIG. 23 shows the case with no calibration data used, in which the SOC detection error was as much as 11.3%, while FIG. 24 shows the case with the calibration data used, in which it was found that the SOC detection error dropped down to 5.3%, which is a large decrease, like the first modification.

Second Embodiment

Referring to FIGS. 10 to 14, a second embodiment according to the on-vehicle battery system of the present invention will now be described.

The on-vehicle battery system adopted in the second embodiment is the same or equivalent as or to that adopted in the first embodiment except for the operations of the correcting signal generator. Thus, for the sake of simplified explanations, those components which are the same or equivalent as or to those in the first embodiment are given the same reference numerals and omitted from being described in detail. This manner will also be true of the succeeding embodiments.

Figure 10:
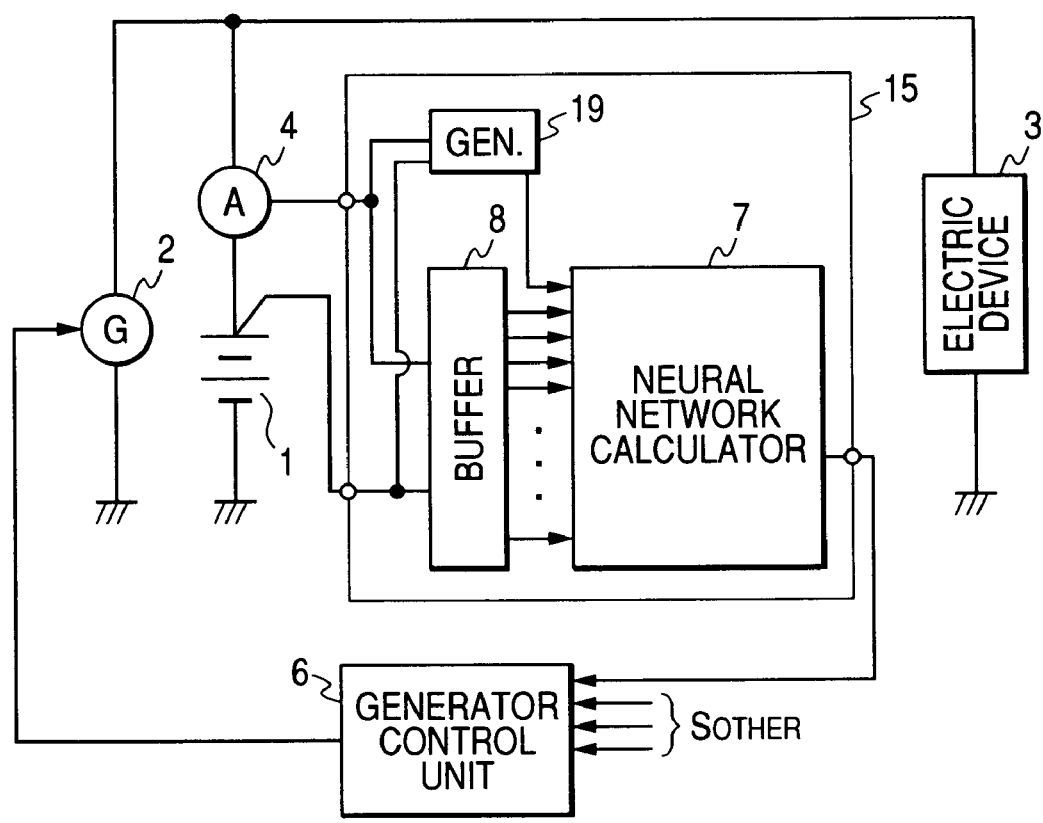
FIG. 10 is a block diagram showing the circuitry of an on-vehicle battery system adopted by a second embodiment according to the present invention.

As shown in FIG. 10, the second embodiment adopts a battery state detector 15 with a correcting signal generator 19 which is configured to use a difference $\Delta V$ between two open-circuit voltages Vo, which is different from the first embodiment. In the first embodiment, used is only the open-circuit voltage Vo detected when the battery 1 discharges in its full charge state by a predetermined amount of power. Instead of this quantity, the correcting signal generator 19 uses a difference $\Delta V$ between an open-circuit voltage Vo detected when the battery 1 discharges a predetermined amount of power in its full charge state and an open-circuit voltage Vo detected when the battery 1 is in a substantially full charge state.

Figure 11:
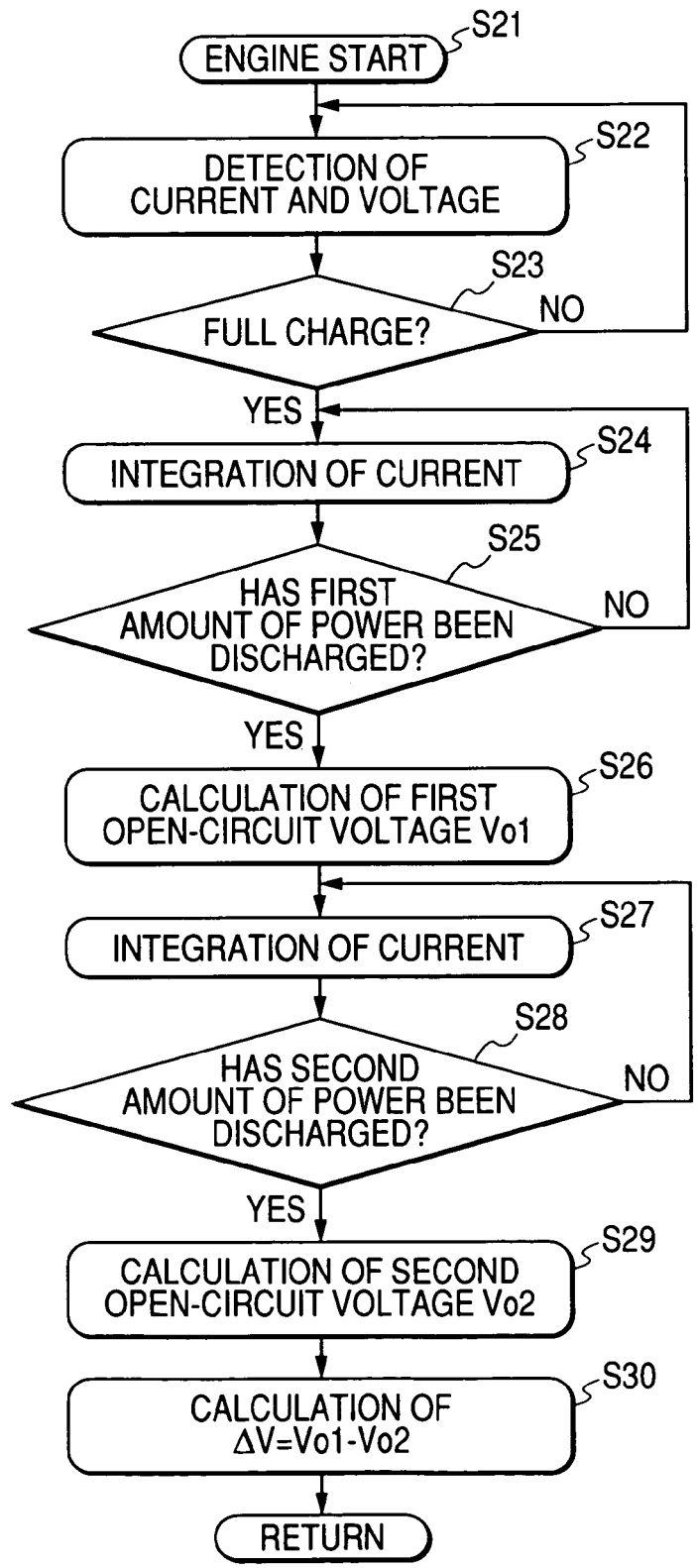
FIG. 11 is a flowchart explaining how to detect a difference in the first and second open-circuit voltages, which functions as calibration data.

The processing executed by the correcting signal generator 19 is shown in FIG. 11.

As shown in FIG. 11, in response to a start of the engine, the correcting signal generator 19 starts its calculation (step S21). After the start, the generator 19 detects the voltage V and the current I of the battery 1 at intervals (step S22), and then uses the detected voltage V and current I so that the detected values are subjected to a determination whether the battery 1 is in its full charge state (i.e., a full charge determination) (step S23). If it is determined that the battery 1 is in the full charge state, the generator starts integrating the current I to count an integrated current value (Ah) (step S24). Then, the generator 19 then determines whether or not the integrated current value (Ah) reaches a first predetermined threshold which is equivalent to a first discharge amount (step S25). In the present embodiment, the first predetermined threshold is set to a value of 100 to 95% of the initial SOC.

When the determination at step S25 is affirmative, that is, the integrated current value (Ah) reaches the first predetermined threshold, a first open-circuit voltage Vo1 to be detected in the almost full charge state is calculated by detecting a y-intercept value of an approximate expression LN obtained in the same way as the first embodiment (step S26). For example, the first predetermined discharge amount may be set to a value of zero. In this case, the open-circuit voltage Vo in the exact full charge state can be obtained.

After this detection, the integration of the current is started again (step S27) and it is determined whether or not the integrated current value reaches a second predetermined threshold which is equivalent to a second discharge amount (step S28). The second discharge amount is set to be larger than the first discharge amount. In the same way as explained, an approximate expression LN is estimated to calculate a second open-circuit voltage Vo2 (step S29). Finally a difference $\Delta V$ between the first and second open-circuit voltages Vo1 and Vo2 is calculated by performing Vo2-Vo1 (step S30).

(Test Results)

Figure 12:
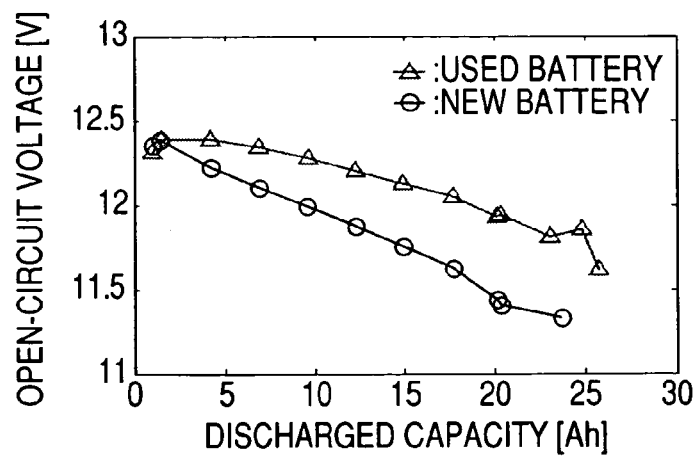
FIG. 12 is a graph showing the relationships between a discharge capacity and an open-circuit voltage of each of brand-new and degraded batteries to be tested in the second embodiment.

Using several batteries which are mutually different in their capacities and degraded degrees, a test was performed during an actual running on a running mode 10.15. In the test, the current I and terminal voltage V were measured to figure out input signals to the neural network calculator, and the calculator learned by using a true value of the SOC (calculated on the integrated current value) as a target output. FIG. 12 shows part of the discharge/open-circuit voltage characteristics of the batteries.

Figure 13:
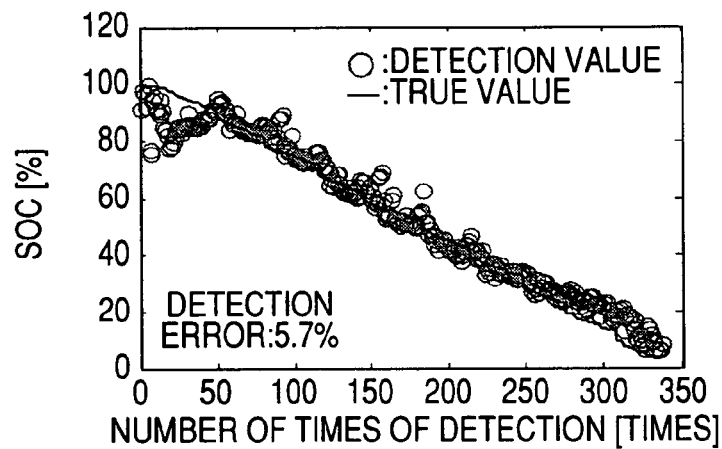
FIG. 13 is a graph showing test results for SOC detection with the use of a difference between the first and second open-circuit voltages, the difference being calibration data in the second embodiment.

In addition to voltage history data Vi, current history data Ii, a value of the internal resistance R of each battery, and values of the open-circuit voltages Vo1 and Vo2, a value of the voltage difference $\Delta V$ was used as the calibration data. The first discharge amount was 0.5 Ah and the second discharge amount was 5 Ah. The results of detection of SOCs are shown in FIG. 13. A difference between the SOC true values and the detected SOC values was estimated as a mean square error, with the result that the error was some 5.7%.

Figure 14:
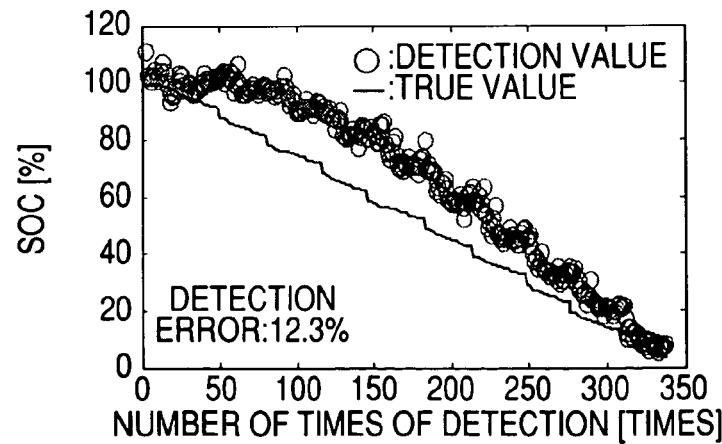
FIG. 14 is a graph showing test results for SOC detection with no use of the difference between the first and second open-circuit voltages, which is according to a configuration corresponding to the conventional.
Figure 15:
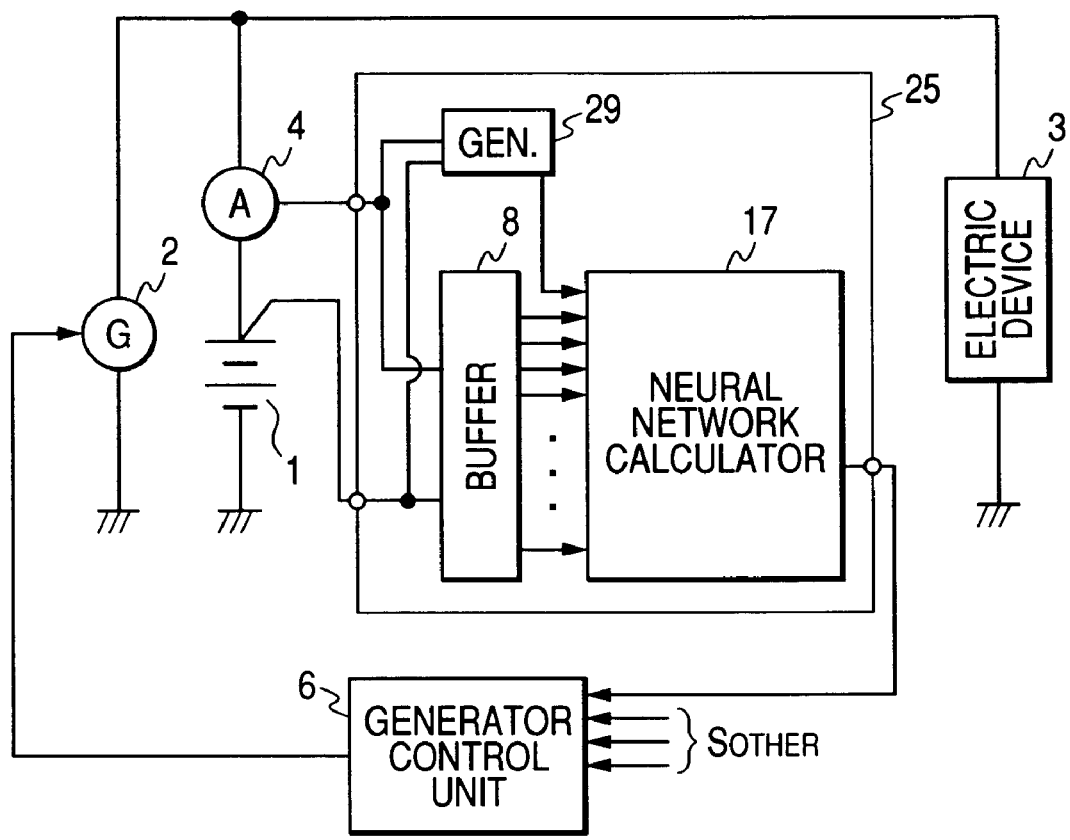
FIG. 15 is a block diagram showing the circuitry of an on-vehicle battery system adopted by a third embodiment according to the present invention.

For comparison, another test for detecting SOCs was conducted, of which test results are shown in FIG. 14, on the condition that the voltage difference $\Delta V$ serving as the calibration data (and thus, the open-circuit voltage Vo1 in discharging the first discharge amount) were not given to the neural network calculator 7. Because the correlation between the SOCs and the open-circuit voltages Vo differs depending on degraded degrees of a battery, a detection error was 12.3%. Accordingly, the above tests show that the detection error is improved from 12.3% to 5.7% thanks to the input of the voltage difference $\Delta V$ to the neural network calculator as the calibration data.

Third Embodiment

Referring to FIGS. 15 to 24, a third embodiment according to the on-vehicle battery system of the present invention will now be described.

The configurations and operations of the system in the third embodiment is essentially the same as those in the foregoing embodiments, but the correcting signal generator and neural network calculator are different in their configurations and operations from the foregoing.

The on-vehicle battery system according to the present embodiment is provided with a battery state detector 25 with a correcting signal generator 29 and a neural network calculator 17, instead of those shown in the foregoing.

The correcting signal generator 29 adopts, as calibration data, the internal resistance R of the battery 1 detected when a predetermined amount of power is discharged in the full charge state, in place of the open-circuit voltage detected in discharging a predetermined amount of power in the full charge state. On the other hand, the neural network calculator 17 has an output layer 203 outputting data indicative of an SOH (state of health) indicative of a residual capacity, instead of the SOC (state of charge).

As an alternative, the calibration data may be composed of data of both of the open-circuit voltage Vo and the internal resistance R which are detected when a predetermined amount of power is discharged in the full charge state.

Figure 16:
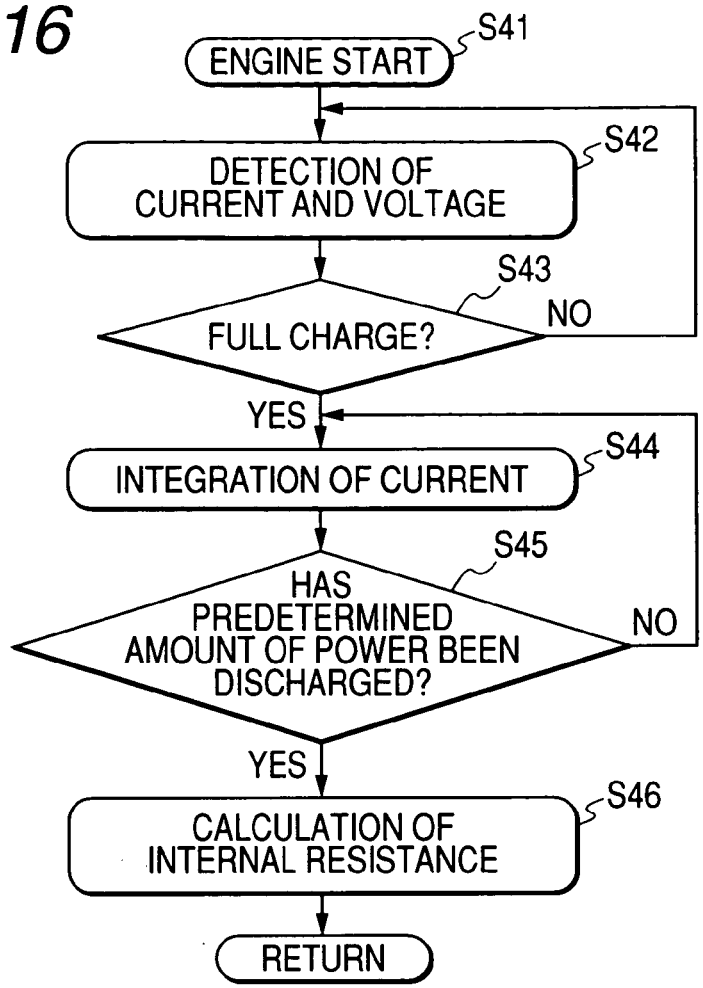
FIG. 16 is a flowchart explaining how to detect an internal resistance of a battery, which functions as calibration data.
Figure 17:
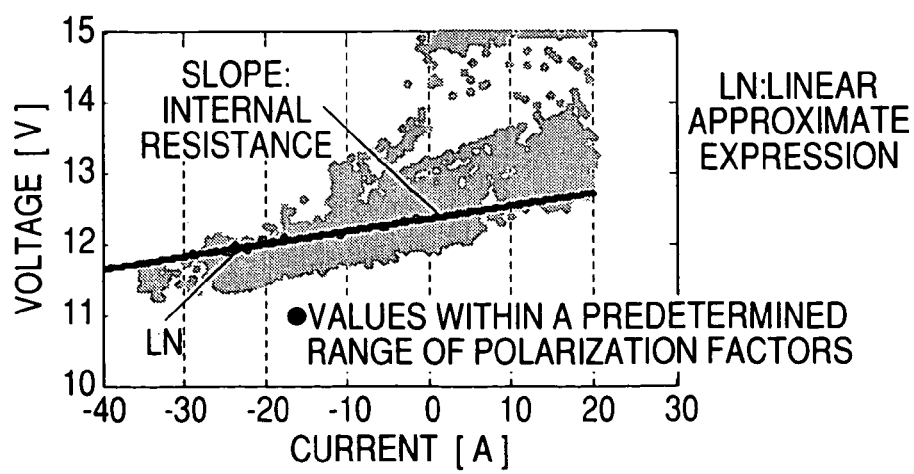
FIG. 17 is a two-dimensional map used for deciding a linear approximate expression to calculate the internal resistance of the battery.

FIG. 16 shows the processing executed by the correction signal generator 29.

In the correcting signal generator 29, the processing is started in response to the run of the vehicle (step S41), and the voltage V and current I are detected at intervals (step S42). Then, data of the detected voltage V and current I are used for determining the full charge state (step S43). When it is determined that the battery is in its full charge state, integrating data of the detected data is started to provide a current integrated amount (Ah) (step S44). It is then determined whether or not the current integrated amount reaches a predetermined amount of discharged power (in this embodiment, 5 A), which is a partial consumption of the fully charged power (step S45). If the determination is YES, that is, the current integrated amount reaches the predetermined amount of discharged power, an approximate expression LN is estimated in a similar manner to that descried so that a value of the internal resistance R is known from the slope of the expression LN (step S46).

In the above processing, the full charge state and the calculation of the internal resistance R are carried out in the same way as the foregoing. In other words, data of the detected voltage V and current I from the battery 1 are used to estimate a linearly approximate expression LN on the least-squares method and the slope of the expression LN is calculated as being a quantity showing the internal resistance R, as exemplified in FIG. 17.

Figure 18:
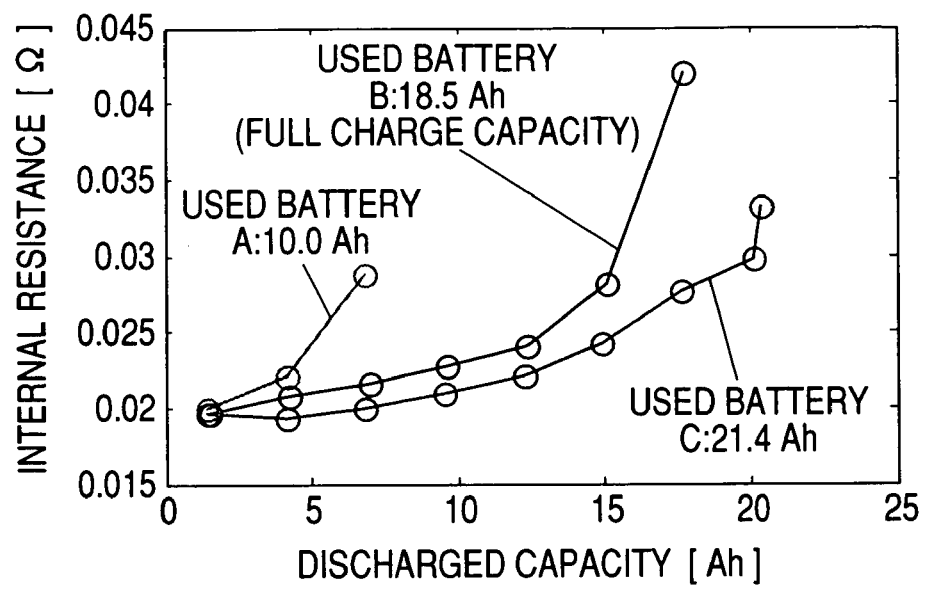
FIG. 18 is a graph for explaining the relationship between an internal resistance and a discharge capacity of each of used batteries to be tested.

For reference, a relationship between the internal resistance R and an amount of discharged power is shown in FIG. 18 as to some types of used batteries. From FIG. 18, it is revealed that, though an amount of the fully charged power depends on the used batteries, all the used batteries have values which are almost the same at their full charge amounts or thereabouts (that is, in a small range beginning from a discharged amount of 0 Ah). Hence it is difficult to use the internal resistance values R within such a range as indications presenting the degradations. In contrast, as the discharge amount increases, differences among the internal resistance values R are made distinctively larger. Accordingly, data of the internal resistance R can be adopted as an input signal, as long as the internal resistance R is estimated after a predetermined amount of power has been discharged from a full charged state (i.e., estimated after a considerable amount of power has been discharged). Such internal resistance values R are thus able to work as distinctive indications for the degradations of batteries, whereby the residual capacity of a battery can be detected with precision.

(Test Results)

Similarly to the foregoing embodiments, tests for verifying the structure realized by the present embodiment were also carried out. Practically, some batteries for learning, which are mutually different in their capacities and degraded degrees, were subjected to the tests under the 10.15 running mode, during which time the current I and terminal voltage V of each battery were measured. Using the measured data, input signals to the neural network calculator were calculated and learning was performed based on the residual capacity serving as a target output. The input signals were voltage history data Vi, current history data Ii, a present value of the internal resistance R (i.e., the slope of an approximate expression LN) figured out using the least-squares method, a present value of the open-circuit voltage Vo (i.e., a y-intercept of the approximate expression LN), and a value of the internal resistance R obtained when a predetermined amount of power had been discharged from the fully charged power.

Figure 19:
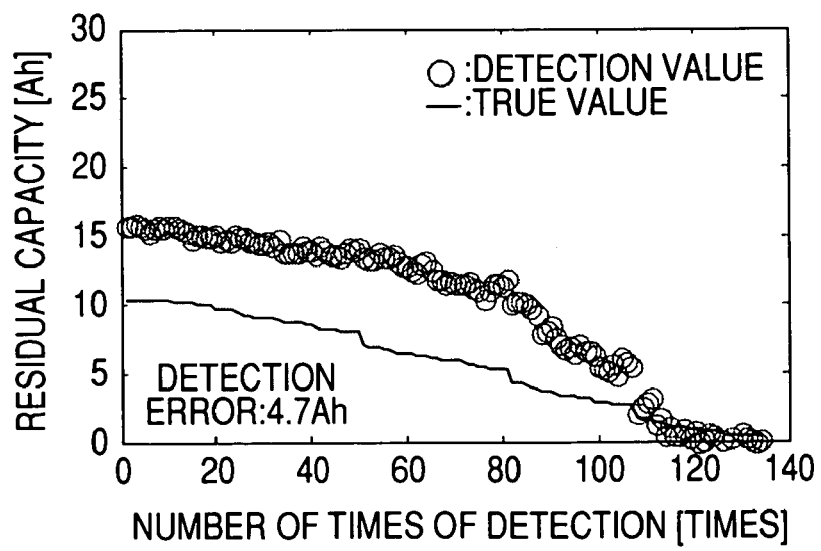
FIG. 19 is a graph showing test results for SOH detection with no use of the internal resistance of a battery, which is according to a configuration corresponding to the conventional.
Figure 20:
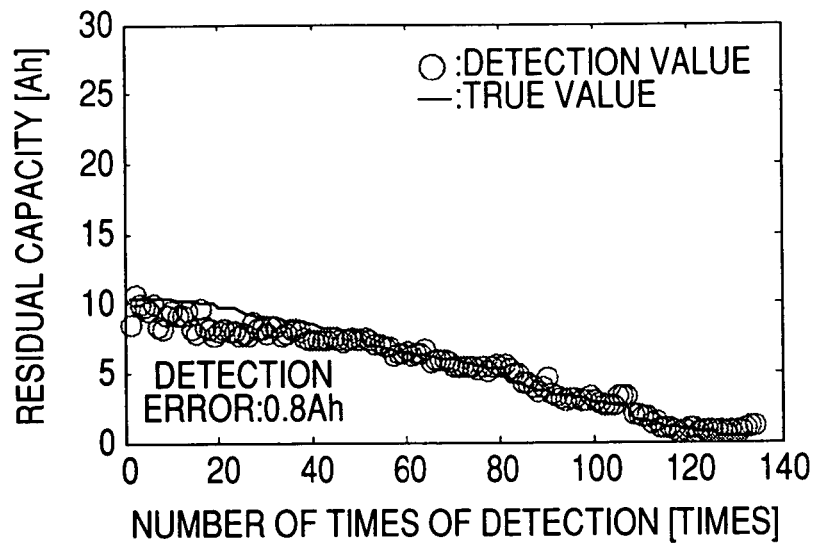
FIG. 20 is a graph showing test results for SOH detection with the use of the internal resistance of a battery, which is according to the third embodiment.

Aside from the batteries for learning, other performance-degraded batteries (having full charge capacities of 10.5 Ah and 27 Ah) were subjected to neural network calculation to estimate an SOH by using the input signals detected during running on the 10.15 mode. The detected results are shown in FIGS. 19 and 20, wherein the results in FIG. 20 were obtained by using an internal resistance value R gained when an amount of 5 Ah was discharged from the fully charged power and those in FIG. 19 were obtained without using such an internal resistance value.

Evaluation on the precision of detection was made as a mean square error between true values and detected values in the above two tested examples. It was revealed that the precision of detection was improved from 4.7 Ah to 0.8 Ah to a large extent by employing the internal resistance value R gained when a power 5 Ah was discharged.

There is provided a modification which can be employed in the foregoing embodiments, which relates to the sampling timing in the buffer 6. In the foregoing embodiments, the sampling for the voltage and current history Vi and Ii was made at intervals, but this is not a definitive list. Instead, it is enough to perform sampling, whenever voltage and current changes by a predetermined value.

Fourth Embodiment

Referring to FIGS. 25 to 32, a fourth embodiment according to the on-vehicle battery system of the present invention will now be described.

The on-vehicle battery system according to the present embodiment is characteristic of performing neutral network calculation to detect information indicative of the SOC (state of charge) and SOH (state of health) by using, as calibration data, both of the open-circuit voltage Vo of a battery 1, which is obtained in response to discharging a predetermined amount of power from the battery 1 which is in full charge, and the internal resistance Ro of the battery 1.

Figure 25:
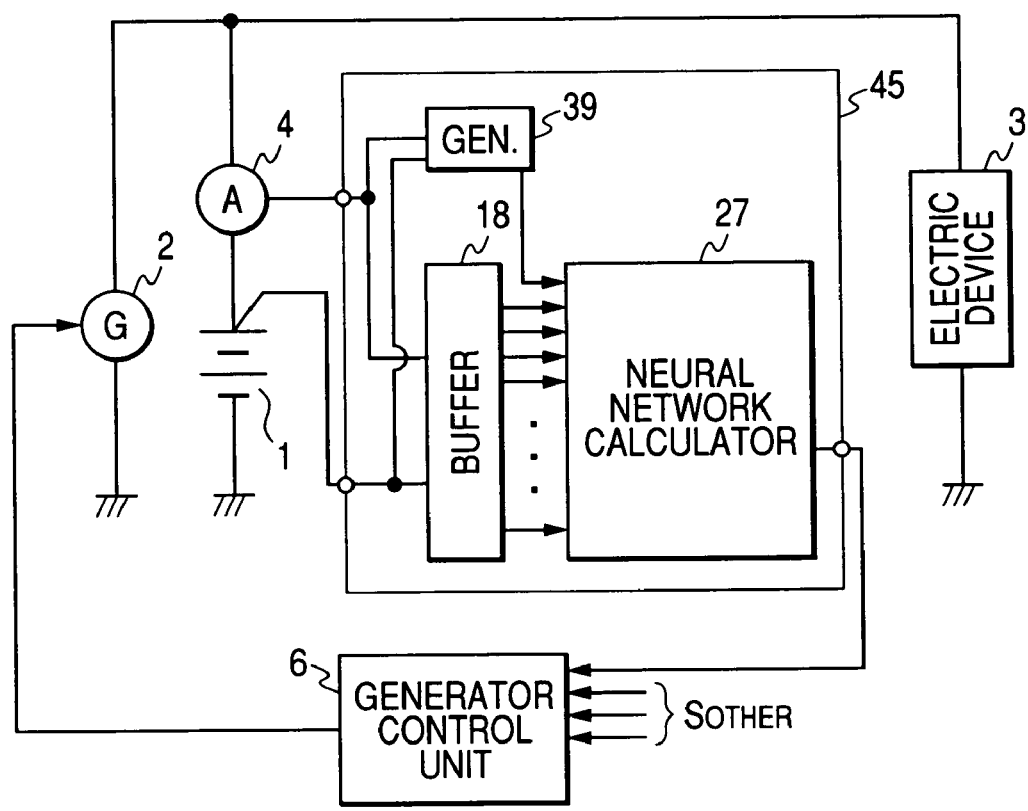
FIG. 25 is a block diagram showing the circuitry of an on-vehicle battery system adopted by a fourth embodiment according to the present invention.
Figure 26:
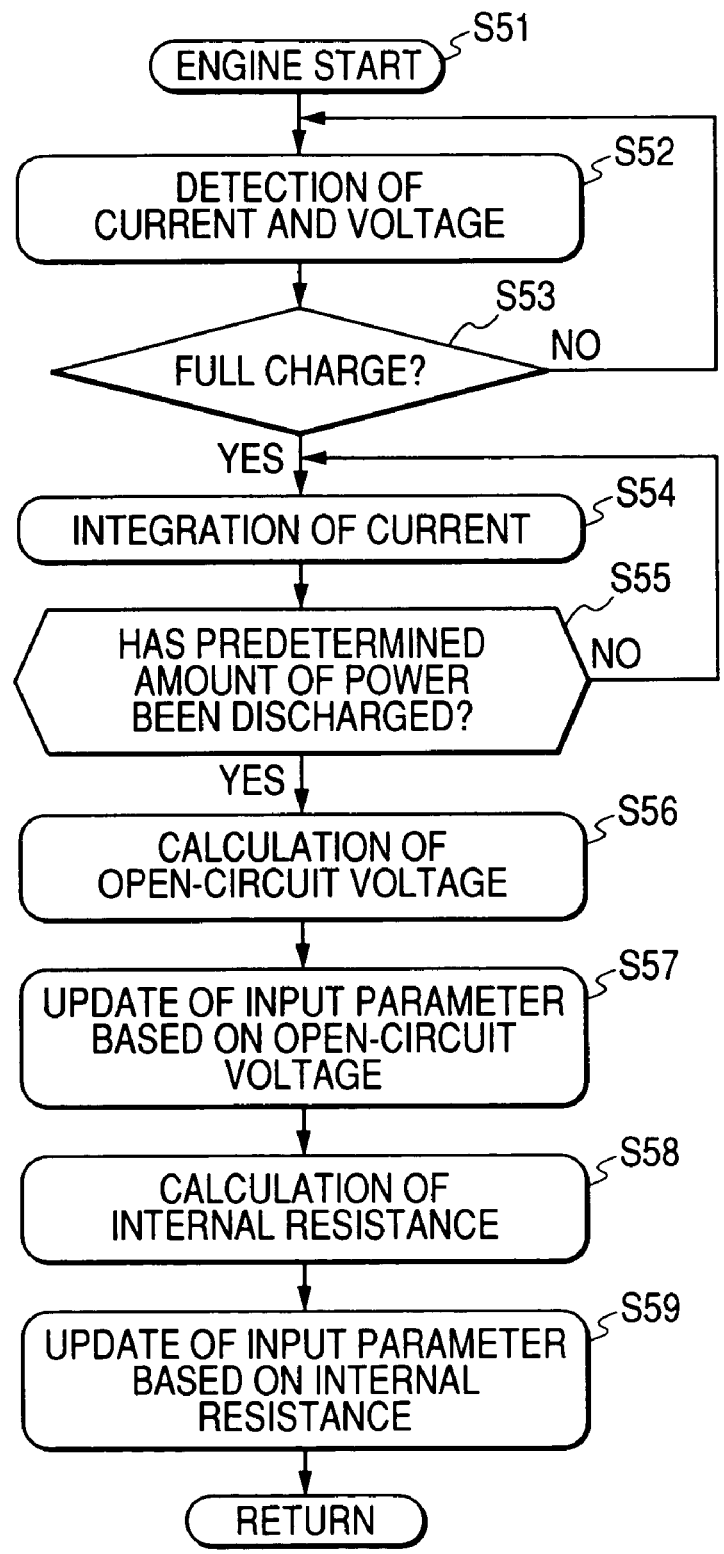
FIG. 26 is a flowchart showing how to calculate an open-circuit voltage and an internal resistance of an on-vehicle battery detected in response to discharging a predetermined amount of power from a battery which has been fully charged while the vehicle is running.

For this characteristic, the on-vehicle battery system is provided with a battery state detector 35 with a buffer 18, a neural network calculator 27, and a correcting signal generator 39, as shown in FIG. 25.

Like the first embodiment, the buffer 18 performs the pre-processing of the voltage and current history data Vi and Ii. Additionally, the buffer 18 applies the least-squares method to those voltage and current history data Vi and Ii to create, by a known technique, an approximate expression LN in which the relationship between the voltage and current data V and I is reflected (refer to FIG. 4). Using this approximate expression LN, the buffer 8 calculates a value of the y-intercept (i.e., an open-circuit voltage) of the approximate expression LN whenever the voltage and current data V and I are read in so that a present value of the open-circuit voltage Vo of the battery 1 is obtained. This present value of the open-circuit voltage Vo, which functions as data mutually relating the voltage and current history data Vi and Ii is given to the neural network calculator 7.

The correcting signal generator 39 is configured to calculate values of the above open-circuit voltage Vo and the internal resistance R and provide data of those values to the neural network calculator 27 as calibration data. How to calculate those values will now be described with reference to FIG. 26.

In response to a start of the engine, the correcting signal generator 39 starts its calculation (step S51). After the start, the generator 39 detects the voltage V and the current I of the battery 1 at intervals (step S52), and then uses the detected voltage V and current I so that the detected values are subjected to a determination whether or not the battery 1 is in its full charge state (step S53). The generator 39 then commands to start current integration and determines whether or not an integrated current value (Ah) reaches a predetermined discharge amount (steps S54 and S55).

If this determination reveals that the integrated current value has reached this predetermined discharge amount, a value of the open-circuit voltage Vo, which is obtained when such a determination is made, is calculated as an open-circuit voltage value Vo to be detected when a predetermined amount of power is discharged (step S56). The open-circuit voltage Vo which has been memorized so far is updated to this calculated value (step S57).

In addition, in response to the calculation of the open-circuit voltage Vo, as described, a value of the internal resistance R of the battery 1 is calculated by estimating the slope of the approximate expression LN, as already described (step S58), and the memorized internal resistance R which has been memorized so far is updated to this calculated value (step S59).

Figure 27:
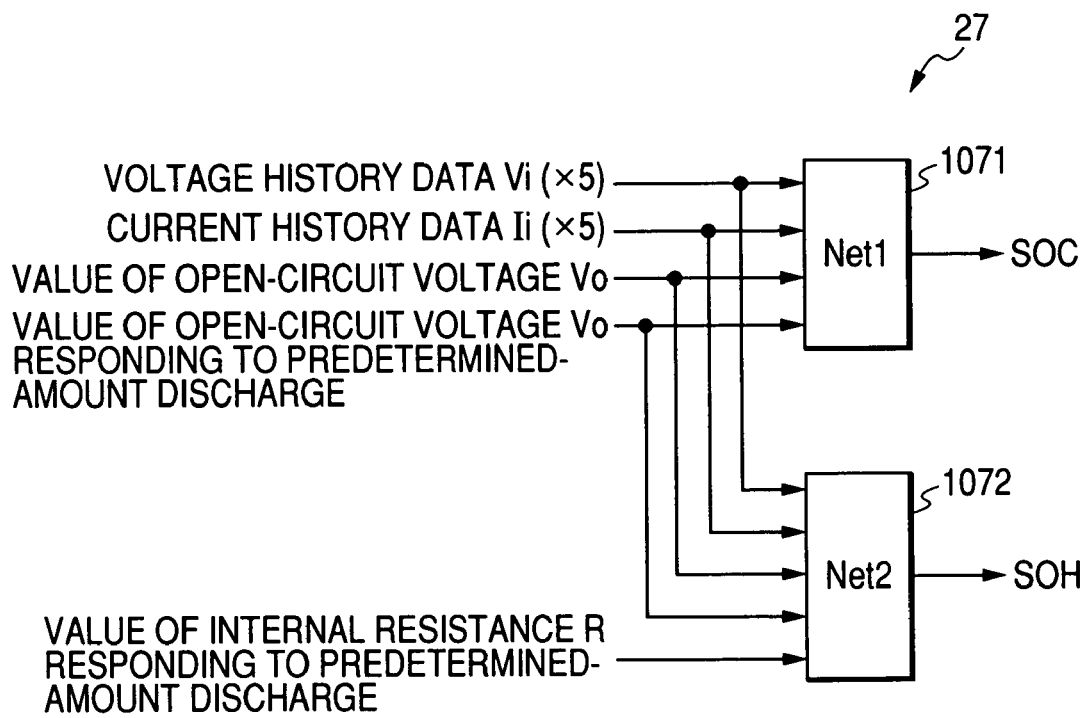
FIG. 27 is a block diagram showing the functional configuration of a neural network calculator installed in the apparatus.

The neural network calculator 27 is functionally provided with, as shown in FIG. 27, a first neural network block 1071 for calculating an SOC (state of charge) and a second neural network block 1072 for calculating an SOH (state of health). Practically, these neural network blocks 1071 and 1072 are functionally realized by two sets of processes, in which, for instance, each step is executed set by set at predetermined intervals. More practically, a microcomputer system with a CPU and memories can be used for the neural network calculator 27. Data of the processing, which describe the two sets of processes, are previously stored in a memory and the CPU is capable of performing processing on the described processes.

Figure 28:
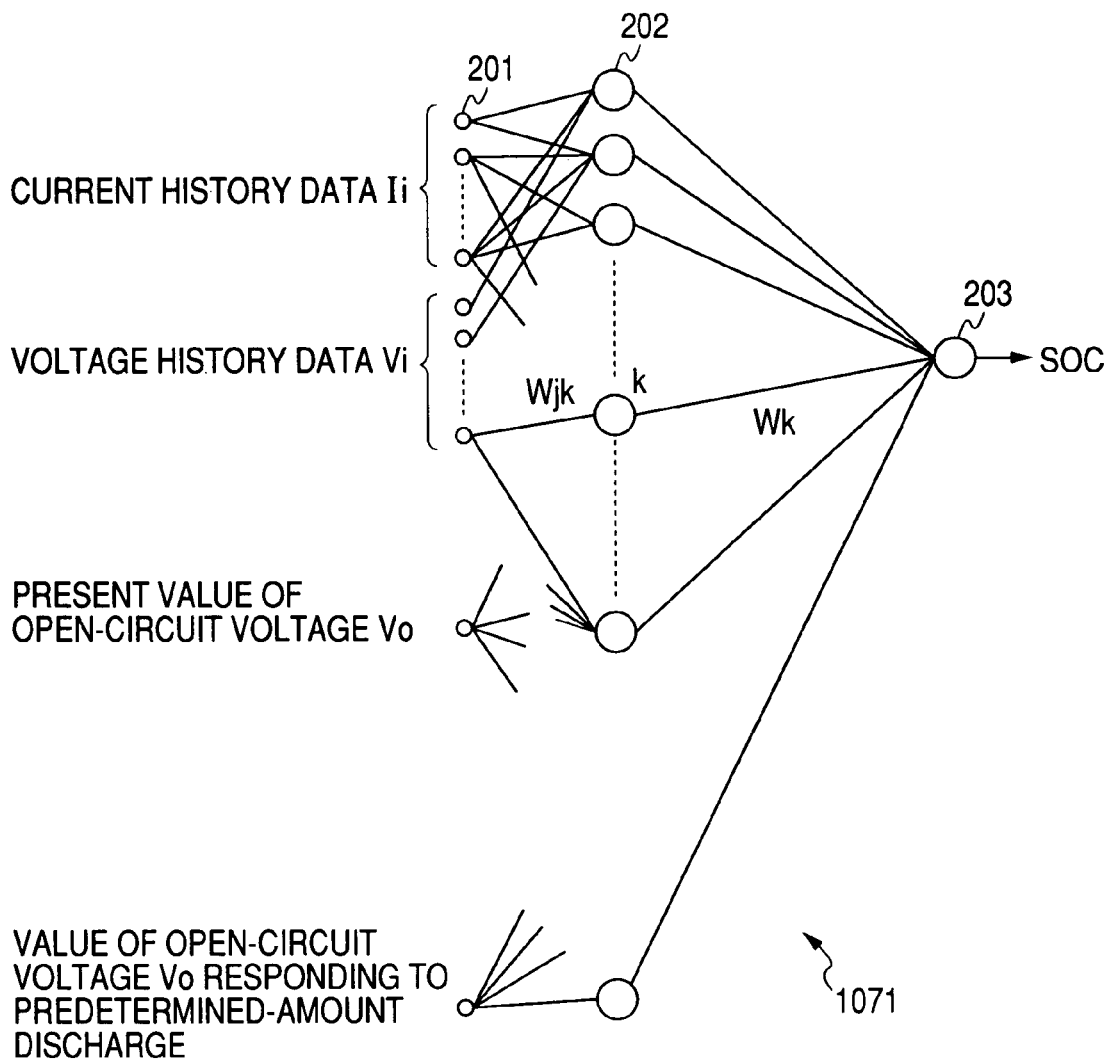
FIG. 28 is a functional block diagram explaining the functional configuration of a first neural network block of the neutral network calculator.
Figure 29:
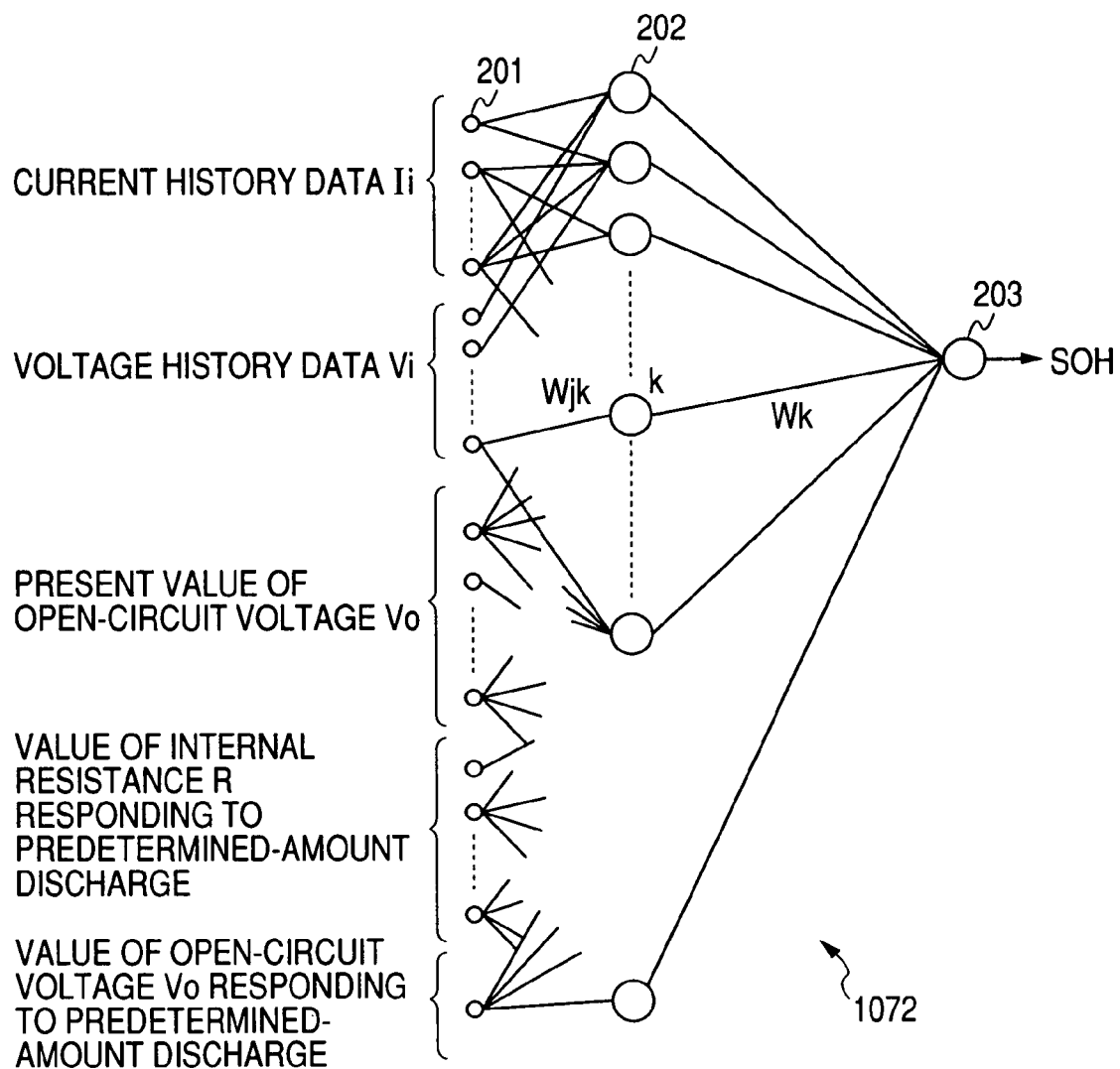
FIG. 29 is a functional block diagram explaining the functional configuration of a second neural network block of the neutral network calculator.

The first neural network block 1071 for the SOC is functionally depicted in FIG. 28, while the second one 1072 for the SOH is functionally depicted in FIG. 29. A difference between the two blocks 1071 and 1072 lies in a configuration in which the input signals (parameters) to the first block 1071 for the SOC does not include a signal of the internal resistance R, but the second block 1072 for the SOH includes the signal of the internal resistance R. Except for the use or non-use of the internal resistance R, both the blocks 1071 and 1072 are the same in their constructions. Thus the first block 1071 will now be described as being representative of the first and second blocks 1072 and 1072.

The first neural network block 1071 for the SOC, which is shown in FIG. 28, like the foregoing one, is formed into a three-hierarchical feed-forward type of calculator which learns on a back-propagation technique. This is just one example, however, and any neural network type, if selected properly, can be applied to this block 1071. This block 1071 has an input layer 201 with a predetermined number of input cells.

The respective input cells not only receive, as input data (signals), voltage history data Vi, current history data Ii, and present values of the open-circuit voltage Vo and internal resistance R from the buffer 8 but also receive, as calibration data, a value of the open-circuit voltage Vo obtained when the predetermined amount of power is discharged, from the correcting signal generator 39. And the respective input cells hand the received data to all calculation cells belonging to the intermediate layer 202.

The calculation cells in the intermediate layer 202 are in charge of applying neural network calculation to the data to be inputted from the input cells in the input layer 201 and providing resultant calculation results to output cells in the output layer 203. Since the calculation is directed to an SOC, so that the output cells in the output layer 203 produce as output data showing the SOC.

How the first neural network block 1071 works to learn is the same as that described in connection with the expressions (1) to (9) and FIG. 6.

(Test Results)

Figure 30:
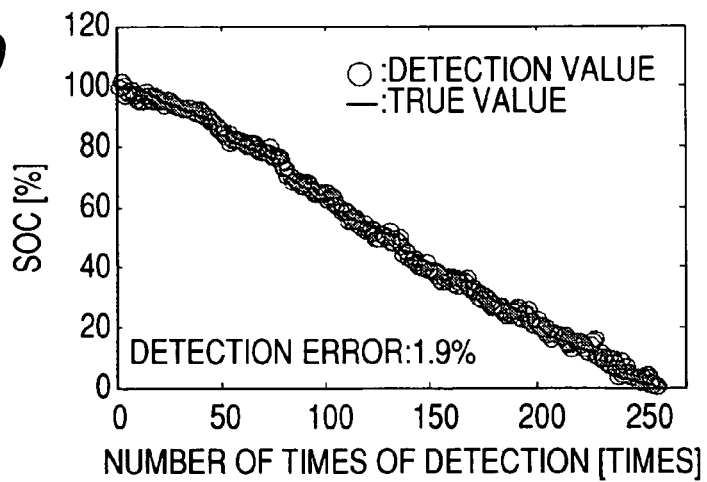
FIG. 30 is a graph showing results of tests for an SOC calculated based on the configuration provided by the fourth embodiment.

A first neural network calculator (i.e., SOC-dedicated calculator) which has learned some charge/discharge patterns (10.15 mode) of some batteries including used batteries was prepared. Another charge/discharge pattern (10.15 mode) for a further used battery was inputted to this calculator, with the neural network calculation performed on the pattern so that an SOC (i.e., charged rate of a battery) was obtained. The results are shown in FIG. 30.

Conditions of this test are as follows. The input signals to the first neural network calculator are signals showing voltage history data Vi and current history data Ii, and a present value of the open-circuit voltage Vo (i.e., a present value provided by the y-intercept of a least-square approximate expression LN). The calibration data was an open-circuit voltage Vo detected in response to discharge of a predetermined amount (0.5 Ah) from the full charge. This test showed a detection error of 1.9%, which gives a large improvement to the neural network calculation.

Figure 31:
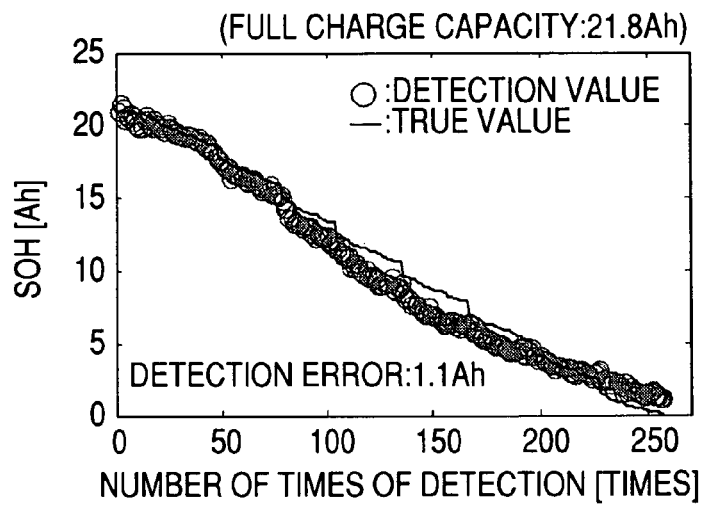
FIG. 31 is a graph showing results of tests for an SOH (state of health) calculated based on the configuration provided by the fourth embodiment.

A second neural network calculator (i.e., SOH-dedicated calculator) which has learned some charge/discharge patterns (10.15 mode) of the group of batteries used in the above test was prepared. Another charge/discharge pattern (10.15 mode) for the further used battery which is used in the above test was inputted to this calculator, with the neural network calculation performed on the pattern so that an SOH indicating a residual capacity was obtained. The results are shown in FIG. 31.

Test conditions are as follows. The input signals to the second neural network calculator are signals showing voltage history data Vi and current history data Ii, a present value of the open-circuit voltage Vo (i.e., a present value provided by the y-intercept of a least-square approximate expression LN), and a present value of the internal resistance R (i.e., the slope of the least-square approximate expression LN). The calibration data were an open-circuit voltage Vo detected in response to a discharge of a predetermined amount of power (e.g., 0.5 Ah) from the full charge and an internal resistance detected R in response to the same discharge. This test showed that a detection error for the SOH was 1.1 Ah, which is largely improved.

Figure 32:
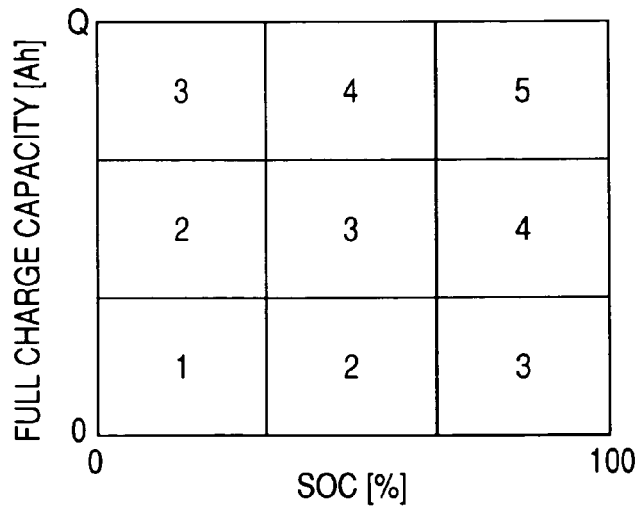
FIG. 32 shows a reference map used to classify the degradation degrees of batteries.

The values of the SOC and SOH calculated above can be classified using a map, which is for example shown in FIG. 32 (in the case of the SOC), and information showing the degrees of degradation can be provided. The degradation degree map shown in FIG. 32 is previously produced and memorized in a memory implemented in the renewal network calculator. The exemplified map in FIG. 32 has 12 sections (steps) depending on amounts of the SOC and the full charge capacity Q, so that calculated SOC data are made reference to the degradation degrees of 12 steps to decide into which step the calculated data falls.

(Modifications)

Some modifications of the fourth embodiment can be provided as follows.

A first modification relates to calculation of the degradation degrees of batteries. The degradation degree of a battery can be obtained by calculating "a present value of SOH/(a present value of SOC X $Q_{initial}$)," wherein $Q_{initial}$ represents an initial full charge capacity of a battery to be tested, which is previously tested and memorized as initial data. This kind of calculation can be done by a different calculator communicably connected to the neural network calculator 27 or the calculator 27 itself, whereby the degrees of degradation of each battery can be provided with precision SOC by SOC or SOH by SOH.

Figure 33:
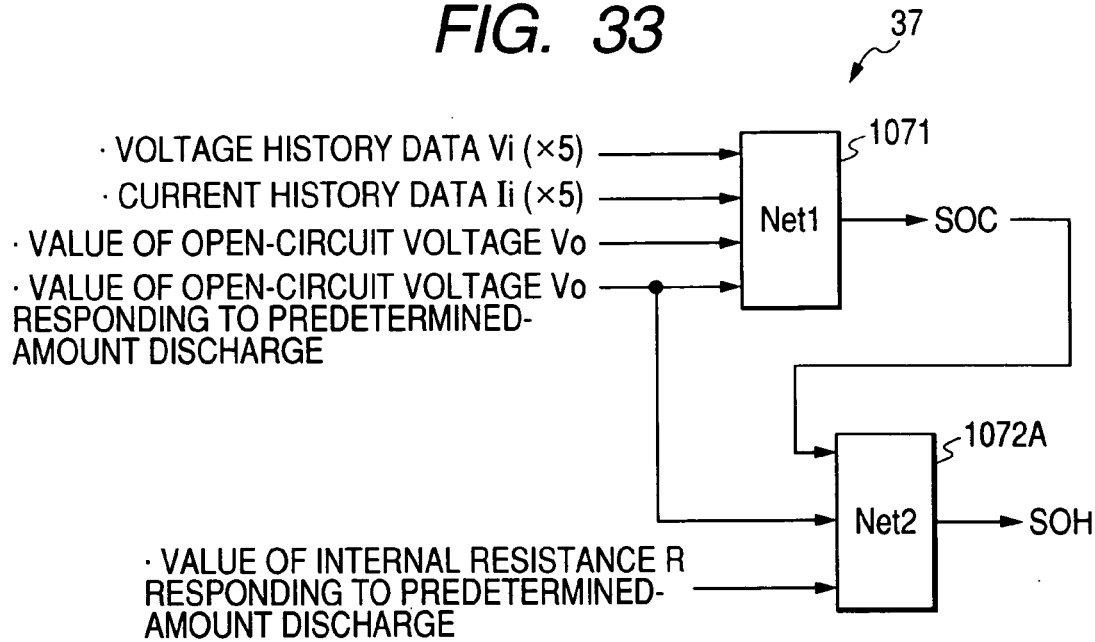
FIG. 33 is a functional block diagram explaining the functional configuration of a modification of the neutral network calculator according to the fourth embodiment.

A second modification is shown in FIG. 33, which is concerned with another form of the neural network calculator. A neural network calculator 37 functionally shown in FIG. 33 is configured to have a first neural network block 1071 and a second neural network block 1072A. Of these blocks, the first neural network block 1071 is the same in configuration as those in FIG. 27, while the second neural network block 1072A receives, as input data, data of the SOC calculated similarly to that in the fourth embodiment, the open-circuit voltage Vo detected in response to a discharge of a predetermined amount, and the internal resistance R detected in response to the discharge. Hence, the second neural network block 1072A is able to calculate a value of the SOH through learning. Accordingly, the SOH can be calculated at a detection precision which is almost the same as the SOC calculated in the fourth embodiment.

Figure 34:
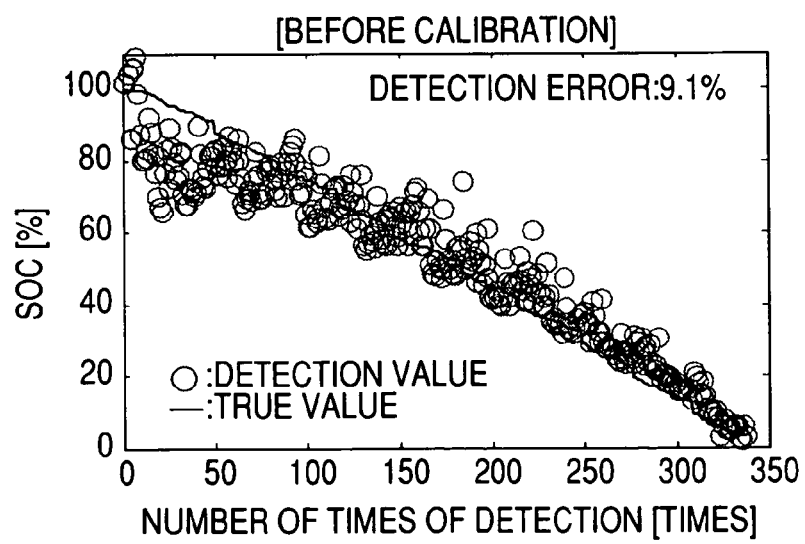
FIG. 34 is a graph showing the results of tests for an SOC executed without using calibration data in a conventional form of the neural network calculator, which was executed for comparison with the configuration of a further modification according to the fourth embodiment.
Figure 35:
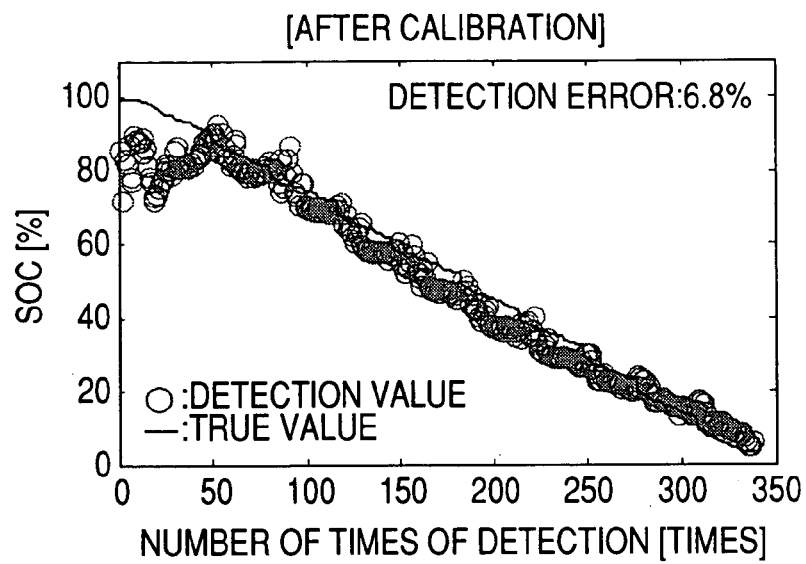
FIG. 35 is a graph showing the results of tests for an SOC executed with the use of calibration data, which was according to the further modification of the fourth embodiment.

A third modification is how to supply the input and calibration data. In the configuration of the neural network calculation 27 shown in FIG. 29, the input signals may be limited to only data of the voltage history Vi and the current history Ii and data of the open-circuit voltage Vo and internal resistance R gained when a predetermined amount of power is discharged may be used as calibration data. To verify effects of this modified configuration, comparative tests were conducted on SOC detection errors of further used batteries using two configurations; one was conducted with the use of the above input signals but with no use of the calibration data, while the other was conducted with the use of both the above input signals and the calibration data. The test results are shown in FIGS. 34 and 35. FIG. 34 shows the case with no calibration data used, in which the SOC detection error was as much as 9.1%, while FIG. 35 shows the case with the calibration data used, in which the SOC detection error dropped down to 6.8%, which is a large decrease.

Fifth Embodiment

Referring to FIGS. 36 to 39, a fifth embodiment according to the on-vehicle battery system of the present invention will now be described.

The on-vehicle battery system according to the present embodiment is characteristic of performing neutral network calculation to estimate the full charge capacity of a battery 1 by using, as calibration data (part of input signals), both of the open-circuit voltage Vo and internal resistance R of the battery 1, which are obtained when a predetermined amount of power is discharged from the fully charged power.

Figure 36:
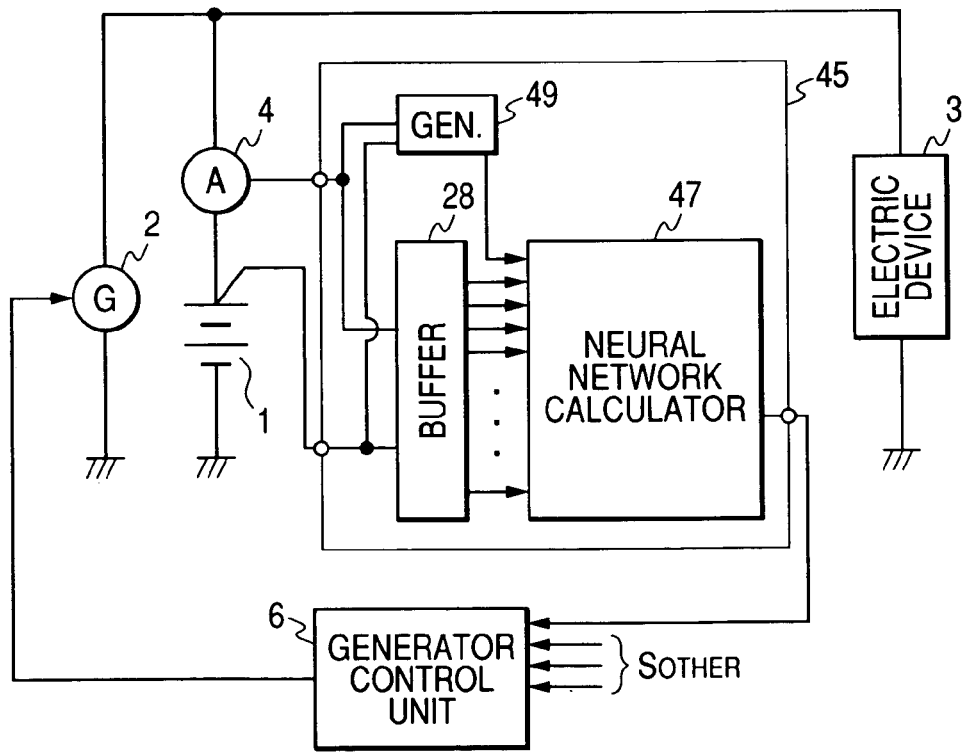
FIG. 36 is a block diagram showing the circuitry of an on-vehicle battery system adopted by a fifth embodiment according to the present invention.

For this characteristic, the on-vehicle battery system is provided with a battery state detector 45 with a buffer 28, a neural network calculator 47, and a correcting signal generator 49, as shown in FIG. 36. The battery state detector 45 can be formed, as a whole or in part, into a microcomputer with a CPU, memories and other necessary parts, not limited to circuitry on digital logic circuits and/or analog circuits. The circuitry shown in FIG. 36 is just an illustrative example.

Of these, the neural network calculator 47 is configured to receive various input signals from the buffer 28 and correcting signal generator 49 and applies neural network calculation to the those input signals to estimate, as its output parameter, data indicative of to a full charge capacity Q to be expected of the battery 1. The correcting signal generator 49 is configured to calculate, as calibration data, an open-circuit voltage Vo and an internal resistance R of the battery 1 which are obtained in response to discharging a predetermined amount of power from the battery 1 having the fully charged power. If this generator 49 is functionally realized by a microcomputer system, a CPU will calculate the open-circuit voltage Vo and internal resistance R from a group of voltage and current pairs V and I held in a RAM or registers.

Further, the buffer 28 is formed to be engaged exclusively in the processing of voltage and current data V and I to be received, including parallel sampling of those two types of data at intervals to form voltage and current history data Vi and Ii, storage thereof, and parallel output of the voltage and current data V and I at each sampling time to the neural network calculator 47.

Figure 37:
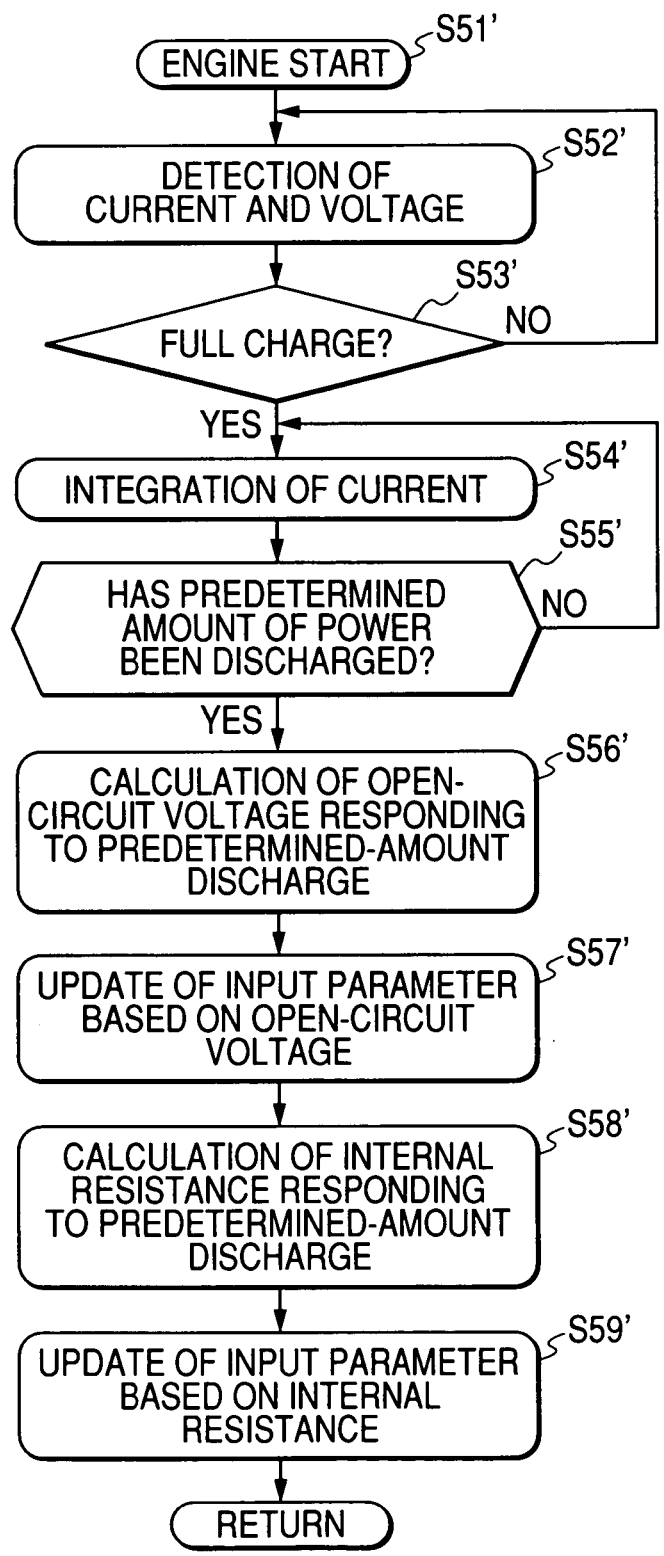
FIG. 37 is a flowchart showing how to calculate an open-circuit voltage and an internal resistance of an on-vehicle battery responsively to a discharge of a predetermined amount of power from a battery which has been fully charged.

The correcting signal generator 49 is configured such that it calculates the open-circuit voltage Vo and internal resistance R of the battery 1 detected in response to discharging an amount of power from the battery 1 having a fully charged power. Data showing values of those open-circuit voltage Vo and internal resistance R are supplied to the neural network calculator 47 as calibration data. The processing for this data supply is shown in FIG. 37, which is similar in contents to those in FIG. 26.

To be specific, in response to a start of the engine, the correcting signal generator 49 starts its calculation (step S51'). After the start, the generator 49 detects the voltage V and the current I of the battery 1 at intervals (step S52'), and then uses the detected voltage V and current I so that the detected values are subjected to a determination whether or not the battery 1 is in its full charge state (step S53'). The generator 39 then commands the start of current integration and determines whether or not an integrated current value (Ah) reaches a predetermined discharge amount (steps S54' and S55').

If this determination reveals that the integrated current value has reached this predetermined discharge amount, a value of the open-circuit voltage, which is obtained when such a determination is made, is calculated as an open-circuit voltage value Vo to be detected when a predetermined amount of power is discharged (step S56'). The open-circuit voltage which has been stored so far is updated to this new calculated value (step S57').

In addition, in response to the calculation of the open-circuit voltage, as described, a value of the internal resistance R of the battery 1 is calculated by estimating the slope of the approximate expression LN, as already described (step S58'), and the internal resistance R which has been stored so far is also updated to this new calculated value (step S59').

Figure 38:
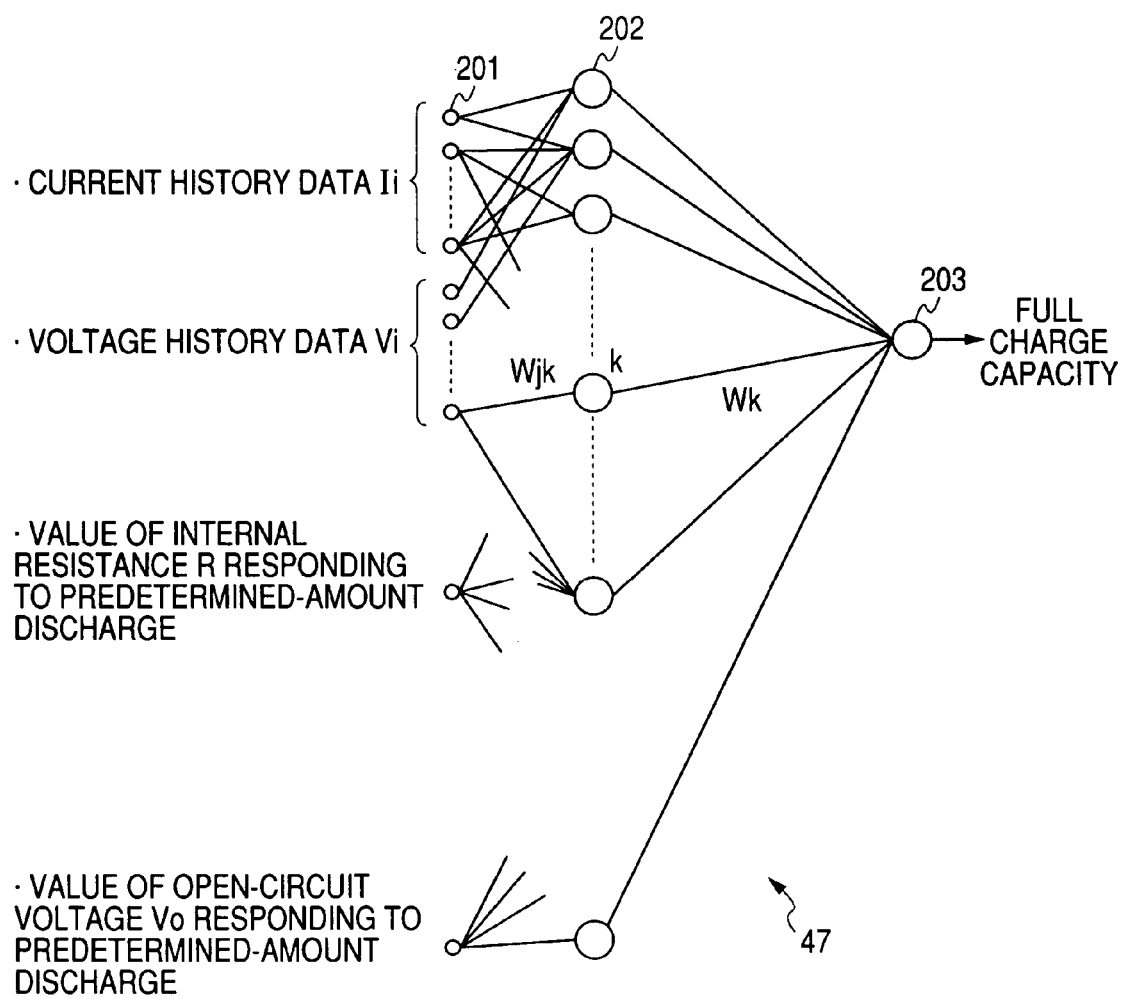
FIG. 38 is a functional block diagram explaining the functional configuration of a neutral network calculator in the on-vehicle battery system according to the fifth embodiment.

As shown in FIG. 38, the neural network calculator 47 has an input layer 201 with input cells 201, intermediate layer 202 with calculation cells, and output layer 203 with an output cell. The input cells of the input layer 201 receive, from the buffer 28, as input signals, both the voltage history data Vi and the current history data Ii and also receives, from the correcting signal generator 49, as calibration data, the data of the open-circuit voltage Vo and the internal resistance R both responding to a discharge of a predetermined amount of power. The received data by the input cells are handed, respectively, to the calculation cells of the intermediate layer 202.

The respective cells perform predetermined neural network calculation on the input data handed from the input cells so that a full charge capacity Q to be expected currently of the battery 1 is estimated. Data indicating the estimated full charge capacity is given to the output cells to be provided to, for example, the generator control unit 6 from the output layer 203.

Detailed learning processing executed by the neural network calculator 47 is the same as that explained in the first embodiment (refer to FIG. 6) except that an output OUT(t) to be finally calculated as an output parameter, which is a function of time t, is a full charge capacity Q of the battery 1.

In the processing in FIG. 37, in cases where it is determined that the full charge has not been realized yet or it is determined that the open-circuit voltage Vo in response to discharging a predetermined amount of power has not been found yet, the previously-obtained value is kept as the open-circuit voltage Vo.

Furthermore, in cases where the open-open circuit voltage Vo and internal resistance R in such a power discharge are changed, the changed values are updated as new ones and kept, whereby the full charge capacity Q can be detected with precision depending on degrees of degradation of a battery.

As a modification, there is provided means for calculating a degree of degradation of the battery 1, which can be functionally established by either the neutral network calculator 47 or the generator control unit 6, shown in FIG. 36. For example, such a unit performs a calculation based on an expression of:

$$DD = Q_{present}/Q_{initial},$$

wherein DD denotes a degree of degradation of the battery 1, $Q_{present}$ denotes a present value of the full charge capacity estimated by or in the neural network calculator 47, and $Q_{initial}$ denotes an initial value of the full charge capacity previously given to the system. This calculating function is helpful for checking degraded states of each battery and determining timing of exchanges of on-vehicle batteries.

(Test Results)

Several batteries to be tested were subjected to tests using a neural network calculator according to the present embodiment. The test results are as follows.

As test pieces, nine on-vehicle lead batteries were employed, which each have an initial full charge capacity of 27 Ah and whose degraded states were different from each other. The full charge capacity of each battery at present was measured in the form of a current-integrated value obtained by integrating current to be detected on condition that a discharge was conducted until the terminal voltage decreased from the value corresponding to the full charge state down to 10.5 V under a discharge condition of 0.2 CA. These batteries which have been discharged under the above conditions were connected to the on-vehicle neural network calculator and its vehicle was made run under a 10.15 running mode, in which the neural network calculation was executed to estimate the full charge capacity Q. In addition, a predetermined amount of power to detect the open-circuit voltage Vo and internal resistance R was 5.0 Ah, which was consumed from the fully charged state. Data of the voltage and current history Vi and Ii were five pairs of voltage and current sampled at intervals during a predetermined period of time just before the neural network calculation. In the running, after determining the full charge, an error detecting the full charge capacity for each battery was estimated using data acquired during a period of time lapsing from completion of a discharge of 5.0 Ah to the end of the running. The errors were expressed as mean values and are shown as in Table 1.

TABLE 1

| Test piece No. 1 | full charge capacity | 18.2 Ah |
|---|---|---|
| | detection error | 2.3 Ah |
| Test piece No. 2 | full charge capacity | 21.8 Ah |
| | detection error | 0.6 Ah |
| Test piece No. 3 | full charge capacity | 10.5 Ah |
| | detection error | 0.6 Ah |

TABLE 1-continued

| Test piece No. 4 | full charge capacity | 10.0 Ah |
|---|---|---|
| | detection error | 0.1 Ah |
| Test piece No. 5 | full charge capacity | 18.3 Ah |
| | detection error | 2.1 Ah |
| Test piece No. 6 | full charge capacity | 21.2 Ah |
| | detection error | 1.2 Ah |
| Test piece No. 7 | full charge capacity | 24.3 Ah |
| | detection error | 3.4 Ah |
| Test piece No. 8 | full charge capacity | 27.6 Ah |
| | detection error | 0.2 Ah |
| Test piece No. 9 | full charge capacity | 25.1 Ah |
| | detection error | 3.3 Ah |

Comparative tests were also conducted on condition that the voltage and current history data Vi and Ii were adopted as the input parameters but no calibration data (i.e., the foregoing open-circuit voltage Vo and internal resistance R) were adopted. Under the other test conditions which were the same as the foregoing, the comparative tests were conducted and the test results are summarizes in Table 2.

TABLE 2

| Test piece No. 1 | full charge capacity | 18.2 Ah |
|---|---|---|
| | detection error | 3.9 Ah |
| Test piece No. 2 | full charge capacity | 21.8 Ah |
| | detection error | 2.8 Ah |
| Test piece No. 3 | full charge capacity | 10.5 Ah |
| | detection error | 5.4 Ah |
| Test piece No. 4 | full charge capacity | 10.0 Ah |
| | detection error | 5.7 Ah |
| Test piece No. 5 | full charge capacity | 18.3 Ah |
| | detection error | 4.4 Ah |
| Test piece No. 6 | full charge capacity | 21.2 Ah |
| | detection error | 3.4 Ah |
| Test piece No. 7 | full charge capacity | 24.3 Ah |
| | detection error | 1.7 Ah |
| Test piece No. 8 | full charge capacity | 27.6 Ah |
| | detection error | 2.8 Ah |
| Test piece No. 9 | full charge capacity | 25.1 Ah |
| | detection error | 2.7 Ah |

Figure 39:
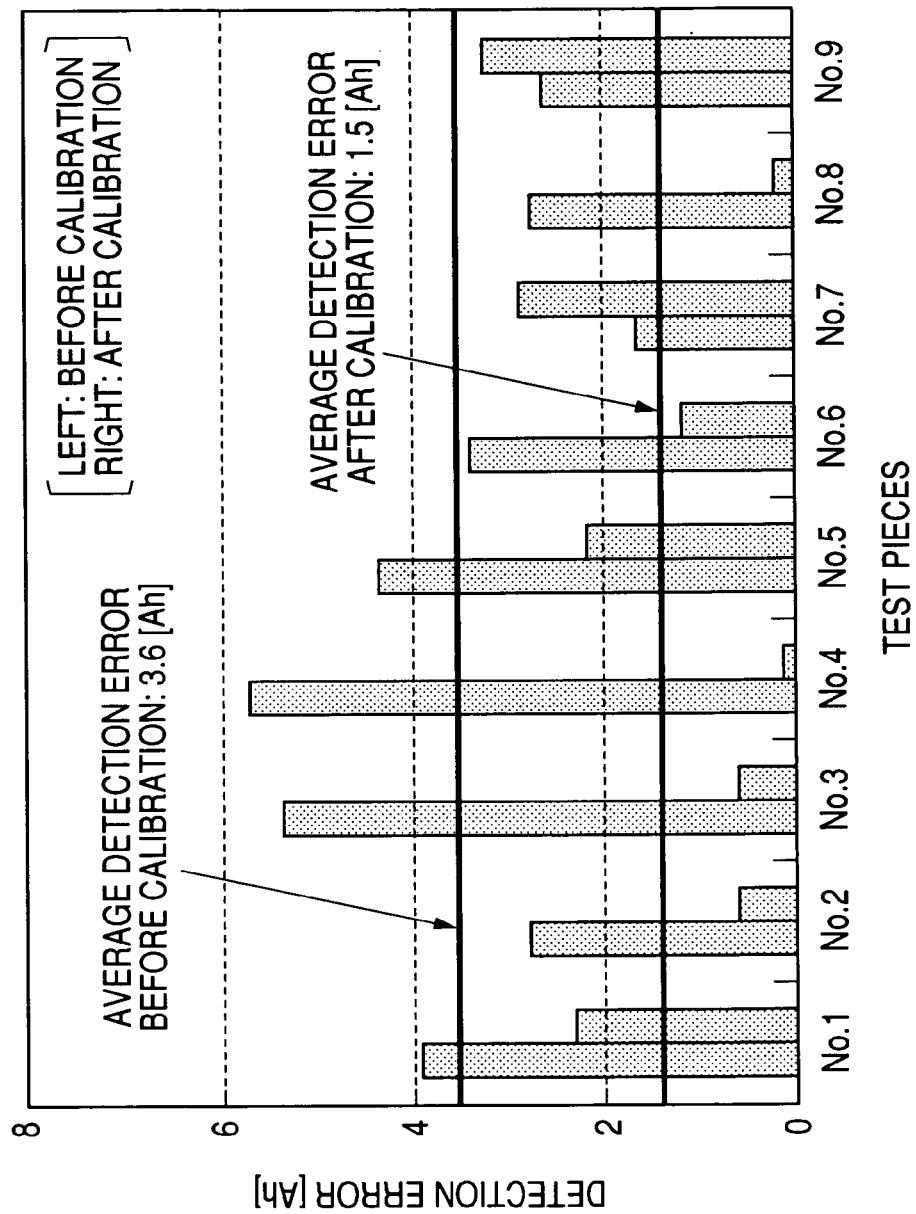
FIG. 39 is a graph showing errors in detecting full charge states to be expected of several used batteries to be tested, in a comparative way between the configurations based on the fifth embodiment and the conventional, the batteries being different in degradation thereof.

FIG. 39 shows in a graph the above detection errors summarized in Tables 1 and 2. That is, it is found that the number of input data is slightly increased from 10 pieces to 12 pieces (Vi=5 pieces, Ii=5 pieces, R=1 piece, and Vo=1 piece), but the full charge capacity of each used battery, which is to be expected from now on, can be estimated with largely improved precision. Furthermore, when the full charge capacity Q estimated through the neural network calculation becomes under a predetermined percentage to the initial full charge capacity initially memorized when manufactured, it is suggested that the battery has lost its usefulness and the battery should be replaced by a new one.

By the way, when an open-circuit voltage is detected in response to discharging a predetermined amount of power from a fully charged battery, it is preferred that the predetermined amount of power is set to a value that corresponds to a discharge of 0 to 30% of the initial (rated) full charge capacity of the battery form a present full charge power thereof. Preferably, the predetermined amount of power is set to a value that corresponds to a discharge of 2 to 20%. Particularly, it is still preferable to set to a value that corresponds to a discharge of 3 to 10%.

In the fourth embodiment, the input parameters include, at minimum, voltage history data, current history data, an open-circuit voltage responding to a predetermined-amount discharge, and an internal resistance responding to the predetermined-amount discharge. Of course, other parameters indicating battery states may be included in the input parameters. However, in terms of practical use, it is important to prevent an excessive increase in the amount of calculation for neural network. Hence, adding other parameters to the foregoing minimum input parameters should be limited to an extent that allows an increase in the calculation amount is within a 50% thereof.

Sixth Embodiment

Referring to FIGS. 40 to 49, a sixth embodiment according to the on-vehicle battery system of the present invention will now be described.

The on-vehicle battery system according to the present embodiment is characteristic of neural network calculation conducted with use of a plurality of memory tables in which coupling coefficients (i.e., matrices) are listed, group by group, depending on values of input parameters.

Figure 40:
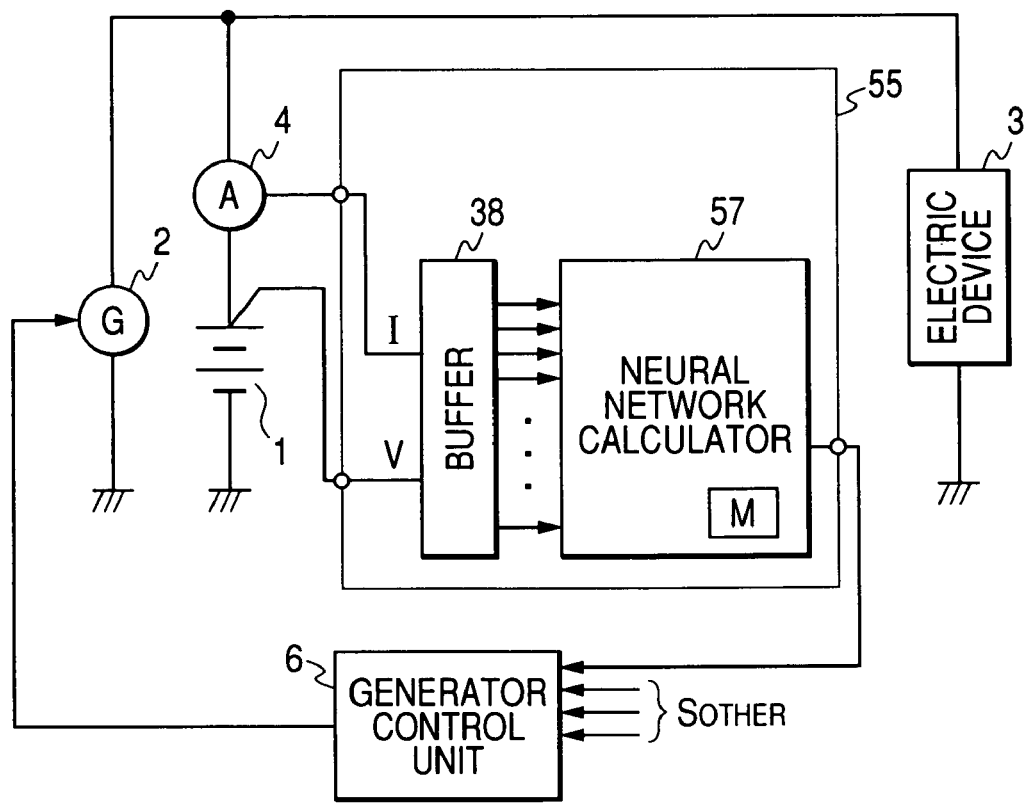
FIG. 40 is a block diagram showing the circuitry of an on-vehicle battery system adopted by a sixth embodiment according to the present invention.
Figure 41:
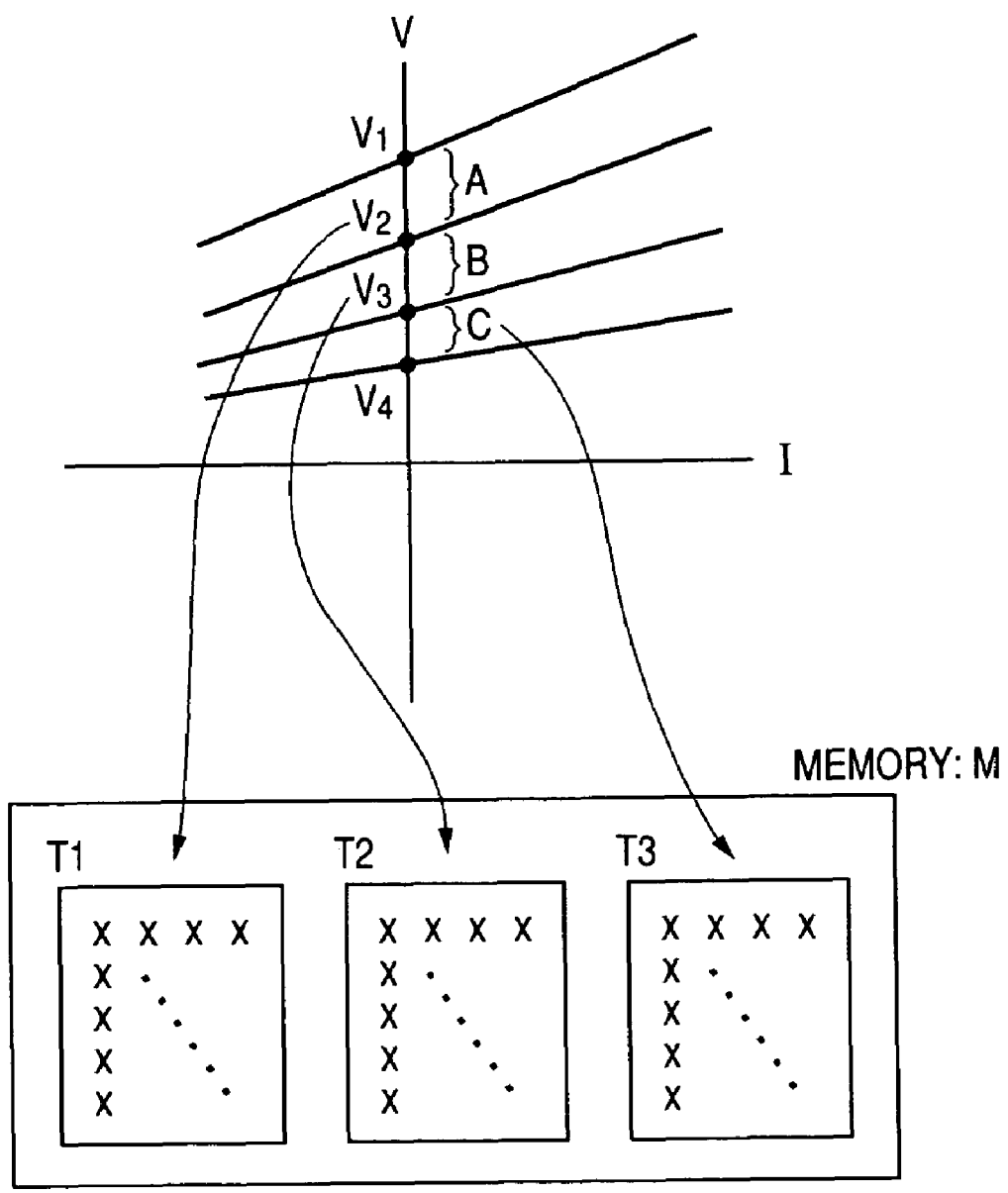
FIG. 41 shows the correspondence between open-circuit voltages detected in response to a discharge of a predetermined amount of power from each of fully charged batteries and a plurality of coupling-coefficient memory tables.

As shown in FIG. 40, the on-vehicle battery system is provided with a battery state detector 55 with a buffer 38 and a neural network calculator 57. In this circuitry, the correcting signal generator descried in the foregoing various embodiments is not implemented. This battery state detector 55 is also functionally realized, for instance, as descried, but this is not a definitive list.

Using the same way as described, the buffer 38 samples pairs of voltage V and the current I and use the sampled data to create not only data of voltage history Vi and current history Ii but also an open-circuit voltage Vo, all of which are given to the neural network calculator 57 as input parameters. Alternatively, the voltage and current history data Vi and Ii may be replaced by pairs of an average voltage Va and an average current Ia, described already. In addition, instead of the open-circuit voltage Vo, an internal resistance R of the battery 1 may be used as part of the input parameters. The open-circuit voltage Vo and the internal voltage R can be obtained in the same technique as described.

The neural network calculator 57 is in charge of performing determination whether or not the battery 1 is in its fully charged state and neural network calculation using a plurality of memory tables for coupling coefficients. The determination as to the fully charged state is the same as described in the first embodiment (refer to FIG. 3). The open-circuit voltage detected when the battery 1 is in its fully charged state is denoted by $Vo_{full}$, as described.

By the neural network calculator 57, learning is made beforehand based on input parameters of a range including the value of the open-circuit voltage $Vo_{full}$ in the fully charged state, and a coupling-coefficient memory table is selected from a memory M internally installed or externally connected in or to this calculator 57. Hence, the neural network calculation will be made using this selected coupling-coefficient memory table. As pictorially shown in FIG. 41, the memory M stores therein a plurality of coupling-coefficient memory tables T1-T3 in which coupling coefficients are written for every voltage range A (to C) decided depending on values of the open-circuit voltage $Vo_{full}$, that is, depending on the amplitude thereof. The coupling-coefficient memory tables T1-T3 are set for the respective voltage ranges on one-to-one correspondence, beforehand.

The coupling coefficients stored in each memory table Ti are coupling coefficients calculated on the basis of the input parameters obtained from a learning battery that has an open-circuit voltage $Vo_{full}$ residing within any of the voltage ranges. When it is determined that a fully charged state has yet to be realized, the neural network calculation is made without updating the coefficients in the memory tables.

Figure 42:
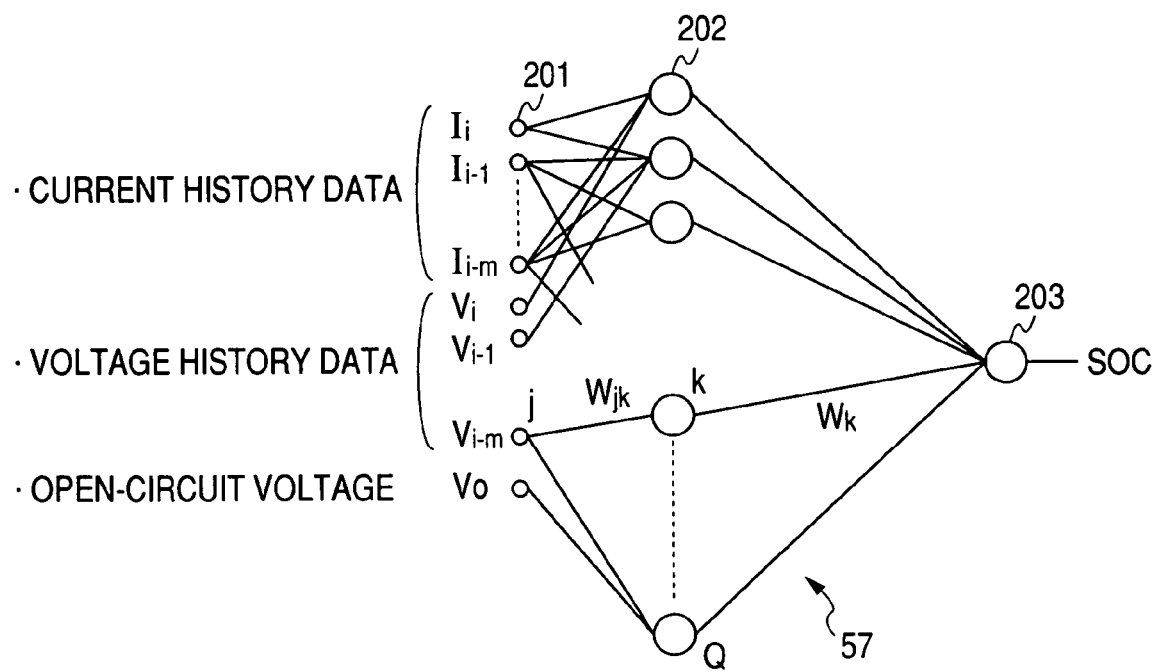
FIG. 42 is a functional block diagram explaining the functional configuration of a neutral network calculator in the on-vehicle battery system according to the sixth embodiment.

FIG. 42 functionally shows the configuration of the neural network calculator 57 having an input layer 201, intermediate layer 202, and output layer 203, cells of those layers are mutually connected with each other in the similar manner to those already described. Hence the neutral network calculator 57 is able to perform a specified type of neutral network calculation using the input parameters of current history data (Ii, Ii-1, . . . , Ii-m), voltage history data (Vi, Vi-1, . . . , Vi-m), and an open-circuit voltage Vo given to the input cells of the input layer 201 and coupling coefficients Wjk and Wk to be updated to minimize an error function, as described in the first embodiment. The calculation is conducted to allow the output layer 203 to output, as an output parameter, an SOC (state of charge), for example.

Figure 43:
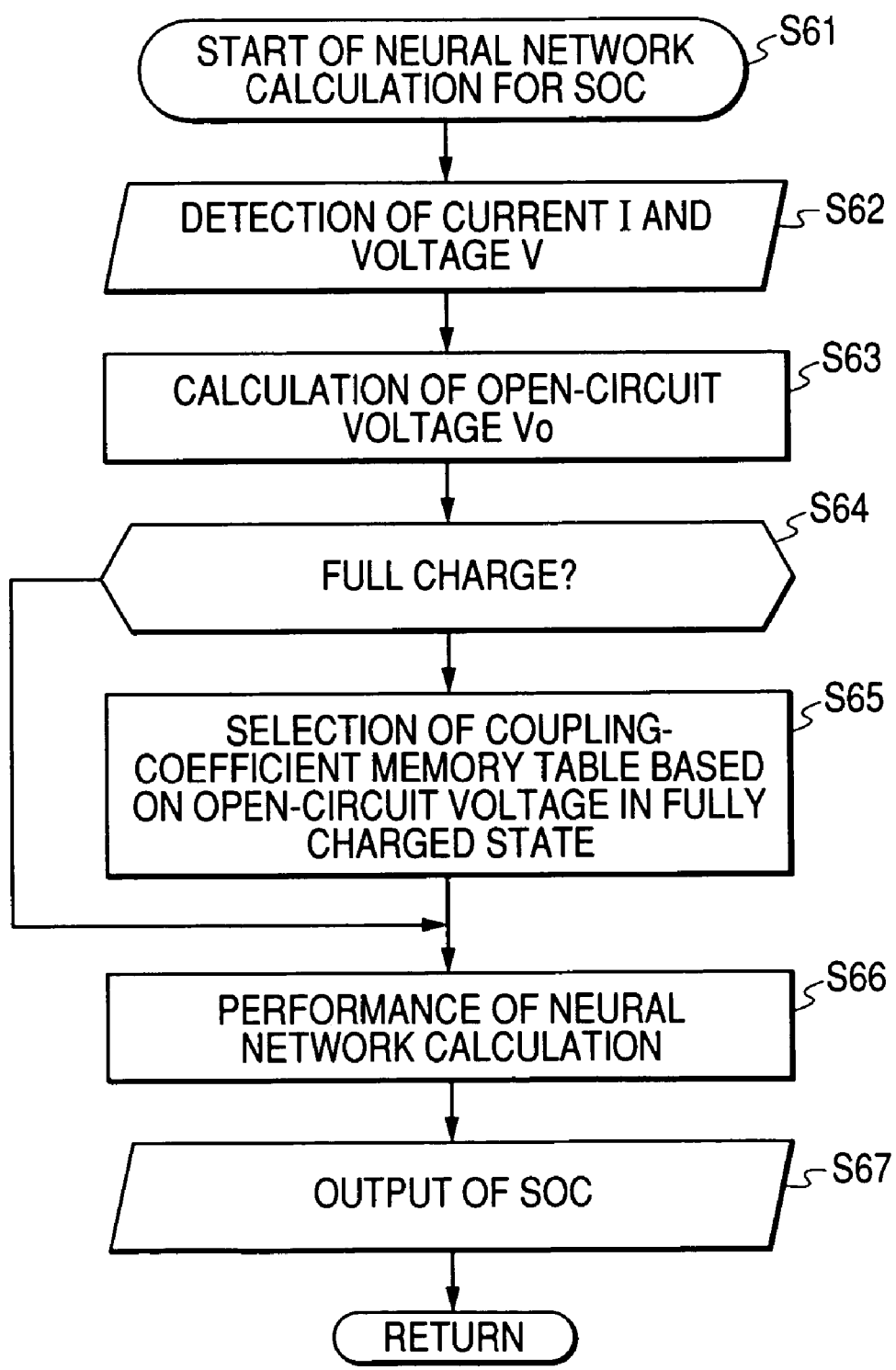
FIG. 43 is a flowchart showing how to calculate an SOC as an output parameter by using the plurality of coupling-coefficient memory tables.

The neural network calculation according to the present embodiment will now be outlined in connection with FIG. 43, which is conducted by the buffer 38 and the neutral network calculator 57 cooperatively.

First, when the vehicle starts running, pairs of voltage V and current I, which compose voltage and current history data Vi and Ii, are inputted to the buffer 38 and an open-circuit voltage Vo is calculated in the buffer 38, and their data are inputted as input parameters to the neural network calculator 57 (steps S61-S63).

In the calculator 57, it is determined whether or not the battery 1 is in its fully charged state (step S64). When it is determined that the battery 1 is fully charged, the open-circuit voltage $Vo_{full}$ is calculated to select a coupling-coefficient memory table Ti depending on the value (magnitude) of the open-circuit voltage $Vo_{full}$ (step S65; refer to FIG. 41). That is, it is decided that the calculated value of the open-circuit voltage $Vo_{full}$ falls into which voltage range A (to C), and then a coupling-coefficient memory table Ti corresponding to the calculated voltage value is automatically specified. Thus, coupling coefficients stored in the specified coupling-coefficient memory table Ti are read out.

Then, the neural network calculator 57 performs neural network calculation on the read-in coupling coefficients so as to estimate an SOC (state of charge) indicative of a charged rate of a battery. Data of the resultant SOC is then outputted, as an output parameter, from the neural network calculator 57 to, for example, the generator control unit 6.

As a variation of the processing shown above, an internal resistance R or any other quantities may be added to a group of input parameters to be used in neural network calculation. In such a case, the internal resistance R or other quantities may be calculated at step S63, together with the open-circuit voltage Vo.

A further variation is to employ an SOH (state of health) indicative of a residual capacity of a battery, instead of the SOC.

Accordingly, a plurality of charge/discharge patterns of the battery 1, which depend on the divided voltage ranges A to C of the open-circuit voltage $Vo_{full}$, can be obtained through the leaning process on the above neural network calculation before the shipping. Thus, irrelevantly of fluctuations in performance of each on-vehicle battery which is attributable to its manufacturing, the SOC can be estimated with precision in actual running of the vehicle.

(Test Results)

Fifteen batteries (lead batteries for vehicles) to be tested, whose capacities and degraded degrees were different from each other, were prepared and classified into three groups of batteries in accordance with the value (magnitude) of the open-circuit voltage $Vo_{full}$ in the fully charged state. The first battery group was composed of five batteries whose open-circuit voltages $Vo_{full}$ were 12.1 V or more but less than 12.4

V, the second battery group was composed of five batteries whose open-circuit voltages $Vo_{full}$ were 12.4 V or more but less than 12.8 V, and the third battery group was composed of five batteries whose open-circuit voltages $Vo_{full}$ were 12.8 V or more but less than 13.2 V.

The respective batteries were mounted, by turns, on the same vehicle and subjected to measurement of current I and terminal voltage V thereof in the running mode 10.15. Then, using the measurements, an open-circuit voltage Vo was calculated. SOCs were then calculated through the foregoing neural network calculation, and coupling-coefficient memory tables were produced group by group, whereby three coupling-coefficient memory tables were obtained in which coupling coefficients for the neural network calculation were written group by group.

Figure 45:
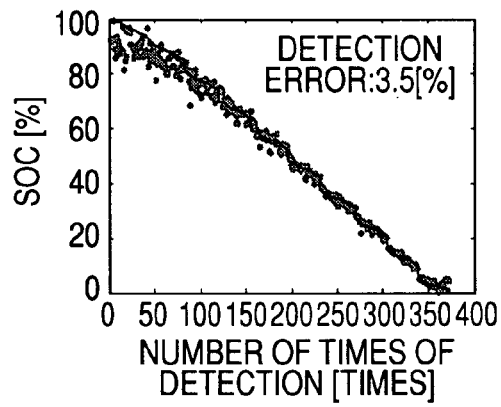
Figure 46:
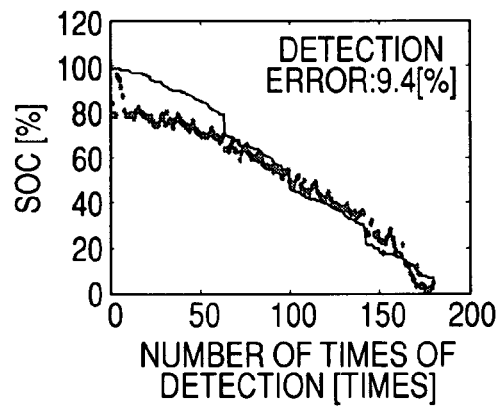

In the next place, using the neural network calculator which has the three coupling-coefficient memory tables and which has learned the charge/discharge patterns, other degraded batteries were subjected to calculating values of the SOC and a comparison is made between the resultant SOC values and true SOC values calculated on the current integration technique. The test results are shown in FIGS. 44-46.

Figure 44:
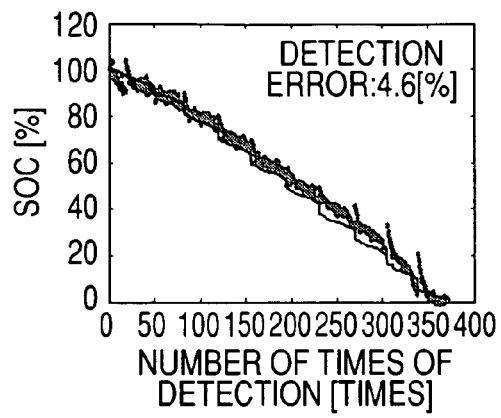
FIGS. 44-46 are graphs showing results of tests made based on the configuration provided by the sixth embodiment, respectively.

Of these, FIG. 44 shows a graph showing calculated (measured) results of the SOC obtained from a battery whose open-circuit voltage $Vo_{full}$ is 12.25 V, the results being calculated with the use of the first coupling-coefficient memory table whose coupling coefficients learned the charge/discharge pattern given by the first battery group. FIG. 45 shows a graph showing calculated (measured) results of the SOC obtained from a battery whose open-circuit voltage $Vo_{full}$ is 12.6 V, the results being calculated with the use of the second coupling-coefficient memory table whose coupling coefficients learned the charge/discharge pattern given by the second battery group. FIG. 46 shows a graph showing calculated (measured) results of the SOC obtained from a battery whose open-circuit voltage $Vo_{full}$ is 12.9 V, the results being calculated with the use of the third coupling-coefficient memory table whose coupling coefficients learned the charge/discharge pattern given by the third battery group.

Figure 47:
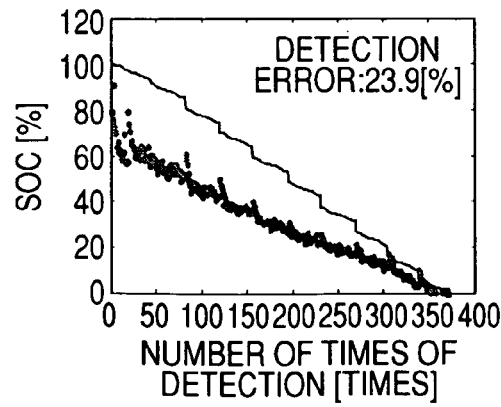
FIG. 47-49 are graphs showing results of comparative tests made based on a configuration corresponding to the conventional, respectively.
Figure 48:
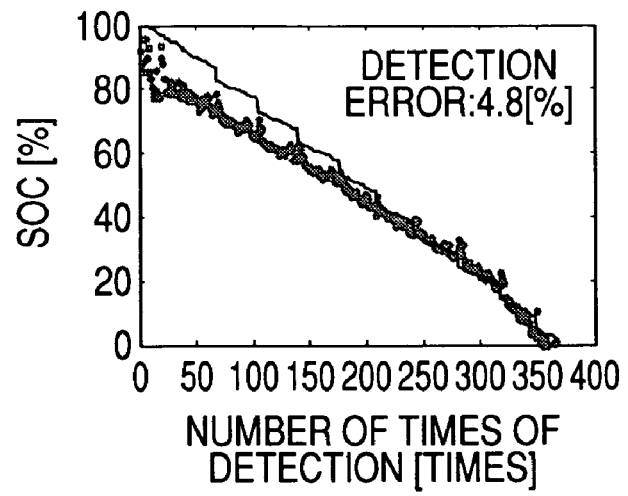
Figure 49:
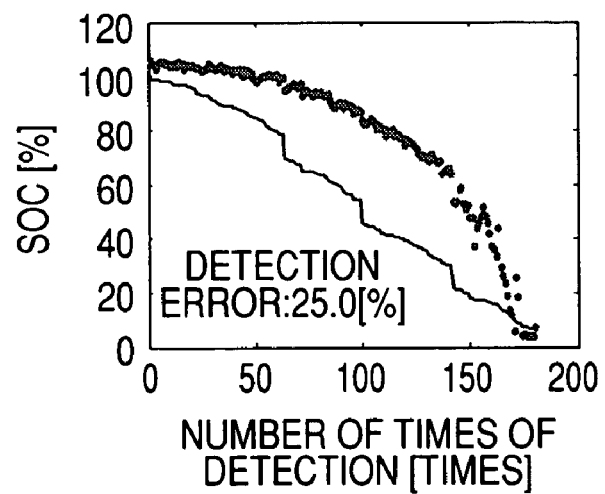

Comparative tests were also done. The foregoing fifteen batteries (lead batteries for vehicles) were mounted in turns on the same vehicle, both current data I and terminal voltage data V were measured and an open-circuit voltage Vo was calculated during a 10.15-mode run of the vehicle. The measured values and calculated value were subjected to the foregoing neural network calculation. SOCs were then calculated through the foregoing neural network calculation, and a single coupling-coefficient memory table was produced. By using a neural network calculator which has the coupling-coefficient memory table and which has learned the charge/discharge pattern, other used batteries were subjected to calculating values of the SOC and a comparison is made between the resultant SOC values and true SOC values calculated on the current integration technique. The results are shown in FIGS. 47-49, in which calculated results of a battery whose open-circuit voltage $Vo_{full}$ is 12.25 V, 12.6 V, and 12.9 V are provided, respectively.

The above test results reveal that, thanks to the plurality of coupling-coefficient tables, which are grouped depending on the magnitude of the open-circuit voltage $Vo_{full}$, the precision of calculation of the SOC can be improved to a large extent.

As a modification, instead of the open-circuit voltage $Vo_{full}$, an open-circuit voltage Vo detected in response to a discharge of a predetermined amount of power from a battery which has been fully charged may be used. In such a case, depending on the magnitude of the open-circuit voltage Vo, a plurality of coupling-coefficient memory tables are set similarly to the above. Moreover, an internal resistance R of a batter may be used solely instead of the voltage $Vo_{full}$. A combination of an open-circuit voltage Vo and an internal resistance R may be used on behalf of the voltage $Vo_{full}$.

Moreover, there is a modification as to how the open-circuit voltage $Vo_{full}$ is set. In the foregoing embodiment, no consideration is taken into the influence of polarization in the open-circuit voltage $Vo_{full}$ and/or the internal resistance R. Instead of this, the open-circuit voltage $Vo_{full}$ and/or the internal resistance R may be decided such that their values are reduced in consideration of the influence of the polarization voltage. The resultant voltage $Vo_{full}$ and/or resistance R are usable for respectively assigning coupling coefficients to the memory tables.

Another modification is that the foregoing voltage V, open-circuit voltage Vo and/or internal resistance R are replaced by ratios which are relative to their values acquired when a battery is fully charged. This is also effective because different batteries are mutually compared in a more optimized fashion, thus alleviating irregularities of battery capacities in neural network learning and calculation of the charged states of batteries.

Seventh Embodiment

Referring to FIGS. 50 to 68, a seventh embodiment according to the on-vehicle battery system of the present invention will now be described.

The on-vehicle battery system according to the present embodiment is characteristic of preventing a calculation load from increasing and a circuitry size from enlarging, while still securing high precision in detecting one or more desired output parameters indicating the charged state of an on-vehicle battery.

Figure 50:
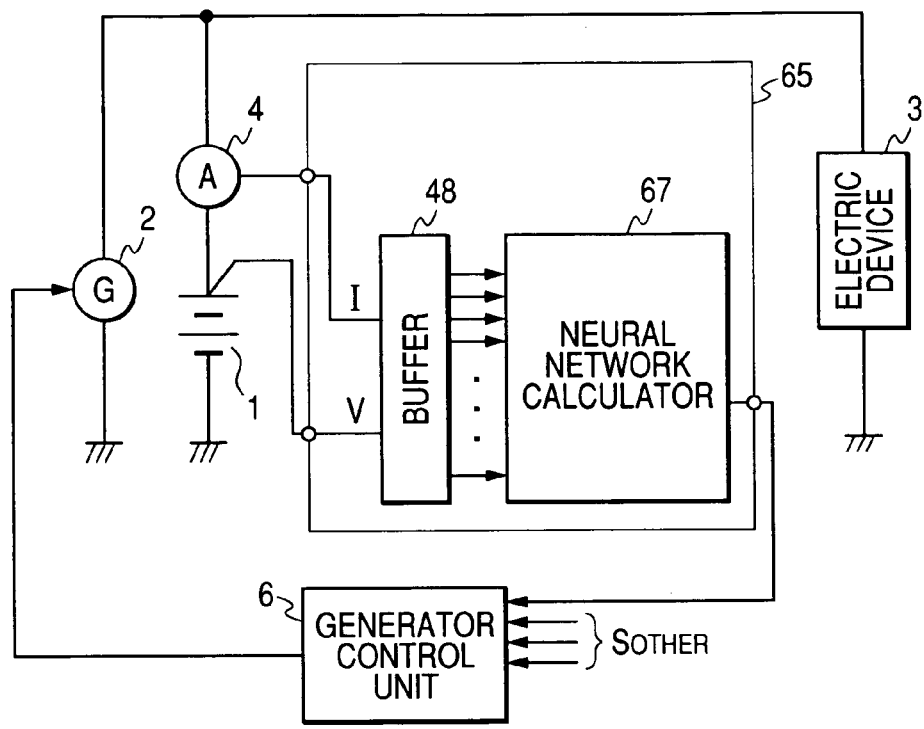
FIG. 50 is a block diagram showing the circuitry of an on-vehicle battery system adopted by a seventh embodiment according to the present invention.

As shown in FIG. 50, the on-vehicle battery system according to the present invention is provided with a battery state detector 65 with a buffer 48 and a neural network calculator 67, but with no correcting signal generator employed by the first to third embodiments. The battery state detector 65 is functionally realized by, for example, a computer system with a microcomputer, memories and other necessary elements.

The buffer 48 is configured to perform the following various types of processing.

First of all, similarly to the foregoing, the buffer 48 reads in data of voltage (terminal voltage) V of the battery 1 and data of current I from the current sensor 4, in real time, at intervals, for simultaneous sampling thereof, and memorizes sampled data composed of pairs of voltage V and current I. Moreover, the buffer 48 uses those pairs of voltage V and current I to specify types of functional values consisting of average voltage Va, average current Ia, open-circuit voltage Vo, internal resistance R, a correlation function value f(Vo, R) showing an amount of dischargeable current.

The average voltage Va is an average of the voltages V of the battery 1 over the latest interval of calculation time and the average current Ia is an average of the charged and discharged currents I in and from the battery 1 detected during the latest interval of calculation time. These values Va and Ia may be outputs of low-pass filters into which the data of the voltage V and current I are supplied, respectively.

Figure 51:
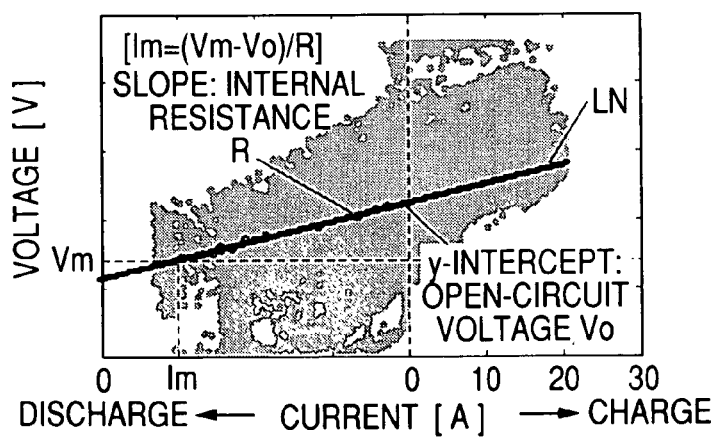
FIG. 51 is a two-dimensional map showing how to estimate an approximate expression used to calculate an open-circuit voltage and an internal resistance of the battery.

The open-circuit voltage Vo and internal resistance R are calculated using a two-dimensional map in which the average voltage Va and average current Ia are two-dimensionally mapped (refer to FIG. 51). Each pair of average voltage Va and average current Ia undergo calculation on a least-squares method to figure out a linearly approximate expression L. The y-intercept and slope of this expression indicate an open-circuit voltage Vo and an internal resistance R of the battery 1. Thus, based on the linearly approximate expression L, data indicative of an open-circuit voltage Vo and an internal resistance R are calculated every time when the pairs of average voltage Va and average current Ia are inputted.

In addition, the buffer 48 obtains the correlation function value f(Vo, R) by calculating an expression of f(Vo, R)=Vo·Vo/R=Pm. Hence the value Pm shows a power which is expressed as a function having a positive correlation to an amount of power dischargeable of the battery 1 at present.

The buffer 48 further calculates "full charge ratios" of the average voltage Va, open-circuit voltage Vo, internal resistance R, and correlation functional value f(Vo, R), respectively. The "full charge ratio" is provided to each of those physical quantities and defined as a ratio of a present value of each physical quantity to a value thereof obtained in the fully charged state of the battery 1. These full charge ratios exhibit higher correlations with degrees of degradations of batteries, which are therefore proper for input parameters for correcting (calibrating) charged states of each battery which are on account of the degradations.

Practically, at the last timing when the fully charged state of the battery 1 is detected, the buffer 48 calculates and memorizes a full-charge average voltage Vaf showing an average voltage Va to be estimated at the last fully charged state, a full-charge open-circuit voltage Vof showing an open-circuit voltage Vo to be estimated at the last fully charged state, a full-charge internal resistance Rf showing an internal resistance R to be estimated at the last fully charged state, and a full-charge correlation function value f(Vof, Rf) showing a correlation function value f(Vo, R) to be estimated at the last fully charged state. Then, values of those physical quantities are read out from a memory to make a comparison with present values thereof, respectively, which have been calculated at present. That is, ratios of Va/Vaf, Vo/Vof, R/Rf, and (Vo·Vo/R)/(Vof·Vof/Rf) are figured out as part of input parameters to the neural network calculator 67. The ratio of (Vo·Vo/R)/(Vof·Vof/Rf) is thus a power ratio.

The calculation of the full-charge average voltage Vaf, full-charge open-circuit voltage Vof, full-charge internal resistance Rf, and full-charge correlation function value f(Vof, Rf) involves determination as to whether or not the battery 1 is now in its full charge state. This determination is also carried out in the similarly to that explained in the first embodiment (refer to FIG. 3). That is, the voltage V and current I in FIG. 3 should be read as the average voltage Va and average current Ia. Pairs of average voltage Va and average current Ia are thus subjected to determination such that a coordinate point specified by each pair falls into a predetermined region to show the fully charged state in the two-dimensional map. The average voltage Va, open-circuit voltage Vo, internal resistance R, and correlation function value f(Vo, R)=Vof·Vof/Rf, which are estimated when such a determining condition is met, are designated at the full-charge average voltage Vaf, full-charge open-circuit voltage Vof, full-charge internal resistance Rf, and full-charge correlation function value f(Vof, Rf). Those full-charge related physical quantities are memorized in a memory and updated whenever the full charge determination is made.

Figure 52:
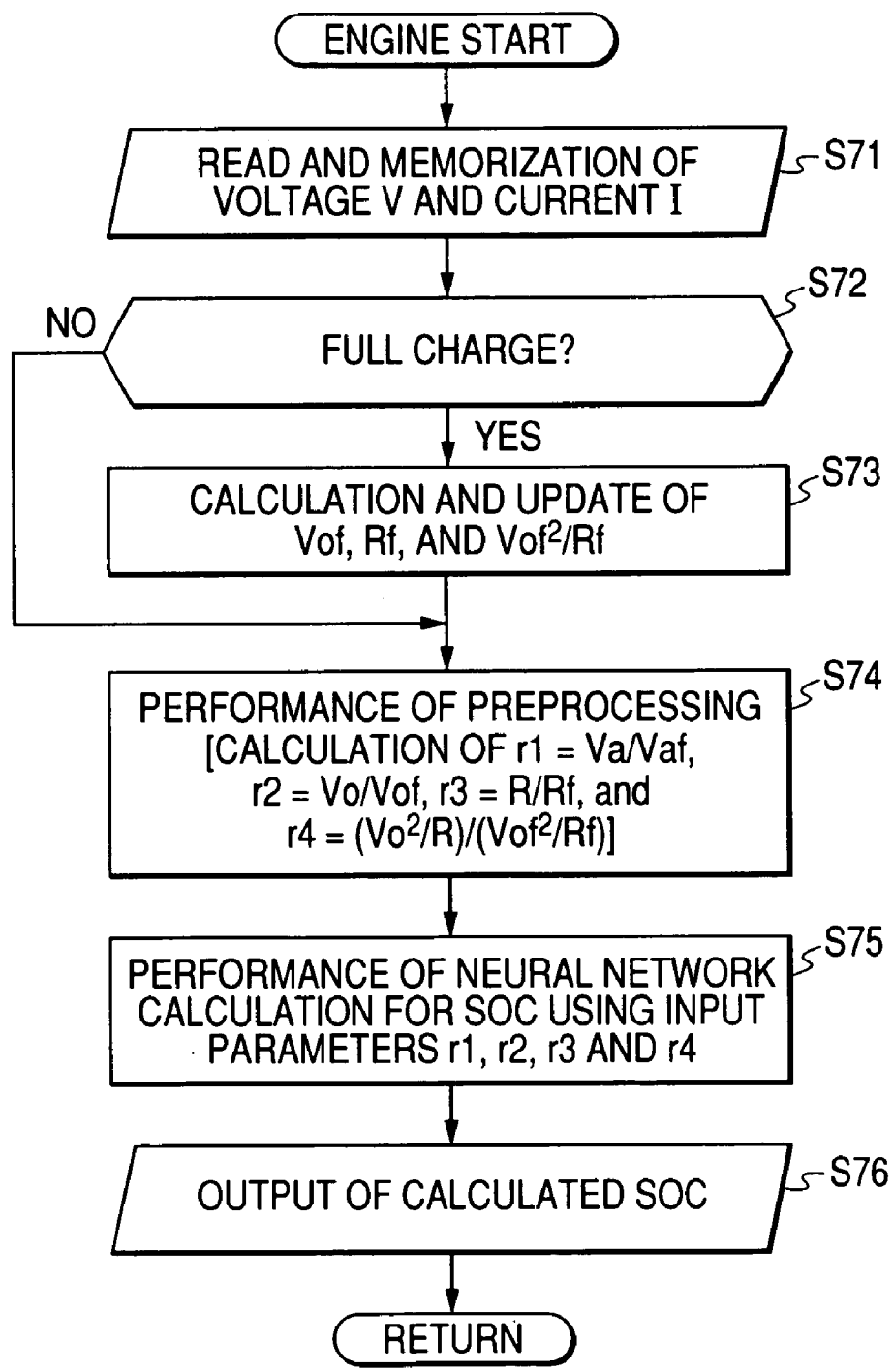
FIG. 52 is a flowchart showing the processing how to calculate input parameters for neural network calculation and an SOC of the battery.

FIG. 52 outlines the processing carried out by the battery state detector 65 (i.e., the buffer 48 and calculator 67). The battery state detector 65 reads in the data of voltage V and current I for the necessary processing, as described (step S71), and then determines whether or not the battery 1 is in its fully charged state, as described (step S72). If this determination is made to be affirmative (YES at step S72), the full-charge open-circuit voltage Vof, full-charge internal resistance Rf, and full-charge correlation function value f (Vof, Rf)=Vof·Vof/Rf are calculated and updated, as described (step S73). Then the processing in the detector 65 proceeds to step S74, wherein, as pre-calculation, some or all of the full-charge related ratios of r1=Va/Vaf, r2=Vo/Vof, r3=R/Rf, and r4=(Vo·Vo/R)/(Vof·Vof/Rf) are calculated (step S74). The resultant data of both the full-charge related ratios of r1=Va/Vaf, r2=Vo/Vof, r3=R/Rf, and r4=(Vo·Vo/R)/(Vof·Vof/Rf) and the average current Ia are given as five input parameters to the neural network calculator 67, so that, responsively to this input of those input parameters, the neural network calculator 67 conducts predetermined neural network calculation in order to produce an output parameter relating to an SOC indicative of a charged rate [%] of the battery 1 (step S75). The calculated (that is, estimated) SOC are outputted to the generator control unit 6 (step S76).

Incidentally, any other parameters, which are selected properly, may be added to the input parameters.

Figures 53, 54:
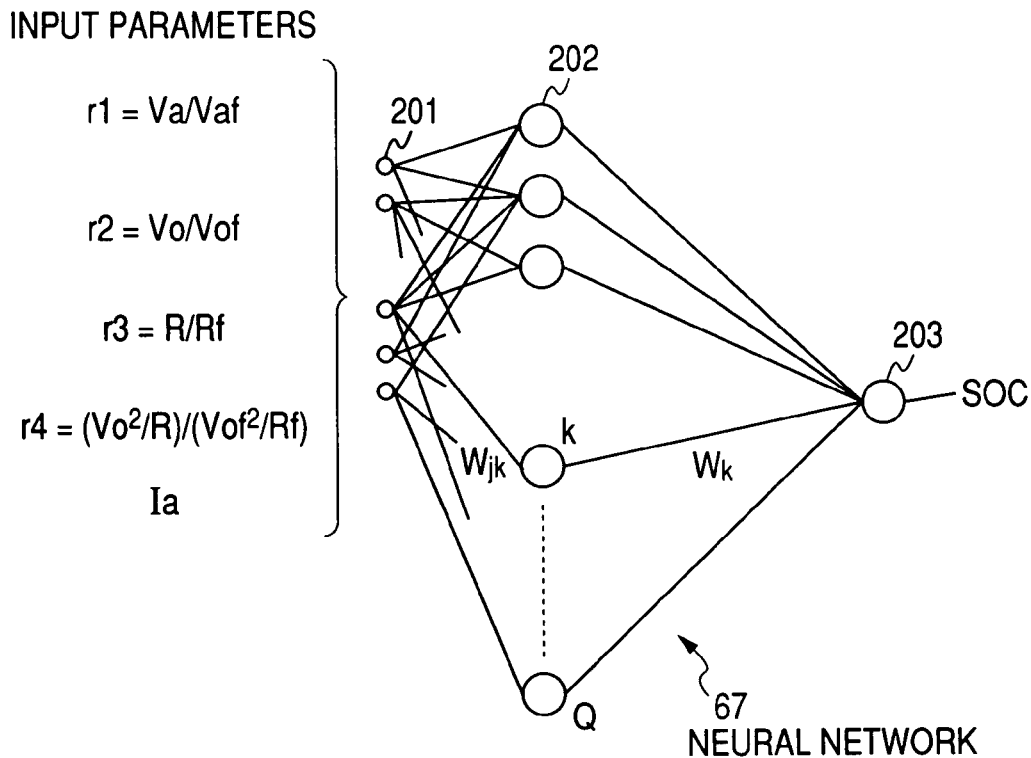
FIG. 53 is a functional block diagram explaining the functional configuration of a neural network calculator in the seventh embodiment.
FIG. 54 is a table explaining capacities of various used batteries to be used for the learning of a neural network calculator.

The operations of the neural network calculator 67 are equivalent to those of the calculators described so far. That is, as shown in FIG. 53, the calculator 67 is functionally provided with an input layer 201 having an input cells to receive the input parameters composed of the full-charge related ratios of r1=Va/af, r2=Vo/Vof, r3=R/Rf, and/or r4=(Vo·Vo/R)/(Vof·Vof/Rf) and/or the average current Ia, an intermediate layer 202 for calculation, and an output layer 203 from which the SOC is provided as the output parameter. The ratio r4 is a power ratio relating to a full charge.

As a modification, the output parameter may be an SOH showing a residual capacity, i.e., a present capacity available for discharge.

The neural network calculator 67 is therefore allowed to learn charge/discharge patterns of some typical types of batteries, as described in connection with FIG. 6, prior to the shipment of the on-vehicle battery system. As a result, regardless of fluctuations in manufacturing each on-vehicle battery, the SOC of the on-vehicle battery can be estimated with precision through the neural network calculation during each run of the vehicle.

(Test Results)

Similarly to the foregoing embodiments, tests for verifying the advantages given by the configuration according to the present embodiment were also provided.

Five batteries A to E were gathered, which were different from each other in their capacities and degrees of degradation (refer to FIG. 54). These batteries A to E were subjected to, during the 10.15 mode running, measurement of current and terminal voltage, calculation of the foregoing five input parameters for the neural network calculation, and the learning with a target output given as a true value of the SOC (calculated as a current integrated value).

Figure 55:
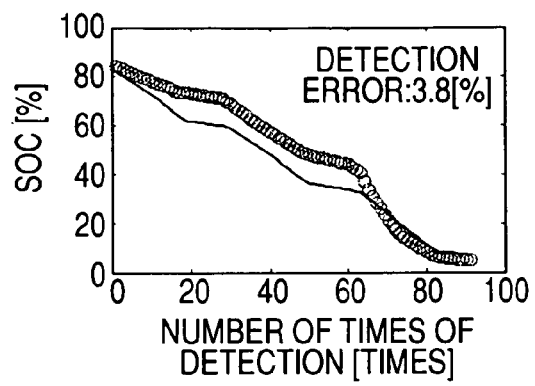
FIG. 55-57 are graphs showing results of tests made based on the configuration provided by the seventh embodiment, respectively.
Figure 56:
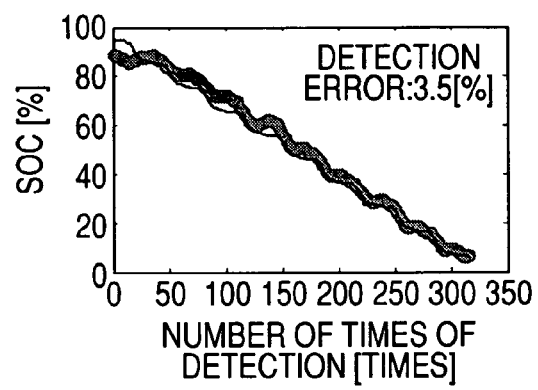
Figure 57:
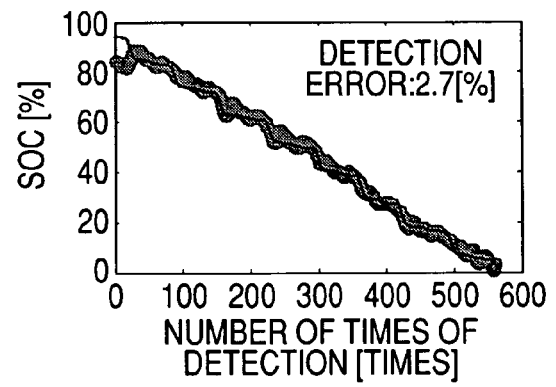
Figure 58:
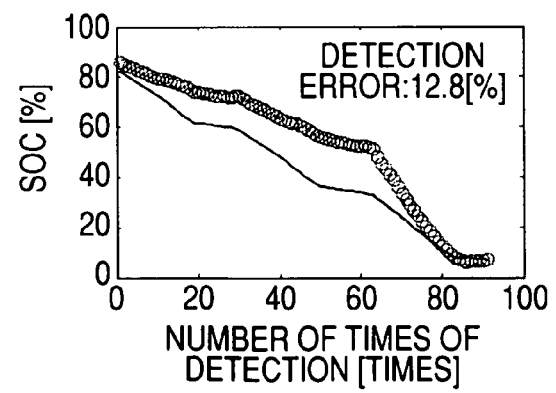
FIG. 58-60 are graphs showing results of comparative tests made based on a configuration corresponding to the conventional, respectively.
Figure 59:
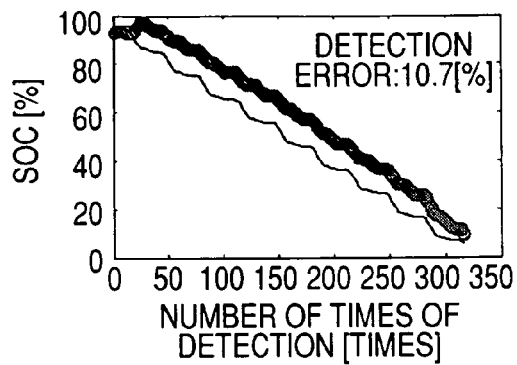
Figure 60:
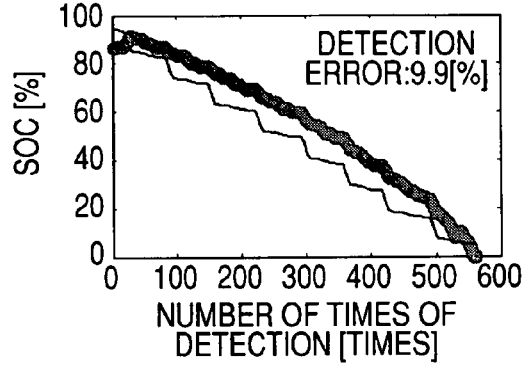

Then, this neural network calculator which had completed the leaning was used to calculate an SOC of each of further used batteries to be tested which were variously degraded in their performances. The tested results were compared to the current integrated results, which are shown in FIGS. 55 to 60. Of these, FIGS. 55 to 57 show the SOCs of three batteries to be tested, respectively, with the use of the five input parameters consisting of Va, Vo, R, Ia, and (Vo·Vo/R)/(Vof·Vof/Rf). In contrast, FIGS. 58 to 60 show the SOCs of the same three batteries, respectively, with the use of only four input parameters consisting of Va, Vo, R and Ia, that is, with no use of the full-charge related power ratio (Vo·Vo/R)/(Vof·Vof/Rf). From the comparison between the two groups of tested results, it is found that adding only the power ratio to the input parameters makes it possible to largely improve the precision in estimating the SOC.

Figure 61:
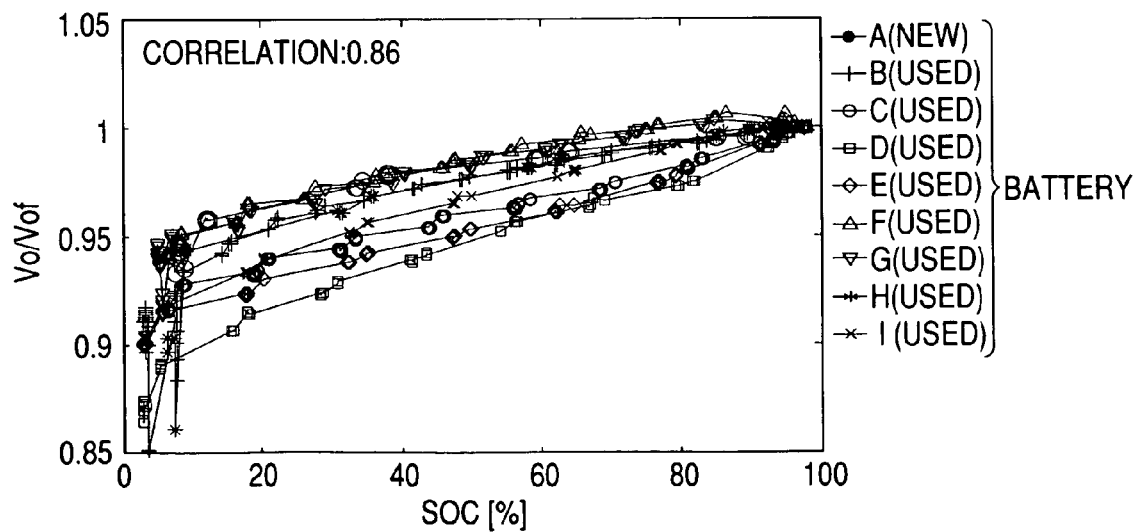
FIG. 61 is a graph showing test results according to a modification of the seventh embodiment.
Figure 62:
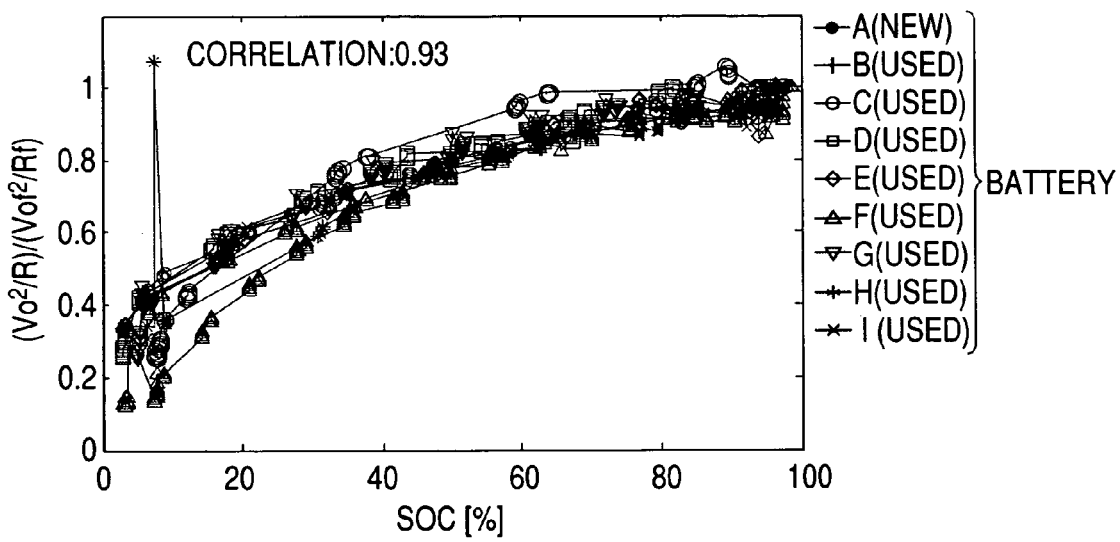
FIG. 62 is a graph showing test results according to another modification of the seventh embodiment.

Moreover, a group of further nine batteries, one of which was brand new, were subjected to testing a correlation between their ratios of Vo/Vof and their SOCs. The tested results are indicated in FIG. 61, which reveals a correlation of 0.86. In addition, another group of further nine batteries, one of which was brand new, were also subjected to testing a correlation between their full-charge power ratios of (Vo·Vo/R)/(Vof·Vof/Rf) and their SOCs. The tested results are indicated in FIG. 62, which reveals a correlation of 0.93. From the results in FIG. 62, it is found that the addition of the above power ratio, which has a larger correlation as above, to the input parameters raises the precision of the SOC calculation, compared to the mere use of the open-circuit voltage Vo.

Modifications)

The foregoing configuration can be modified as follows. The hardware configuration is the same as that described above, but the input parameters differ from the above. To be specific, in place of the full-charge related power ratio of (Vo·Vo/R)/(Vof·Vof/Rf), a full-charge related current ratio defined by Im=(Vm−Vo)/R also serving as the correlation function value f(Vo, R). This current Im represents chargeable current at present. The voltage Vm, which is a predetermined final voltage at which the charge stops, was set to 10.5 V. The relationship between the discharge stop voltage Vm and the chargeable current Im is shown in FIG. 51.

As another modification, the function value f(Vo, R) may be linearly converted to:

$$f(Vo,R)=K1\times((Vm-Vo)+k2)/(R+k3),$$

wherein k1 to k3 are constants and, as a preferable mode, k1 is 1 and k2 and k3 are 0, respectively. This enables the neural network calculation to be more accurate.

Further, the function value f(Vo, R) may be set to have a correlation with a function value Vo·Vo/R.

Still further, the function value f(Vo, R) may be linearly converted to:

$$f(Vo,R)=k1\times((Vo+k2)\times(Vo+k2)+k3)/(R+k4),$$

wherein k1 to k4 are constants and, as a preferable mode, k1 is 1 and k2 and k4 are 0, respectively. This enables the neural network calculation to be more accurate.

(Test Results)

In the same way as the foregoing, five batteries were gathered, which were different from each other in their capacities and degrees of degradation (refer to FIG. 54). These batteries A to E were subjected to, during the 10.15 mode running, measurement of current and terminal voltage, calculation of the foregoing five input parameters for the neural network calculation, and the learning with a target output given as a true value of the SOC (calculated as a current integrated value).

Figure 63:
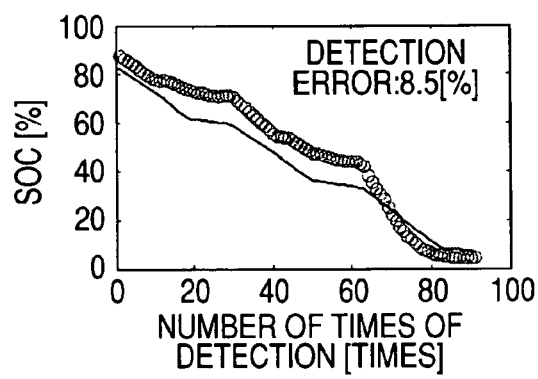
FIG. 63-65 are graphs showing results of tests made according to another modification of the seventh embodiment, respectively.
Figure 64:
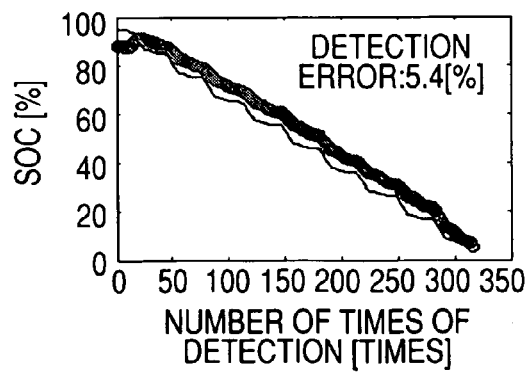
Figure 65:
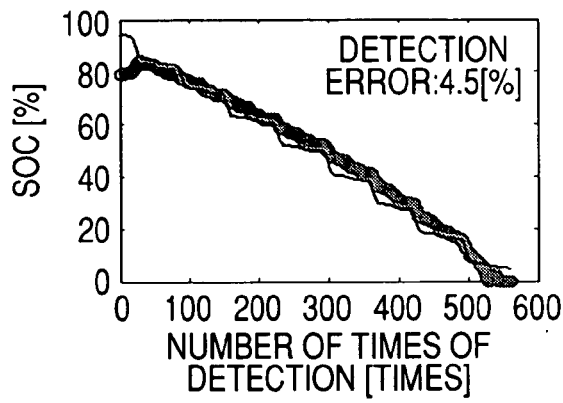
Figure 66:
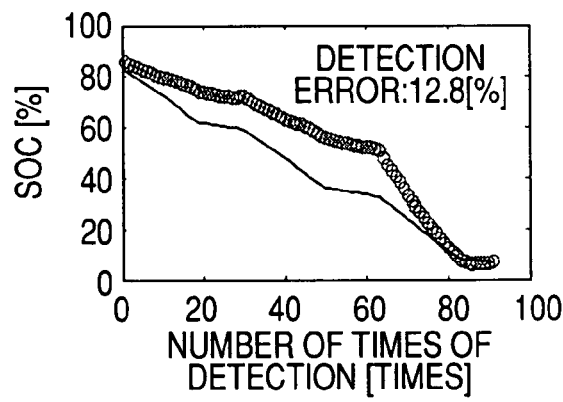
FIG. 66-68 are graphs showing results of comparative tests made based on a configuration corresponding to the conventional, respectively.
Figure 67:
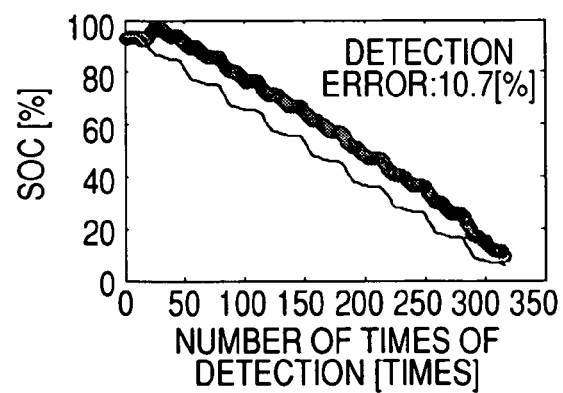
Figure 68:
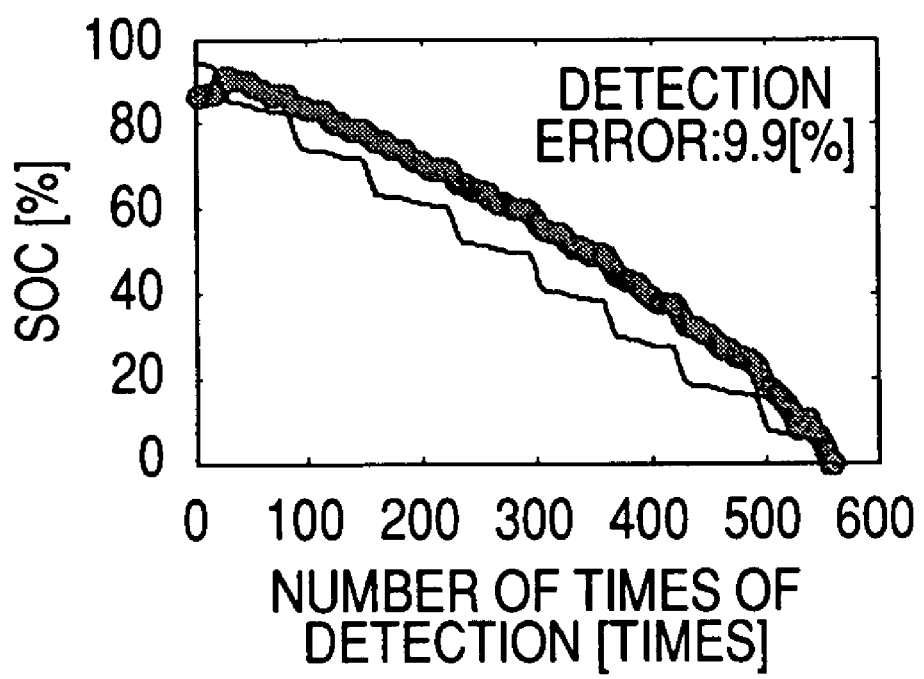

Then, this neural network calculator which had completed the leaning was used to calculate an SOC of each of further used batteries to be tested which were variously degraded in their performances. The tested results were compared to the current integrated results, which are shown in FIGS. 63 to 68. Of these, FIGS. 63 to 65 show the SOCs of three batteries to be tested, respectively, with the use of the five input parameters consisting of Va, Vo, R, Ia, and [(Vm−Vo)/R]/[(Vm−Vof)/Rf]. In contrast, FIGS. 66 to 68 show the SOCs of the same three batteries, respectively, with the use of only four input parameters consisting of Va, Vo, R and Ia, that is, with no use of the full-charge related current ratio [(Vm−Vo)/R]/[(Vm−Vof)/Rf]. The comparison between the two groups of tested results reveals that adding only the current ratio to the input parameters makes it possible to largely improve the precision in estimating the SOC.

As another modification is to include both the full-charge related ratios of [(Vm−Vo)/R]/[(Vm-Vof)/Rf] and (Vo·Vo/R)/(Vof·Vof/Rf) in parallel in the input parameters. In this modification, the correlation between the input parameters and the SOC can be raised more than in a case in which only one of the above two full-charge related ratios is used, with the result that either one or both of the open-circuit voltage Vo and internal resistance R may be omitted from the input parameters.

Eighth Embodiment

Referring to FIGS. 69 to 93, an eighth embodiment according to the on-vehicle battery system of the present invention will now be described.

Like the foregoing seventh embodiment, the on-vehicle battery system according to the present embodiment is characteristic of preventing a calculation load from increasing and a circuitry size from enlarging, while still securing high precision in detecting one or more desired output parameters indicating the charged state of an on-vehicle battery.

Figure 69:
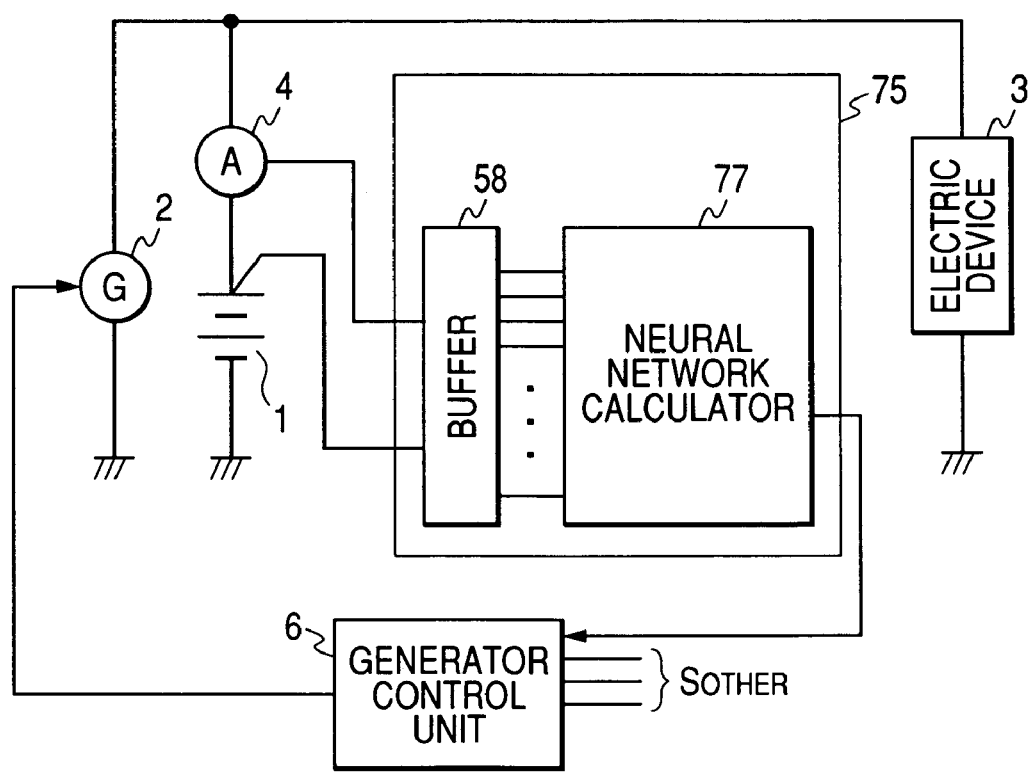
FIG. 69 is a block diagram showing the circuitry of an on-vehicle battery system adopted by an eighth embodiment according to the present invention.

The on-vehicle battery system according to the present embodiment has circuitry shown in FIG. 69, in which there is provided a battery state detector 75 with a buffer 58 and a neural network calculator 77. Like the foregoing, the battery state detector 75 can be established functionally by processing on a microcomputer, but a dedicated hardware circuit may be used as well.

Figure 70:
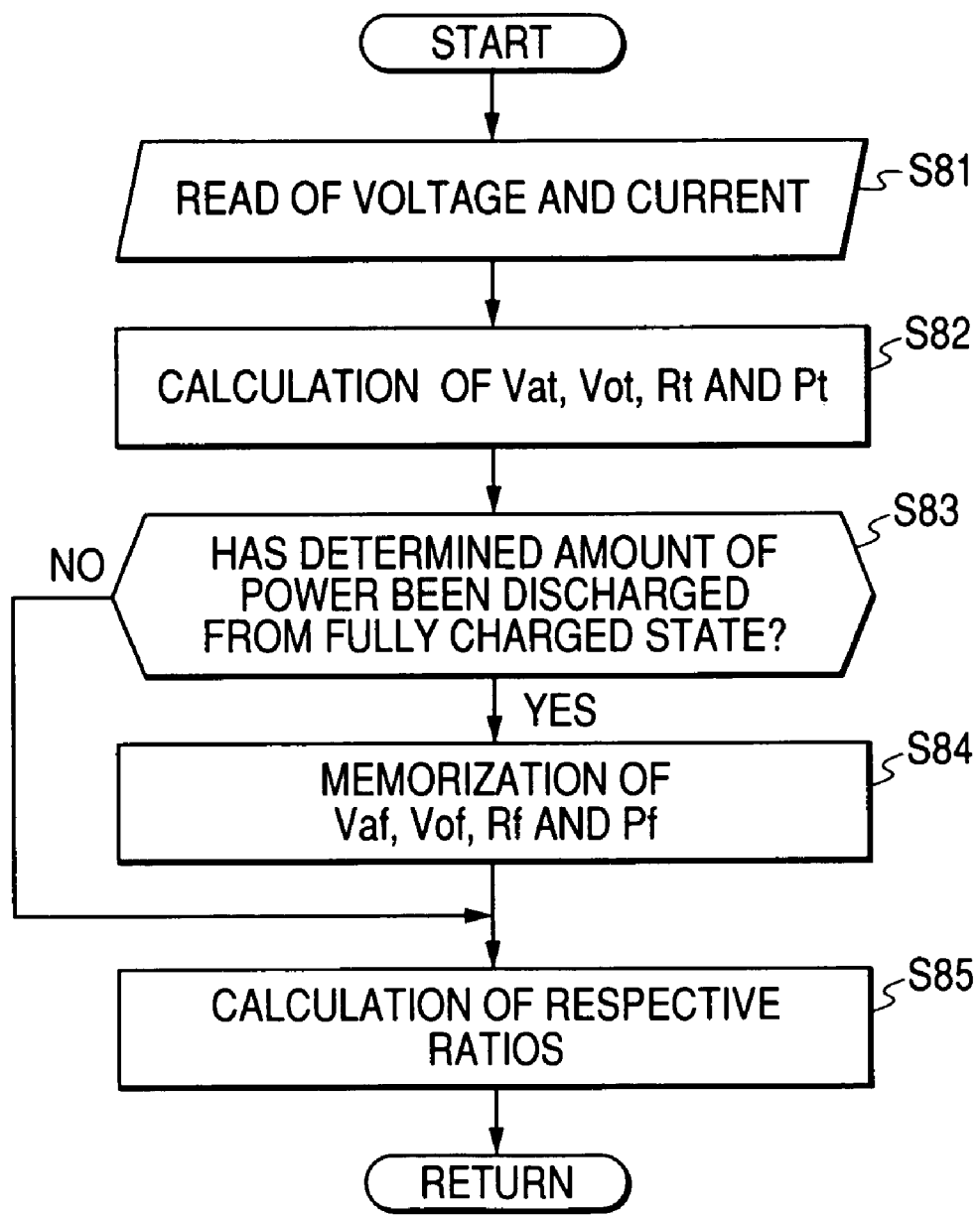
FIG. 70 is a flowchart outlining how to calculate ratios serving as input parameters indicating physical state quantities of a battery.

Referring to FIG. 70, the buffer 58 will now desired with regard to its operations.

First of all, similarly to the foregoing, the buffer 58 reads in data of voltage (terminal voltage) V of the battery 1 and data of current I from the current sensor 4, in real time, at intervals, for simultaneous sampling thereof, and memorizes sampled data composed of pairs of voltage V and current I (step S81). Then, as to an average voltage Va of voltages acquired during the last calculation interval, an open-circuit voltage Vo, an internal resistance R, and a maximum discharge power P(=Vo·Vo/4R), the buffer 58 uses those data of pairs of voltage V and current I to calculate present values Vat, Vot, Rt and Pt, respectively (step S82). The open-circuit voltage Vo and internal resistance R are calculated in the same manner as described.

The buffer 58 determines whether or not the battery 1 which was fully charged has discharged a predetermined amount of power (for example 1.4 Ah) (step S83). Only when the discharge of the predetermined amount of power from that the battery 1 is true, the buffer 58 proceeds to the processing at step S84, where the present values Vat, Vot, Rt and Pt calculated at step S82 are set as values Vaf, Vof, Rf and Pf responding to the discharge of the predetermined amount of power, respectively. That is, Vaf, Vof, Rf and Pf respectively denote a average voltage Va, an open-circuit voltage Vo, an internal resistance R, and a maximum discharge power P=Vo·Vo/4 R each responding to discharging the predetermined amount of power.

Then the buffer 58 proceeds to step S85, where various types of ratios of Vat/Vaf, Vot/Vof, Rt/Rf, and Pt/Pf are calculated as input parameters to the neural network calculator 77. The processing is then stopped until the timing at which the next pair of voltage and current data are sampled. The ratios of Vat/Vaf, VotN of, Rt/Rf, and Pt/Pf are a ratio of the average voltage Va, a ratio of the open-circuit voltage Vo, a ratio of the internal resistance R, and a ratio of the maximum discharge power P(=Vo·Vo/4 R), respectively, with regard to present values vs. values obtained in response to discharging a predetermined amount of power.

Figure 71:
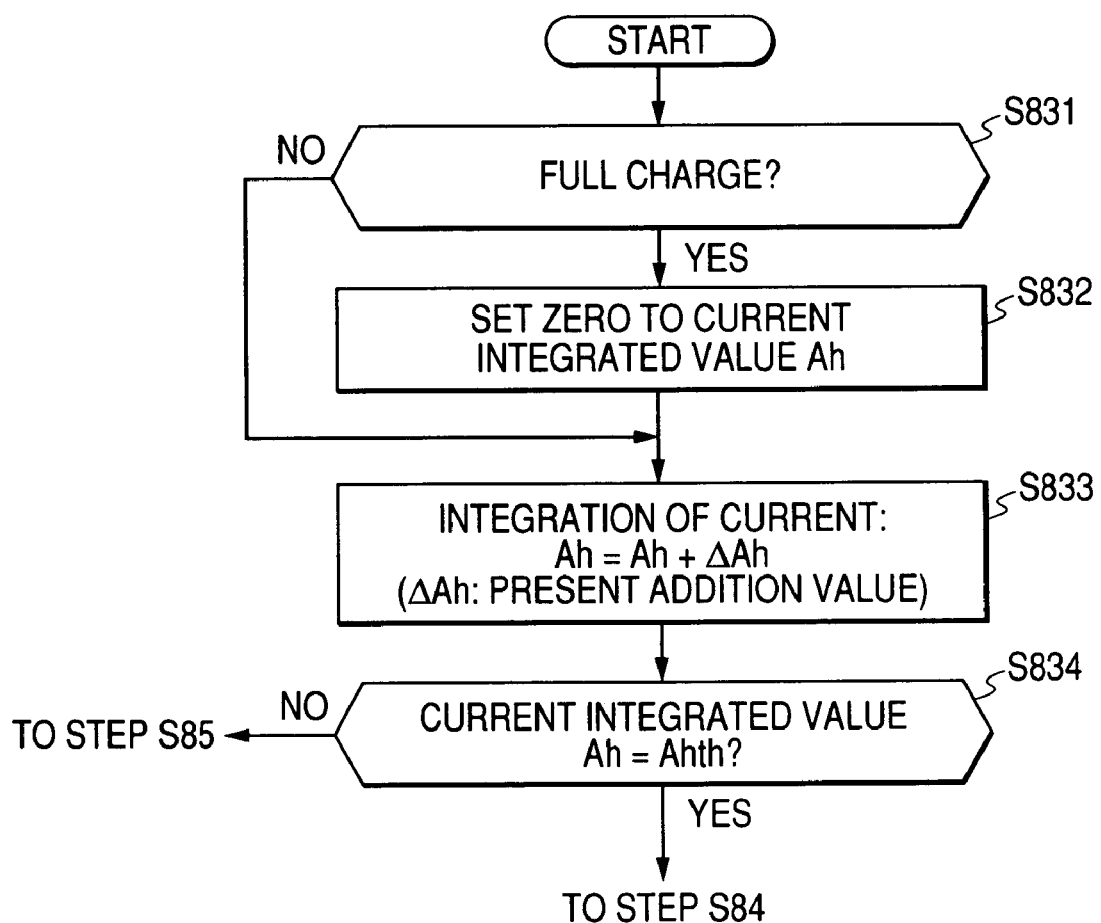
FIG. 71 is a flowchart outlining a subroutine for determining a state in which a predetermined amount of power is discharged from the battery which has been fully charged.

The determination of whether or not the predetermined amount of power has been discharged from the battery 1 which has been fully charged is based on the processing shown in FIG. 71, which is executed by the buffer 75. At first, it is determined whether or not the battery 1 is fully charged (step S831), and a current integrated value Ah is set to zero when it is concluded that the battery 1 is now in its full charge (step S832). Then the processing for integrating charge/discharge currents to be detected after the full charge is carried out by calculating Ah=Ah+ΔAh, wherein ΔAh is a present current value to be integrated in response to this time of processing (step S833). It is then determined whether or not the current integrated value (i.e., discharged value) Ah has reached a predetermined threshold Ahth (step S834). When it is determined that this value Ah has reached the threshold Ahth, the buffer 58 recognizes the discharge of the predetermined amount of power from the fully charged state.

It is preferred that the predetermined amount of power used for the above determination is set to a value corresponding to a discharge of 5% of the initial full charge capacity, from the fully charged state to be realized at present. However, this is not a definitive list. The inventors' various experiments show that any discharge of small amounts of power may be used as the reference to the threshold Ahth.

How to determine the fully charged state of the battery 1 and how to calculate the open-circuit voltage Vo and internal resistance R are the same or similar as or to those described.

FIG. 72 shows the functional configuration of the neural network calculator 77, which receives the input parameters consisting of data of the ratios of Vat/Vaf, Vot/Vof, Rt/Rf, and Pt/Pf and provides as an output parameter an SOC or SOH indicating a charged state quantity of the battery 1. The input parameters are not limited to those four ratios, but may be parameters including the ratio of Vat/Vaf and at least one of the ratios of Vot/Vof, Rt/Rf, and Pt/Pf.

The operations of the neural network calculator 77 are identical to those described (FIG. 6).

In this way, in addition to the ratio of average voltage Va having a correlation of the SOC or SOH, the circuit-open voltage Vo, internal resistance R, and maximum discharge power P, which have higher correlations with battery degradations, can also be reflected, as the ratios, in the input parameters to be fed to the neural network calculation. Therefore, the neural network calculation is able to take battery degradation degrees into consideration, estimating the output parameter with precision.

The ratio taken into the input parameters can be limited to one or two among the circuit-open voltage Vo, internal resistance R, and maximum discharge power P. The remaining quantities other than the quantities which are taken in the form of ratios can be taken in the form of present values. The present values may be multiplied by a constant or may be subjected to addition or subtraction with a constant.

(Test Results)

Batteries A to E for learning, which are shown in FIG. 73, were operated on a predetermined charge and discharge pattern (on the 10.15 running mode), so that a neural network calculator learned the relationships between input parameters and an output parameter (SOC) of these batteries A to E. The input parameters were the average voltage Va, open-circuit voltage Vo, internal resistance R, and maximum discharge power P(=Vo·Vo/4 R).

Figure 75:
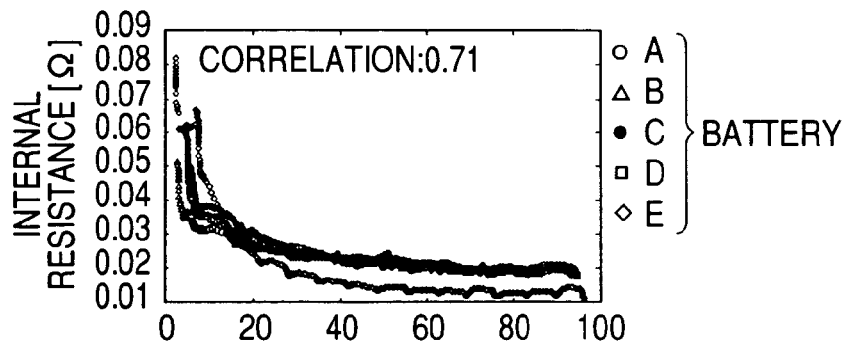
FIG. 75 is a graph showing a correlation between an internal resistance and an SOC of each battery.
Figure 76:
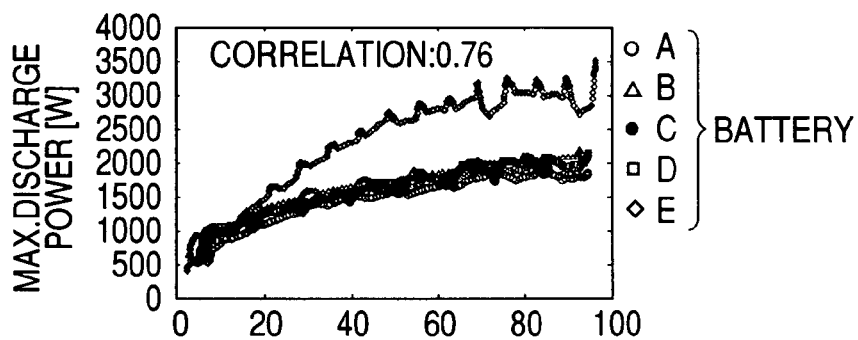
FIG. 76 is a graph showing a correlation between a maximum discharge power and an SOC of each battery.

FIGS. 74, 75 and 76 show, as to the respective batteries A to E, the relationships between the open-circuit voltages Vo and the SOCs, the relationships between the internal resistances R and the SOCs, and the relationships between the maximum discharge powers P and the SOCs, respectively.

Figure 77:
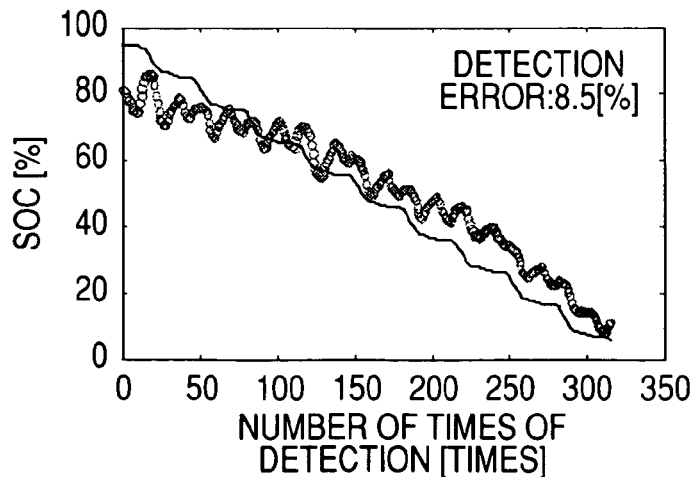
FIG. 77-79 are graphs showing results of comparative tests made based on a configuration corresponding to the conventional, respectively.
Figure 78:
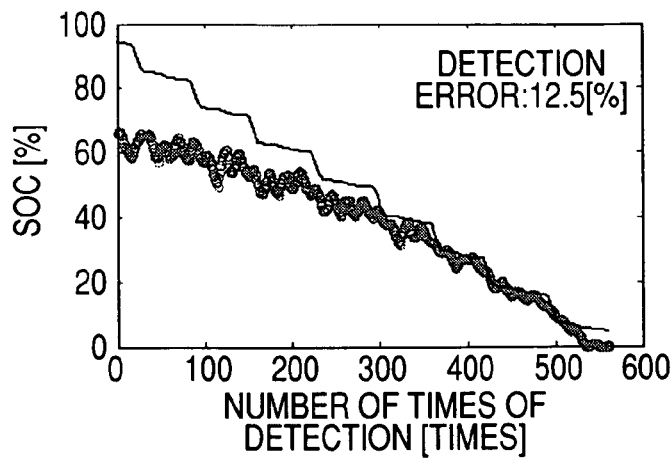
Figure 79:
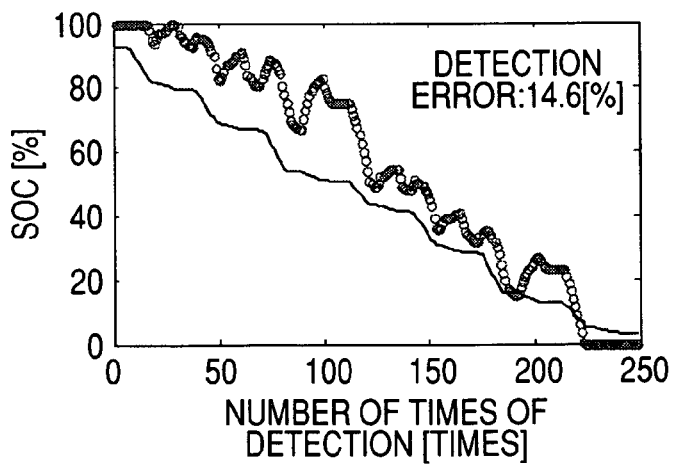

Further three batteries to be tested were operated under the predetermined charge and discharge patterns on the 10.15 running mode. An average voltage Va, open-circuit voltage Vo, internal resistance R, maximum discharge power P were obtained for each battery to be tested, and the obtained physical quantities were employed as input parameters to the neural network calculator which had learned so that the calculator calculated an SOC. The calculated results of the SOC from the first to third batteries are shown in FIGS. 77 to 79, which show mean square errors of 8.5%, 12.5% and 14.6% for the SOC, respectively.

Like the above, the foregoing batteries A to E were operated under the predetermined charge and discharge pattern on the 10.15 running mode so that the neural network calculator learned the relationships between the input parameters and the output parameter (SOC) of the respective batteries A to E. In the present tests, the input parameters were four ratios to be described later.

Figure 80:
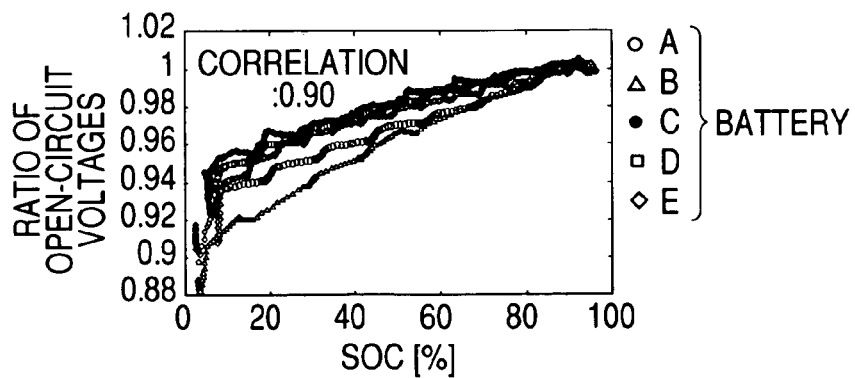
FIG. 80 is a graph showing a correlation between an open-circuit voltage ratio and an SOC of each battery.
Figure 81:
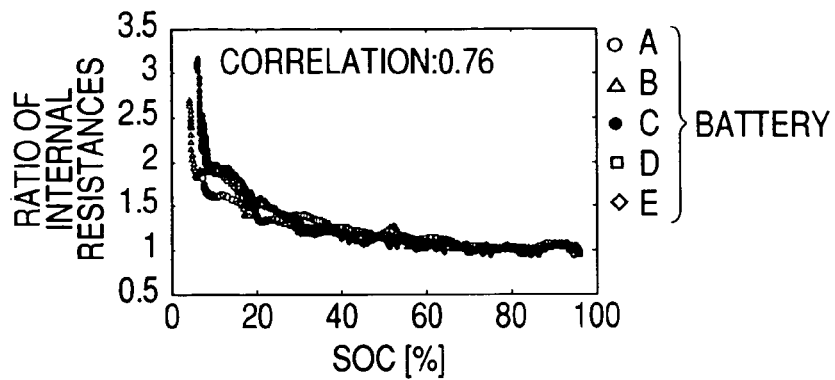
FIG. 81 is a graph showing a correlation between an internal resistance ratio and an SOC of each battery.
Figure 82:
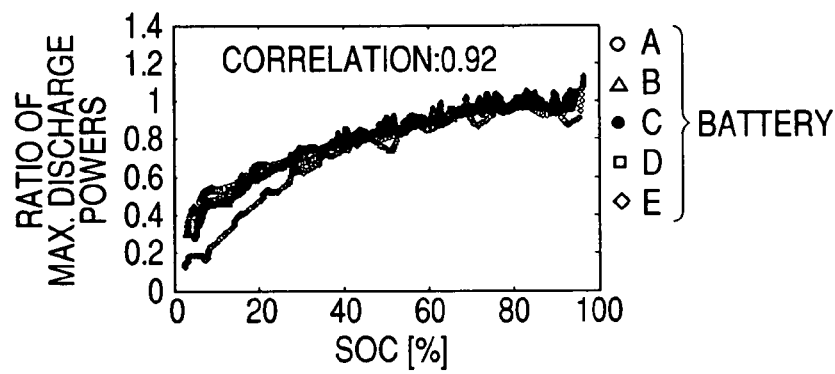
FIG. 82 is a graph showing a correlation between a maximum discharge power ratio and an SOC of each battery.

Practically, every time it was found that each battery discharged a predetermined amount of power from the full charge power (in the present case, 5% of the initial full charge power was discharged, i.e., a power of 1.4 Ah was discharged from the full charge power), the values of the average voltage Va, open-circuit voltage Vo, internal resistance R, and maximum charge power P were rewritten into Vaf, Vof, Rf and Pf for memorization thereof. And present values (values obtained this time) Vat, Vot, Rt and Pt of the average voltage Va, open-circuit voltage Vo, internal resistance R, and maximum charge power P were used to compute four ratios of Vat/Vaf, Vot/Vof, Rt/Rf and Pt/Pf, which were input parameters to the neural network calculator. This calculator calculated an SOC on the neural network calculation on the input parameters. FIG. 80 shows the correlation between the ratio of Vot/Vof and the SOC, FIG. 81 shows the correlation between the ratio of Rt/Rf and the SOC, FIG. 82 shows the correlation between the ratio of Pt/Pf and the SOC. It was found from these figures that each ratio has a good correction to the SOC, in particular, the ratios of Vot/Vof and Rt/Rf have a higher correlation to the SOC.

As a variation, the foregoing ratios or respective values can be multiplied by a specified constant. Moreover, a specified constant may be added to the respective ratios or subtracted from each of the respective ratios.

Figure 83:
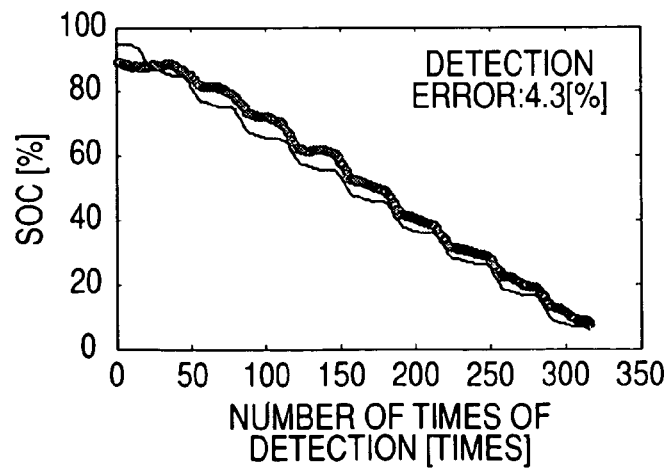
FIG. 83-85 are graphs showing results of tests made based on the configuration according to the eighth embodiment, respectively.
Figure 84:
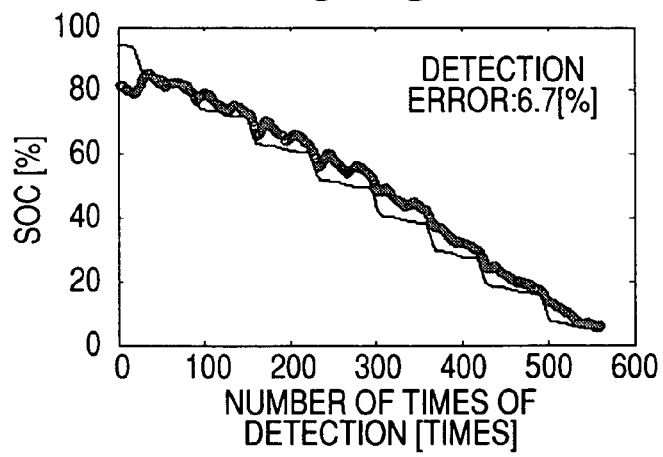
Figure 85:
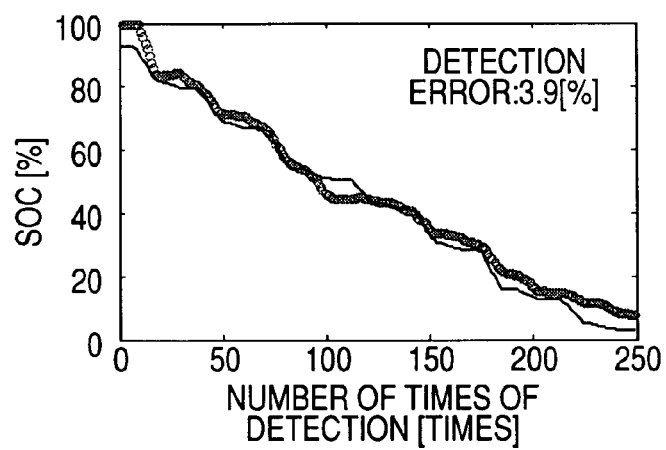

Further three batteries to be tested were subjected to learning under the predetermined charge and discharge pattern on the 10.15 running mode to obtain the foregoing four ratios serving as input parameters, which were then given to the neural network calculator which had been leaned already. This calculator was made to operate to calculate the SOC. FIGS. 83 to 85 provide the test results, in which FIG. 83 shows a calculation result of the SOC of the first tested battery, FIG. 84 shows that of the second tested battery, and FIG. 85 shows that of the third tested battery. Mean square errors to the calculation of the SOCs of the first to third tested batteries were 4.3%, 6.7% and 3.9%, respectively.

As shown clearly from comparing FIGS. 83 to 85 with FIGS. 77 to 79, only using the ratios of Vat/Vaf, Vot/Vof, Rt/Rf and Pt/Pf as the input parameters for the neural network calculation makes it possible that the SOC of each battery is estimated (i.e., detected) with high precision. That is, it is unnecessary to use a large number of input parameters (i.e., input data), such as data of voltage and current history, that will cause the neural network calculation to be complex. Thus, values of the average voltage Va, open-circuit voltage Vo, internal resistance R and maximum discharge power P which are acquired in response to a discharge of a predetermined amount of power from the fully charged power can be used as reference values to the present values thereof. The ratios of the present values to the reference values are therefore found to be proper for the input parameters, which will not only eliminate the need for using the voltage and current history data that increase the number of data but also allow the SOC to be calculated accurately.

(Modifications)

The foregoing input parameters may be modified as follows. In the above embodiment, the average voltage Va is adopted in the form of the ratio to the discharge of the predetermined amount of power, but this average voltage Va may be used as it is, that is, without being the ratio, because an increase in the error was not so large in the case of not using the ratio of the average voltage Va.

Further, to the input parameters adopted in the foregoing embodiment, either a present value of the average current Ia or a ratio of Ia/If may be added, wherein If is a value of the average current acquired in response to a discharge of a predetermined amount of power from the full charge power. In this parameter configuration, a further decrease in the error was gained.

If an amount of the calculation load is allowed, the input parameters may include data of voltage and current history, which is also effective for attaining a larger decrease in the detection (i.e., estimation) error.

Referring to FIGS. 86 to 93, another modification will now be described.

In this modification, the open-circuit voltage Vo is corrected on the expression of:

$$Vot' = Vot + \alpha Vof1 + \beta \Delta Vox \qquad (10)$$

$$Vox = Vof1 - Vof2 \qquad (11),$$

wherein Vot is a correcting open-circuit voltage to be inputted as an input parameter to the neural network calculator 77, Vot is a present value of the open-circuit voltage Vo, α and β are coefficients smaller than 1, Vof1 is a value of the open-circuit voltage Vo acquired in response to a discharge of 1 Ah (corresponding to 5% of the initial (rated) full charge capacity) from the last-time full charge power, and Vof2 is a value of the open-circuit voltage Vo acquired in response to a discharge of 5 Ah (corresponding to 25% of the initial (rated) full charge capacity) from the last-time full charge power.

The expression (11) can therefore be developed into an expression of $$\begin{aligned} Vot' &= Vot + \alpha Vof1 + \beta (Vof1 - Vof2) \\ &= Vot + (\alpha + \beta) Vof1 - \beta Vof2. \end{aligned} \qquad (12)$$

Figure 86:
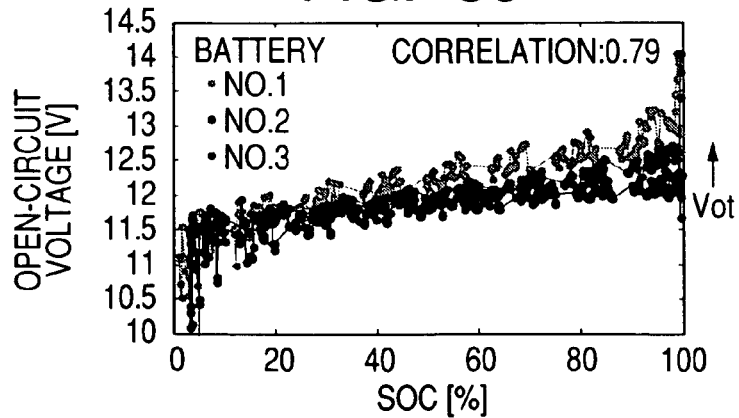
FIG. 86 is a graph showing correlations between present values of open-circuit voltages and SOCs of batteries, the graph being made according to a modification of the eighth embodiment.
Figure 87:
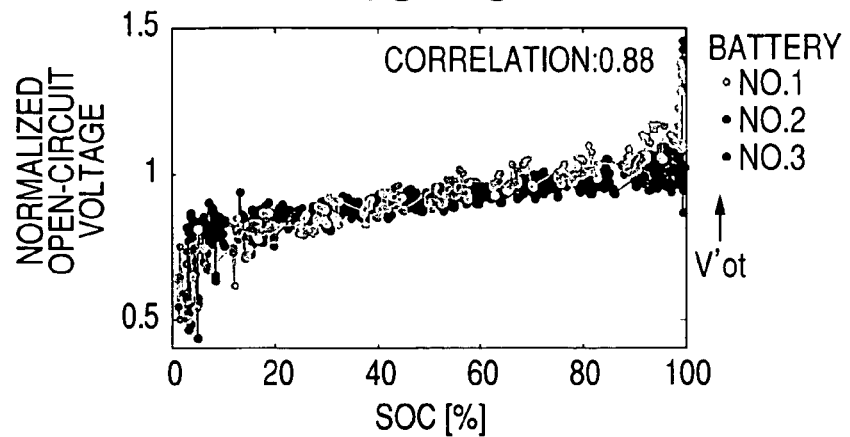
FIG. 87 is a graph showing correlations of corrected open-circuit voltages and SOCs of the batteries, the graph being made according to the modification of the eighth embodiment.

That is, in this modification, the open-circuit voltage Vot' to be applied to the neural network calculator 77 consists a linear function whose variables are a present value of the open-circuit voltage Vo and values Vof1 and Vof2 of the open-circuit voltage Vo acquired in response to discharging predetermined amounts of power from the full charge power. In short, the open-circuit voltage Vo is corrected with the use of the linear function, with the result that the correlation between the open-circuit voltage Vo and the SOC can be improved. As examples, FIG. 86 shows the correlations between present values Vot of the open-circuit voltages Vo of three batteries to be tested and the SOCs thereof and FIG. 87 shows the correlations of values of the corrected open-circuit voltages Vot' of those three batteries and the SOC thereof. From the comparison between these figures, irrelevantly of fluctuations in the degraded states and initial characteristics of batteries to be tested, fluctuations in both the corrected open-circuit voltages Vot' and the SOC can be suppressed largely.

Batteries A to E for learning, which are shown in FIG. 73, were operated on a predetermined charge and discharge pattern (on the 10.15 running mode), so that a neural network calculator learned the relationships between input parameters and an output parameter (SOC) of these batteries A to E. The input parameters were data of voltage and current history and an open-circuit voltage Vo. The voltage and current data consist of pairs of voltage and current data sampled at intervals during the latest predetermined period of time.

Figure 88:
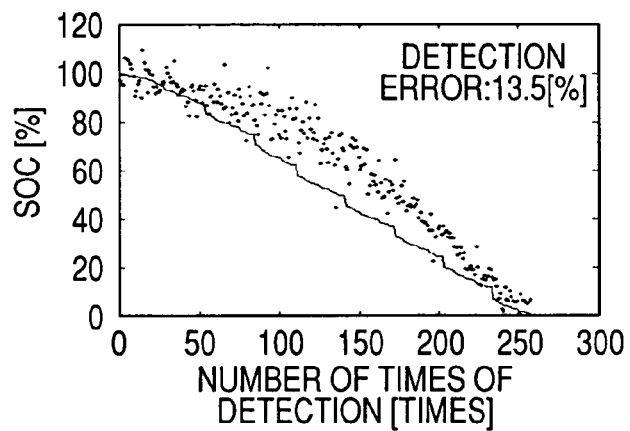
FIG. 88-90 are graphs showing results of comparative tests made based on a configuration corresponding to the conventional, respectively.
Figure 89:
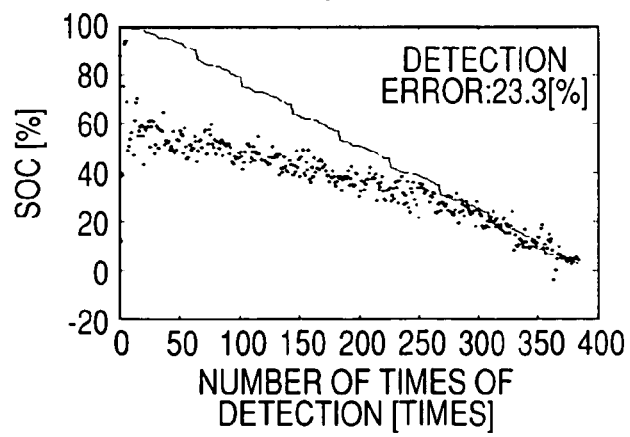
Figure 90:
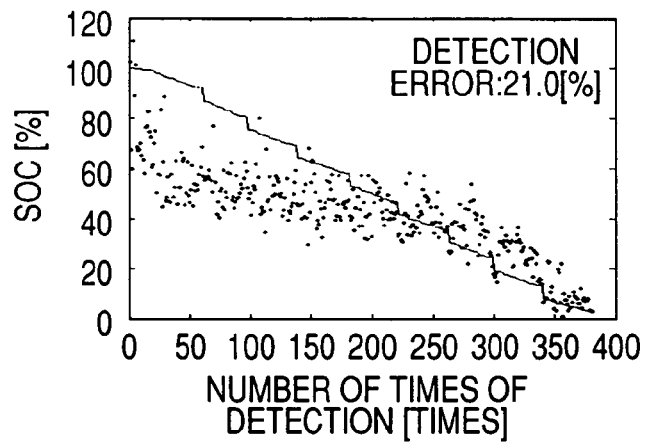

Then, further three batteries to be tested, whose open-circuit voltages are mutually different from each other, were subjected to the operation under the predetermined charge and discharge pattern on the 10.15 running mode and input parameters composed of data of voltage and current history and an open-circuit voltage. Those input parameters were given to the neural network calculator which has completed the learning already and the calculator was operated to estimate an SOC. The results are shown in FIGS. 88 to 90, which provide the results of calculation of the SOC of the first, second and third tested batteries, respectively. Mean square errors were 13.5%, 23.3% and 21.0%, respectively, as represented in those figures.

In the same manner as above, the foregoing batteries A to E were tested under the same charge and discharge pattern on the 10.15 running mode so that the neural network calculator learned the relationships between input parameters and an output parameter (SOC) of those batteries A to E. The input parameters were data of the voltage and current history and the corrected open-circuit voltage Vot'.

Figure 91:
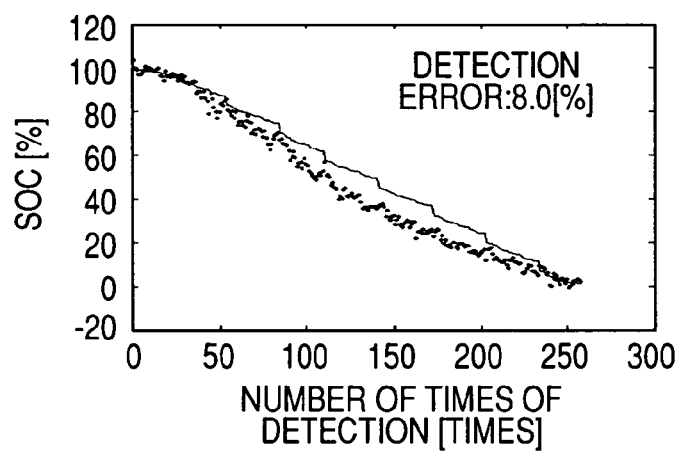
FIG. 91-93 are graphs showing results of tests made based on the configuration provided by the modification of the eight embodiment, respectively.
Figure 92:
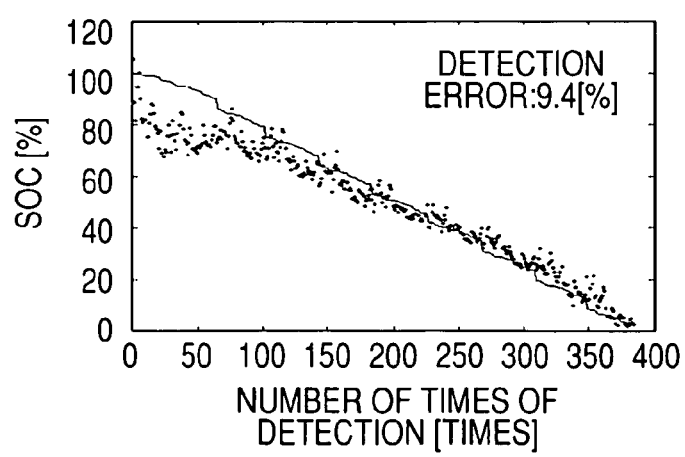
Figure 93:
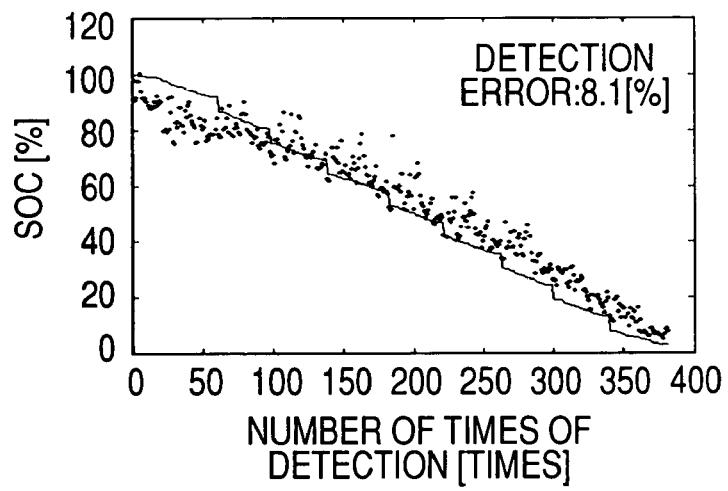
Figure 94:
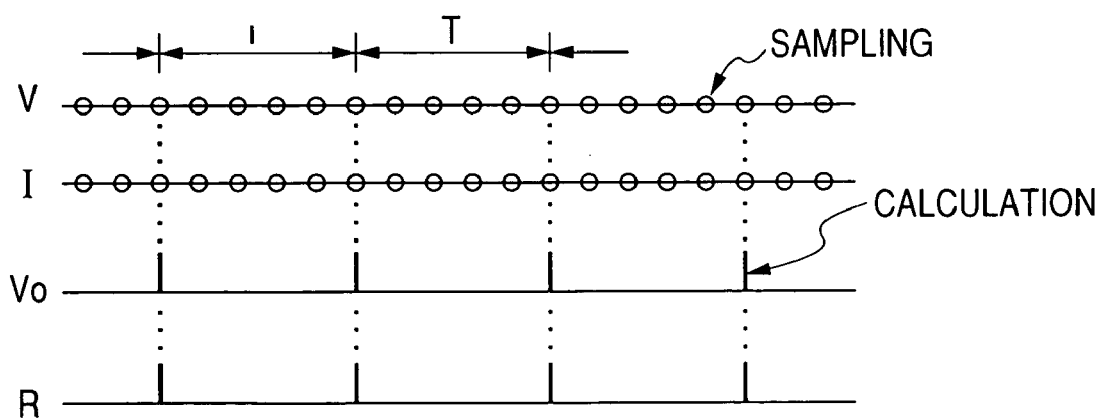
FIG. 94 is a timing chart explaining acquisition of signals of voltage and current and calculation of data of both an open-circuit voltage and an internal resistance of a battery.

Practically, the corrected open-circuit voltage Vot' was obtained such that the open-circuit voltage Vo in response to respectively discharging amounts of 1 Ah and 5 Ah from a full charge power gave Vof1 and Vof2, which were memorized as new values. These values Vof1 and Vof2 were used, together with a present value Vot of the open-circuit voltage Vo, to calculate the linear corrected open-circuit voltage Vot'. The data of the resultant voltage Vot' and the voltage and current history were fed to the neural network calculator to estimate the SOC. The results are shown in FIGS. 91 to 93, which respectively provide the results of calculation of the SOC of the first to third batters which were tested. As shown in those figures, mean square errors in estimating the SOC were 8.0%, 9.4% and 8.1%, respectively.

Comparing FIGS. 91 to 93 with FIGS. 88 to 90 clearly reveals that correcting the open-circuit voltage Vo with the linear correcting function permits neural network estimation of the SOC to be improved in its precision to a large extent.

Further modifications are also possible as follows. The correction based on the linear correcting function will not be limited to the open-circuit voltage Vo described above, but this manner may be adopted for the internal resistance R and/or maximum discharge power P. The corrected values R and/or P can be used as input parameters as well.

Moreover, instead of using the data of voltage and/or current history, an average voltage and/or an average current may be employed as part of the input parameters.

Another modification is concerned with the number of open-circuit voltages used for determining the linear correcting function. That is, the number of voltages is not always limited to two, but a signal open-circuit voltage may be adopted or three or more ones may be adopted.

Another modification is to use of parameters coming from both the correction based on the ratios described in the embodiment and the correction based on the linear correction functions described in the modification in a combined manner, as to the open-circuit voltage Vo, internal resistance R and maximum discharge power P, all of which are quantities closely related to a degraded state of each battery.

In addition, the open-circuit voltage Vo, internal resistance R and maximum discharge power P may be modified such that those values are first subjected to the linear function correction described in the modification and the corrected values are then processed to produce, as a whole or in part, input parameters based on the ratios described in the embodiment.

In the foregoing embodiments, as another modification, a voltage V and/or an open-circuit voltage Vo, which are part of the input parameters, may be linearly converted to a function. For example, the voltage V may be converted to K1×V+k2, wherein K1 and K2 are constants. An output error to be caused by a difference between an input parameter V and an input parameter K1×V+k2 can be converged to be almost zero readily through the neural network calculation.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A neural network type of apparatus for detecting an internal state of a secondary battery implemented in a battery system, the apparatus comprising:
   detecting means for detecting, in real time, electric signals indicating an operating state of the battery during a predetermined period of time, the electric signals being voltage and current of the battery;
   producing means for producing, using the electric signals, an input parameter required for estimating the internal state of the battery, the input parameter reflecting calibration of a present charged state of the battery and consisting of a first input parameter indicating the operating state of the battery and a second input parameter indicating a degraded state of the battery,
   wherein the producing means includes:
      means for calculating the first input parameter on the basis of data of the voltage and current of the battery, and
      means for calculating the second input parameter in response to a state of predetermined charge of the battery; and
   calculating means for calculating an output parameter indicating the charged state of the battery by processing both the first and second input parameters based on a neural network calculation technique,
   wherein
   the second input parameter calculating means includes
   means for calculating data of history of both the voltage and the current into an approximate expression on a least-squares methods,
   means for calculating a present value of an open-circuit voltage of the battery on the approximate expression, the present value being included in the first input parameters, and the output parameter calculating means is configured to calculate the output parameter by using both the first parameter consisting of the data of the voltage history, the data of the current history, and the present value of the open-circuit voltage and the second input parameter;
the second input parameter indicating the degraded state of the battery is both an open-circuit voltage and an internal resistance of the battery detected in response to a state of predetermined charge of the battery,
the output parameter indicating the present charged state is one of and SOC (state of charge) of the battery, an SOH (state of health) of the battery, and a function whose variables including information indicative of the SOC and SOH, and
the function is a degree of degradation of the battery which is defined by an expression of:
the degree of desegregation=SOH/(initial full charge capacity×SOC).

2. A neural network type of apparatus for detecting an internal state of a secondary battery implemented in a battery system, the apparatus comprising:
   detecting means for detecting, in real time, electric signals indicating an operating state of the battery during a predetermined period of time, the electric signals being voltage and current of the battery;
   producing means for producing, using the electric signals, an input parameter required for estimating the internal state of the battery, the input parameter reflecting calibration of a present charged state of the battery and consisting of a first input parameter indicating the operating state of the battery and a second input parameter indicating a degraded state of the battery,
   wherein the producing means includes:
      means for calculating, as the first input parameter, voltage history data and current history data based on data of the received voltage and current of the battery, and
      means for calculating, as the second input parameter, an open-circuit voltage of the battery and an internal resistance of the battery using both the voltage history data and the current history data in response to a state of predetermined charge of the battery, by using a least-squares method so as to create an approximate linear expression from both the voltage history data and the current history data,
   first calculating means for calculating an output parameter indicating, as the charged state, a full charge capacity of the battery by processing both the first and second input parameters based on a neural network calculation technique, the full charge capacity being expected at present; and
   second calculating means for calculating, as the degraded state of the battery, a degree of degradation of the battery based on an expression of:

$$DD=Q_{present}/Q_{initial}$$

wherein DD denotes the degree of degradation of the battery, $Q_{present}$ denotes a present value of the full charge capacity estimated by the output parameter calculating means, and $Q_{initial}$ denotes an initial value of the full charge capacity given when the battery is manufactured.

3. A neural network type of apparatus for detecting an internal state of a secondary battery implemented in a battery system, the apparatus comprising:
   detecting means for detecting electric signals indicating an operating state of the battery;

producing means for producing, using the electric signals, an input parameter required for estimating the internal state of the battery the input parameter reflecting calibration of a present charged state of the battery; and estimating means for estimating an output parameter indicating the charged state of the battery by applying the input parameter to neural network calculation, wherein the producing means is configured to produce the input parameter which is calibrated depending on a charge and discharge characteristic of the battery which is attributable to at least one of the degraded state of the battery and the difference in types of the battery, and the input parameter includes either a voltage V of the battery or a ratio V/Vf, wherein Vf is a voltage of the battery detected when the battery is in a fully charged state, either an open-circuit voltage Vo of the battery or a ratio of Vo/Vof wherein Vof is an open-circuit voltage detected when the battery is in a fully charged state, either an internal resistance R of the battery or a ratio of R/Rf wherein Rf is an internal resistance detected when the battery is in a fully charged state, a predetermined function $f(Vo, R)$ using, as input variables, the open-circuit voltage Vo and the internal resistance R and expressing a correlation to an amount of current of the battery which is dischargeable at present, and a current I of the battery.

4. The apparatus of claim 3, wherein the function $f(Vo, R)$ is a function of which input variable is based at least on a ratio of Vo/R.

5. The apparatus of claim 4, wherein the function $f(Vo, R)$ is a function of which input variable is based on a ratio of Vo·Vo/R.

6. The apparatus of claim 4, wherein the function $f(Vo, R)$ is a function of which input variable is based on a ratio of $(Vm-Vo)/R$ wherein Vm is a predetermined voltage of the battery.

7. The apparatus of claim 4, wherein the predetermined voltage Vm is a discharge stop voltage of the battery.

8. The apparatus of claim 3, wherein the function $f(Vo, R)$ is a function defined by $f(Vop, Rp)/f(Vof, Rf)$ wherein $f(Vop, Rp)$ denotes a present value of the function $f(Vo, R)$ and $f(Vof, Rf)$ denotes a value of the function $f(Vop, Rp)$ obtained when the battery is in a fully charged state.

9. The apparatus of claim 8, wherein the function $f(Vo, R)$ is a function defined by $(Vo·Vo/R)/(Vof·Vof/Rf)$ wherein Vof and Rf denote an open-circuit voltage and an internal resistance of the battery detected when the battery is in a fully charged state, respectively.

* * * * *